(12) United States Patent
Matsunami et al.

(10) Patent No.: US 8,425,801 B2
(45) Date of Patent: Apr. 23, 2013

(54) COMPOSITE ORGANIC ELECTROLUMINESCENT MATERIAL AND PRODUCTION METHOD THEREOF

(75) Inventors: Hidehiro Matsunami, Sodegaura (JP); Yasunori Kadoi, Sodegaura (JP); Chishio Hosokawa, Sodegaura (JP); Yoshikazu Tanaka, Sodegaura (JP); Toshihiro Iwakuma, Sodegaura (JP); Atau Ioku, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 535 days.

(21) Appl. No.: 12/422,508

(22) Filed: Apr. 13, 2009

(65) Prior Publication Data

US 2010/0258767 A1 Oct. 14, 2010

(30) Foreign Application Priority Data

Apr. 10, 2009 (JP) .................. 2009-096455

(51) Int. Cl.
*H05B 33/14* (2006.01)
*C09K 11/06* (2006.01)

(52) U.S. Cl.
USPC ............ 252/301.16; 252/301.35; 252/301.34; 428/690; 428/917; 428/403; 428/404

(58) Field of Classification Search ............. 252/301.16, 252/301.35, 301.34; 428/690, 917
See application file for complete search history.

(56) References Cited

U.S. PATENT DOCUMENTS

| | | | |
|---|---|---|---|
| 6,998,492 B2 * | 2/2006 | Seo et al. ............. | 548/402 |
| 7,041,390 B2 * | 5/2006 | Seo et al. ............. | 428/690 |
| 2006/0099344 A1 | 5/2006 | Boroson et al. | |
| 2006/0177576 A1 | 8/2006 | Long et al. | |
| 2007/0069638 A1 * | 3/2007 | Matsuura et al. ............. | 313/504 |
| 2007/0138437 A1 * | 6/2007 | Haga et al. ............. | 252/301.16 |
| 2007/0159083 A1 * | 7/2007 | Matsuura et al. ............. | 313/506 |
| 2007/0248753 A1 | 10/2007 | Tyan et al. | |
| 2010/0207110 A1 * | 8/2010 | Nishimura et al. ............. | 257/40 |

FOREIGN PATENT DOCUMENTS

| | | |
|---|---|---|
| EP | 2 166 588 A1 | 3/2010 |
| EP | 2 166 592 A1 | 3/2010 |
| JP | 2008-519904 | 6/2008 |
| JP | 2008-530733 | 8/2008 |
| WO | WO 2006/053017 A1 | 5/2006 |
| WO | WO 2006/083734 A2 | 8/2006 |
| WO | WO 2009/008344 * | 1/2009 |
| WO | WO 2009/008357 * | 1/2009 |

* cited by examiner

*Primary Examiner* — Carol M Koslow
(74) *Attorney, Agent, or Firm* — Oblon, Spivak, McClelland, Maier & Neustadt, L.L.P.

(57) ABSTRACT

A composite organic EL material suited to flash deposition and a method for producing the same are provided. A composite organic electroluminescence material in which an organic material and an organic metal complex are combined with each other, wherein the melting point of the organic material is lower by 30° C. or more than the decomposition temperature of the organic metal complex.

9 Claims, 7 Drawing Sheets

COMPOSITE ORGANIC ELECTROLUMINESCENT MATERIAL AND PRODUCTION METHOD THEREOF

TECHNICAL FIELD

The invention relates to a composite organic electroluminescence (EL) material (hereinafter often abbreviated as the "composite material") and a method for producing the same. More particularly, the invention relates to a composite organic EL material suitable for flash deposition and a method for producing the same.

BACKGROUND ART

Patent Document 1 states that physical deposition under a vacuum environment is generally used as a method for forming a thin film of an organic material used in an organic electroluminescence device. Organic materials often decompose when kept for a long time at a vaporization temperature which is desirable for deposition or at a temperature closed to such a vaporization temperature. In particular, it has been pointed out that, when a temperature-sensitive organic material is heated to a higher temperature, the particle structure thereof may change, and with such a change in particle structure, the nature of the material may also change.

In the common vacuum deposition method, an organic material is put in a deposition source called a crucible, the organic material is evaporated by heating to a high temperature in a vacuum environment, whereby a thin film of an organic material is formed on a substrate. Since all of the material in a crucible is constantly heated to a high temperature, degradation of the material is accelerated. In addition, since the material is evaporated under a vacuum environment, it is difficult to control the evaporation direction of the material. Accordingly, more efficient use of a material contributing to film formation has become an object to be attained. Under such circumstances, the flash deposition method has attracted attention as the deposition means.

Patent Document 2 discloses a method in which an organic thin film of an organic thin-film electroluminescence device is obtained by the flash deposition method.

The flash deposition method is a method in which materials are supplied to a heated deposition source to allow them to evaporate quickly, whereby a deposited thin film (organic thin film) of an organic compound is formed on the surface of a substrate.

In flash deposition, a material for an organic thin film which is kept in a material-accommodating container is dropped through a screw part to a heat-deposition part which has been heated to 300 to 600° C., thereby to allow the material to be evaporated all at once. By outputting the evaporated material, through a heating conduit, towards a substrate which has been installed in advance, a film of an organic material is formed on the substrate. Heating in flash deposition is free from the problem that a material is constantly heated, since heating is performed while dropping a material to a deposition source. In addition, since the moving direction in which a heat-evaporated material can be controlled, a larger part of the material can be formed into a film. For these reasons, flash deposition has come to attract attention.

Generally, an organic EL device is a device in which an emitting layer containing a light-emitting organic compound (hereinafter referred to as "luminescent material") is held between a pair of electrodes. Electrons are injected from one of the electrodes, and holes are injected from the other electrode, and the injected electrons and holes are recombined in the emitting layer to emit light. A common organic EL device has a configuration in which an anode, a hole-transporting layer, an emitting layer, an electron-transporting layer and a cathode are stacked in this order. An emitting layer, a hole-transporting layer and an electron-transporting layer are respectively formed by forming an organic material into a film with a thickness of several nanometers to several tens nanometers. As an emitting layer, a material obtained by mixing a small amount of a dopant material (fluorescent material, phosphorescent material) with a host material forming an exciton is normally used.

Patent Document 1 discloses a deposition apparatus and a deposition method which shortens the time for which a deposition material is exposed to a high temperature. In this apparatus, a manifold provided with an opening is installed. A vaporized organic material is introduced into the manifold, and then a deposition material is supplied to a substrate through the opening thereof, followed by deposition.

Patent Documents 2 and 3 each disclose a method for producing an organic thin film of an organic thin film electroluminescence device using the flash deposition method. Patent Document 2 discloses a method in which a mixed material obtained by sufficiently mixing by means of an agate mortor or the like is supplied to a heated deposition source, followed by quick evaporation, thereby forming an organic thin film on the surface of a substrate. In this method, however, uniformity of the mixed material may be deteriorated before dropping to the deposition source. In this case, the ratio of each material which is dropped from a feeder changes with time, and as result, it is impossible to ensure uniformity of the ratios of the materials contained in an organic thin film formed by deposition.

Patent Document 1: JP-T-2008-519904
Patent Document 2: US-A-2007/0248753
Patent Document 3: JP-A-2008-530733

In view of the above-mentioned problem, an object of the invention is to provide a composite organic EL material suited to flash deposition, as well as to provide a method for producing the same.

The invention provides the following composite organic EL material or the like.

1. A composite organic electroluminescence material in which an organic material and an organic metal complex are combined with each other, wherein the melting point of the organic material is lower by 30° C. or more than the decomposition temperature of the organic metal complex.
2. The composite organic electroluminescence material according to 1, wherein the decomposition temperature is the temperature at which the weight of the organic metal complex is decreased by 1% when the organic metal complex is heated from room temperature at a heating rate of 10° C. per minute.
3. The composite organic electroluminescence material according to 1 or 2, wherein the molecular weight of the organic material is 2000 or less.
4. The composite organic electroluminescence material according to any one of 1 to 3, wherein the organic material is not an organic metal complex.
5. The composite organic electroluminescence material according to any one of 1 to 3, wherein
   the organic material is a fused polycyclic aromatic compound of which the triplet energy value is in the range of 2.0 eV to 3.3 eV, and
   the organic metal complex is an organic metal complex having a metal element selected from Ir, Pt, Os, Cu, Ru and Re as a central metal.

6. The composite organic electroluminescence material according to 5, wherein the fused polycyclic aromatic compound is a fused polycyclic aromatic hydrocarbon compound.
7. The composite organic electroluminescence material according to 5, wherein the fused polycyclic aromatic compound is a compound containing a heterocyclic ring.
8. The composite organic electroluminescence material according to any one of 1 to 7, wherein
the organic material is a host material contained in an emitting layer of an organic electroluminescence device, and
the organic metal complex is a phosphorescent dopant material contained in an emitting layer of an organic electroluminescence device.
9. A method for producing a composite organic electroluminescence material comprising:
mixing an organic material and a powdery organic metal complex to form a mixed material,
the melting point of the organic material measured by heating at a rate of 10° C. per minute being lower by 30° C. or more than the temperature at which the weight of the organic metal complex is decreased by 1% when the organic metal complex is heated from room temperature at a rate of 10° C. per minute;
heating the mixed material to a temperature which is lower by 30° C. or more than the temperature at which the weight of the organic metal complex is decreased by 1% when the organic metal complex is heated from room temperature at a rate of 10° C. per minute; and
cooling the heated mixed material.
10. The method for producing a composite organic electroluminescence material according to 9, which further comprising pulverizing the mixed material after the cooling.
11. A deposition method, comprising using the composite organic electroluminescence material according to any one of 1 to 8.

According to the invention, a composite organic EL material suited to flash deposition as well as a method for producing the same can be provided.

In addition, according to the invention, decomposition of raw materials during production of a composite material can be suppressed

Figure 1A:
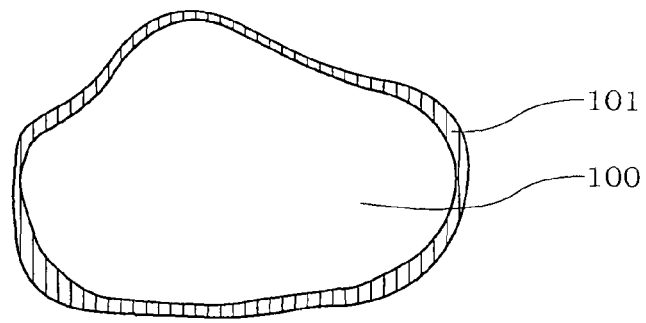
FIG. 1A is a view showing a particle in which a first material (organic material) and a second material (organic metal complex) are combined.

BEST MODE FOR CARRYING OUT THE INVENTION (1) Composite Organic EL Material

The composite organic EL material of the invention is a composite organic electroluminescence material in which an organic material and an organic metal complex are combined with each other, and is characterized in that the melting point of the organic material is lower than the decomposition temperature of the organic metal complex by 30° C. or more (preferably lower by 45° C. or more, particularly preferably lower by 60° C. or more). By this feature, in producing a composite material by combining an organic material and an organic metal complex, it is possible to minimize the decomposition of the material, whereby a high-performance material for an organic electroluminescence device suited to flash deposition can be obtained.

Here, the melting point means a melting point which is observed when heating an organic material from room temperature at a rate of 10° C. per minute.

Furthermore, the decomposition temperature means a temperature at which the weight of an organic metal complex is decreased by 1% (1% weight decrease temperature) when heating from room temperature at a rate of 10° C. per minute at normal pressure in an atmosphere of an inert gas.

The composite organic EL material of the invention has been found by noting the fact that the decomposition of an organic metal complex occurs in a fused liquid of an organic material even when the temperature of the organic metal complex is lower than the decomposition temperature thereof. A decomposed matter formed from an organic metal complex is an impurity of a composite organic EL material, and may cause the performance of an organic EL device formed by using the composite organic EL material to deteriorate.

According to conventional technical knowledge, it has been believed that a composite organic material which does not contain a decomposed matter can be formed if the temperature of a fused liquid of an organic material is lower than the decomposition temperature of an organic metal complex. However, the inventors have found that, even if the difference between the fused liquid temperature and the decomposition temperature is 10° C. or more, the decomposition of an organic metal complex may occur in the fused liquid of an organic material. That is, in order to obtain a high-performance composite organic EL material, a prescribed temperature difference is required between the above-mentioned melting point and the above-mentioned decomposition temperature.

It is preferred that the composite organic EL material of the invention be a particle or an assembly of particles which is obtained by combining a host material constituting an emitting layer of an organic EL device which is an organic material (hereinafter referred to as a first material) and a phosphorescent dopant material contained in the emitting layer which is an organic metal complex (hereinafter referred to as a second material) satisfying the above-mentioned relationship.

The composite organic EL material of the invention may contain the particles of the first material and/or the second material which are not combined.

The composite organic EL material of the invention may be composed only of the first material or the second material, or may contain other materials than the first material and the second material. For example, an organic emitting material, a hole-transporting material, a hole-injecting material, an electron-transporting material, an electron-injecting material or the like, which are used in an organic EL device, may be added.

In the composite organic EL material of the invention, the first material may be coated only with the second material alone, or may be coated with other materials in addition to the second material.

Figure 1B:
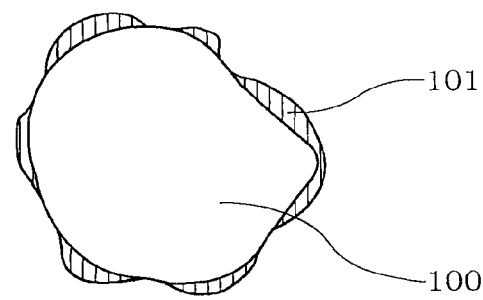
FIG. 1B is a view showing another particle in which a first material and a second material are combined.
Figure 1C:
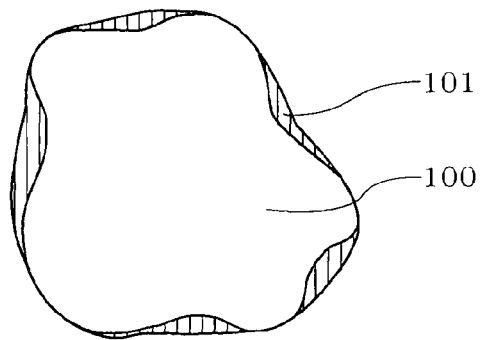
FIG. 1C is a view showing another particle in which a first material and a second material are combined.
Figure 1D:
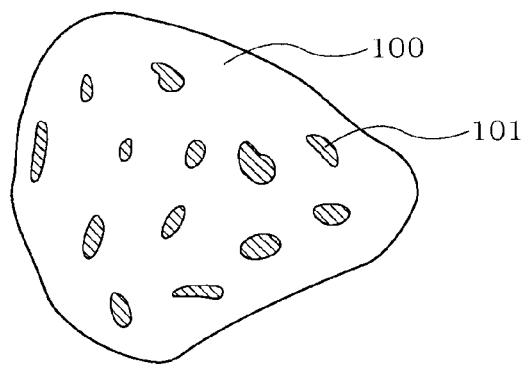
FIG. 1D is a view showing another particle in which a first material and a second material are combined.
Figure 1E:
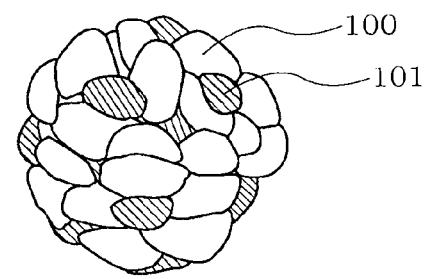
FIG. 1E is a view showing another particle in which a first material and a second material are combined.
Figure 1F:
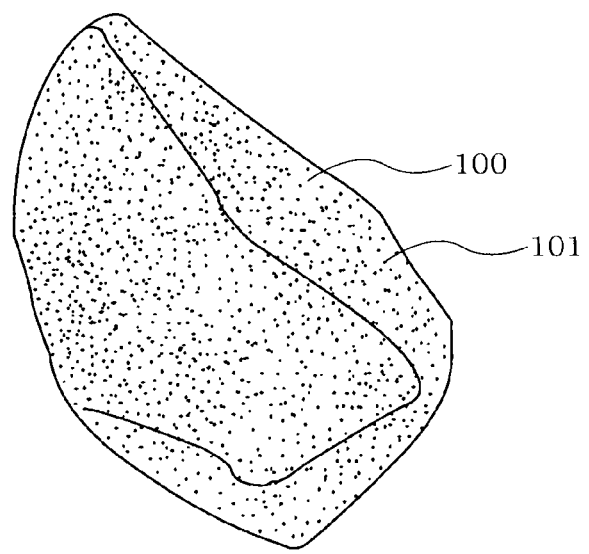
FIG. 1F is a view showing another particle in which a first material and a second material are combined.

As for the particle formed by combining two materials, for example, the entire surface of the first material 100 may be coated with the second material 101 as shown in the diagrammatical cross-sectional view in FIG. 1A, part of the surface of the first material 100 may be coated with the second material 101 as shown in the diagrammatical cross-sectional view shown in FIG. 1B, or the second material 101 may enter the concaves in the surface of the first material 100 so as to achieve coating as shown in the diagrammatical cross-sectional view in FIG. 1C. Alternatively, as shown in FIGS. 1D to 1F, the first material and the second material may be mixed entirely. FIG. 1D is a diagrammatical cross-sectional view showing a state in which a plurality of particles of the second material which remain the shape of the melted particle are contained in a single particle of the first material. FIG. 1E is a diagrammatical cross-sectional view showing a state in which a plurality of fine particles of the first material and the second material are combined with each other while keeping the shape of a particle without being perfectly melted. In FIG. 1F, the first material and the second material form particles in the dispersed state.

When the composite organic EL material is composed of three or more materials, in FIGS. 1A to 1C, the first material is coated with the second material and other materials, and in FIGS. 1D to 1F, three or more materials are mixed.

As the organic material constituting the composite material of the invention, it is preferable to use an organic material having a molecular weight of 2000 or less as a material suited to deposition. Although there are no specific restrictions on the lower limit of the molecular weight, in respect of advantageous production of a composite organic EL material, it is preferable to use an organic material having a melting point higher than normal temperature. Specifically, the molecular weight may be about 130 or more. It is preferred that the molecular weight be in the range of 200 to 2000, particularly preferably in the range of 500 to 1000.

As the organic material, a fused polycyclic aromatic compound or a heterocycle-containing compound of which the triplet energy value is 2.0 eV to 3.3 eV is preferable. Here, the triplet energy is a difference in energy between the lowest triplet excited state and the ground state.

Efficient emission can be obtained when the triplet energy value is in the range of 2.0 eV to 3.3 eV. The triplet energy value is preferably 2.0 eV to 3.0 eV, particularly preferably 2.0 eV to 2.6 eV.

The triplet energy means the excited triplet energy gap, and for example, can be determined as follows based an emission spectrum. Specifically, a material to be measured is dissolved in an EPA solvent (diethyl ether:isopentane:ethanol=5:5:2 (volume ratio)) with a sample concentration of 10 µmol/l to obtain a phosphorescence measurement sample. The sample is placed in a quartz cell, cooled to 77K, and irradiated with excitation light, and the wavelength of the resulting phosphorescence is measured. A tangent is drawn to the rise of the phosphorescence spectrum on the shorter wavelength side, and a value obtained by converting the wavelength into an energy value is taken as a triplet energy gap. The triplet energy gap is measured using an "F-4500" fluorescence spectrophotometer (manufactured by Hitachi, Ltd.), which is a commercially-available measuring apparatus.

As the fused polycyclic aromatic compound, a fused polycyclic aromatic hydrocarbon compound or a compound containing a heterocyclic ring is preferable.

The fused polycyclic aromatic hydrocarbon compound is preferably one or more compound selected from the group consisting of polycyclic fused aromatic compounds shown by the following formulas (A), (B) and (C):

$$Ra—Ar^{101}—Rb \qquad (A)$$

$$Ra—Ar^{101}—Ar^{102}—Rb \qquad (B)$$

$$Ra—Ar^{101}—Ar^{102}—Ar^{103}—Rb \qquad (C)$$

wherein $Ar^{101}$, $Ar^{102}$, $Ar^{103}$, Ra and Rb are a polycyclic aromatic skeleton part selected from a substituted or unsubstituted benzene ring, a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring, and a substituted or unsubstituted picene ring. However, the substituent for Ra and Rb is not an aryl group. There are no cases that all of $Ar^1$, $Ar^2$, $Ar^3$, Ra and Rb are a substituted or unsubstituted benzene ring.

In the above-mentioned polycyclic fused aromatic compound, it is preferred that either or both of Ra and Rb be selected from the group consisting of a substituted or unsubstituted phenanethrene ring, a substituted or unsubstituted benzo[c]phenanethrene ring and a substituted or unsubstituted fluoranthene ring.

The polycyclic fused aromatic skeleton part of the abovementioned polycyclic fused aromatic compound may have a substituent.

As for the substituent of the polycyclic fused aromatic skeleton part, for example, a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group or a carboxy group can be given.

If the polycyclic fused aromatic skeleton part has a plurality of substituents, they may form a ring.

Specific examples of a substituent for the polycyclic fused aromatic skeleton part are given below.

As for the halogen atom, fluorine, chlorine, bromine and iodine can be given.

The substituted or unsubstituted amino group is shown by $—NX^1X^2$. As examples of $X^1$ and $X^2$, $X^1$ and $X^2$ are independently hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-strylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 1-phenoxadinyl group, 2-phenoxadinyl group, 3-phenoxadinyl group, 4-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminomethyl, 2-aminomethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl and 1,2,3-trinitropropyl.

Examples of the substituted or unsubstituted alkenyl group include vinyl, aryl, 1-butenyl, 2-butenyl, 3-butenyl, 1,3-butanedienyl, 1-methylvinyl, stylyl, 4-diphenylaminostylyl, 4-di-p-tollylaminostyryl, 4-di-m-tollylaminostyryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl and 3-phenyl-1-butenyl.

Examples of the substituted or unsubstituted cycloalkyl include cyclopropyl, cyclobutyl, cyclopentyl, cyclohexyl and 4-methylcyclohexyl.

The substituted or unsubstituted alkoxy group is a group shown by —OY. Examples of Y include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl and 1,2,3-trinitropropyl.

Examples of the substituted or unsubstituted aryl group include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl and 4"-t-butyl-p-terphenyl-4-yl.

Examples of the substituted or unsubstituted heteroaryl include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthrolin-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl 3-indolyl, and 4-t-butyl-3-indolyl groups.

Examples of the substituted or unsubstituted aralkyl include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl.

The substituted or unsubstituted aryloxy group is shown by —OZ. Examples of Z include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 1-phenoxadinyl group, 2-phenoxadinyl group, 3-phenoxadinyl group, 4-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

The substituted or unsubstituted alkoxycarbonyl group is shown by —COOY. Examples of Y include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl. 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl.

In the invention, the fused polycyclic aromatic compound is preferably any one selected from the group consisting of compounds shown by the following formulas (1) to (4).

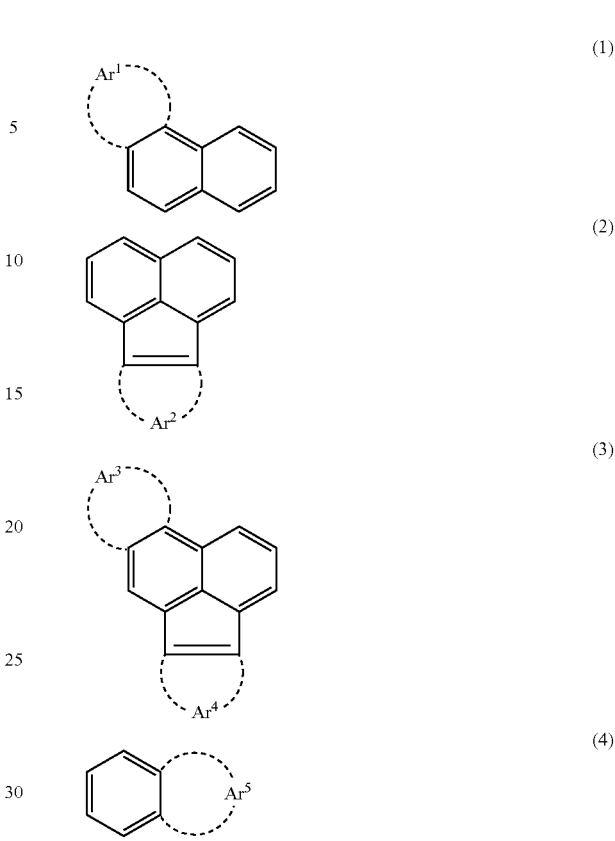

In the formulas (1) to (4), $Ar^1$ to $Ar^5$ each represent a monocyclic structure or a fused ring structure having 4 to 16 carbon atoms that form a ring (hereinafter referred to as ring carbon atoms).

As the compound shown by the formula (1), substituted or unsubstituted phenanthrene, chrysene or the like can be given, for example.

As the compound shown by the formula (2), substituted or unsubstituted acenaphthylene, acenaphthene, fluoranthene or the like can be given, for example.

As the compound shown by the formula (3), substituted or unsubstituted benzfluoranthene or the like can be given, for example.

As the compound shown by the formula (4), a simple body or a derivative of substituted or unsubstituted naphthalene or the like can be given, for example.

As the naphthalene derivative, a derivative shown by the following formula (4A) can be given, for example.

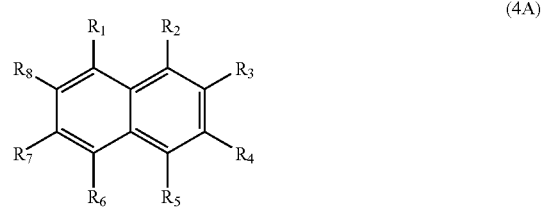

In the formula (4A), $R_1$ to $R_8$ are independently a hydrogen atom, a substituted or unsubstituted aryl group having 5 to 30 ring carbon atoms, a branched or linear alkyl group having 1 to 30 carbon atoms, a substituted or unsubstituted cycloalkyl group having 3 to 20 carbon atoms, or a combination thereof.

Specific examples of the naphthalene derivative are given below.
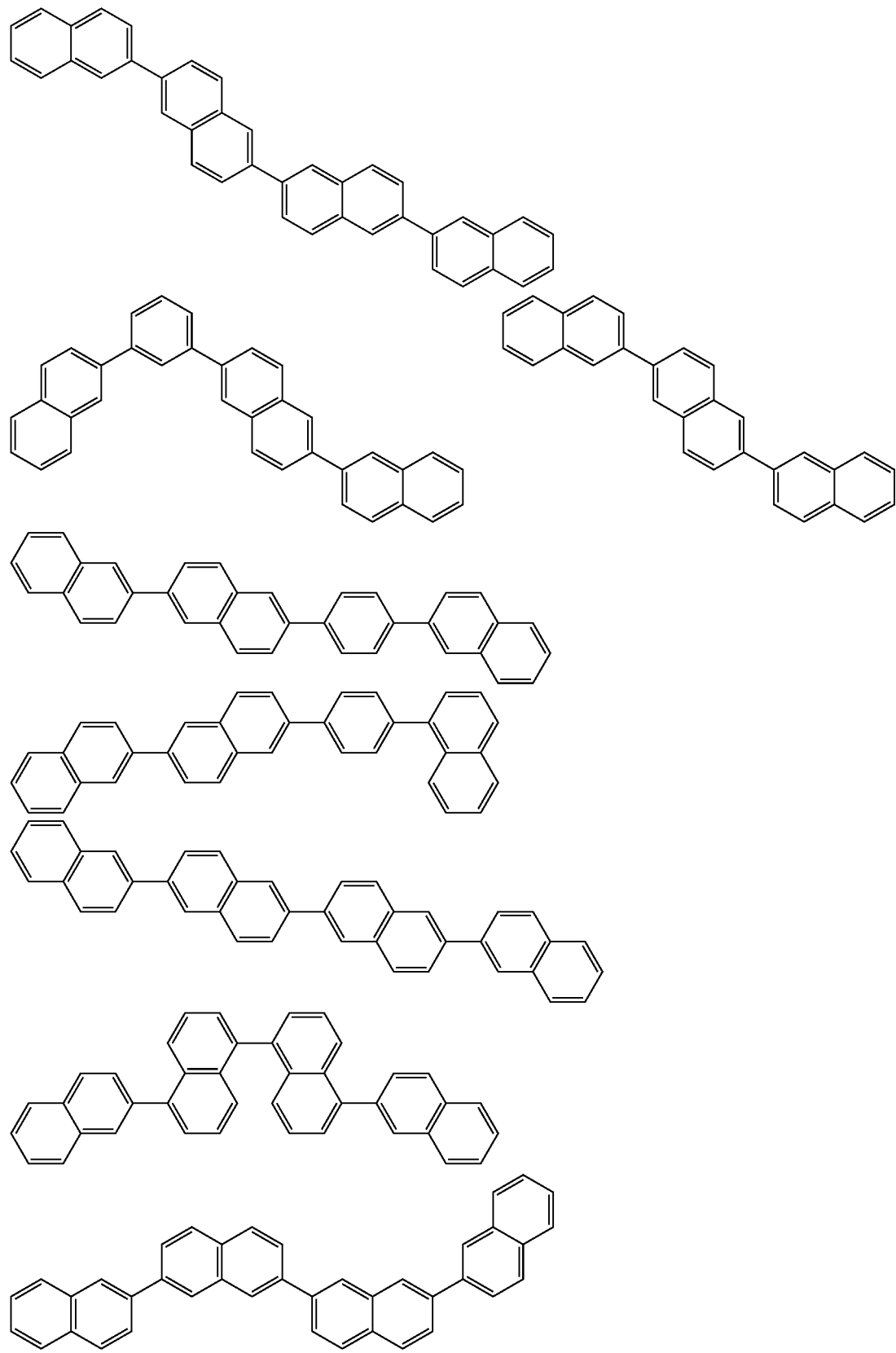

-continued

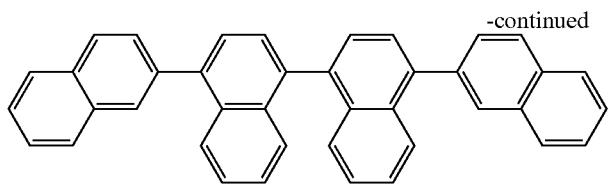

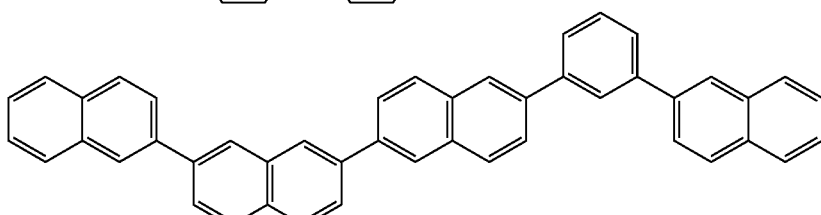

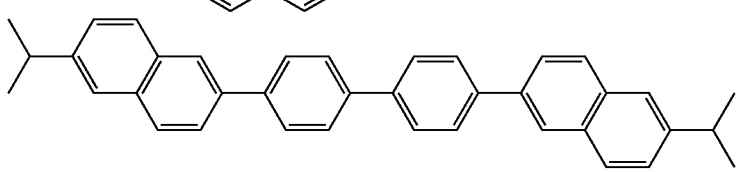

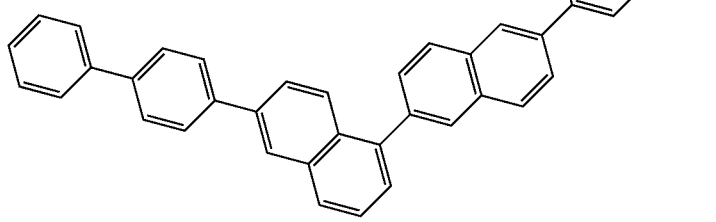

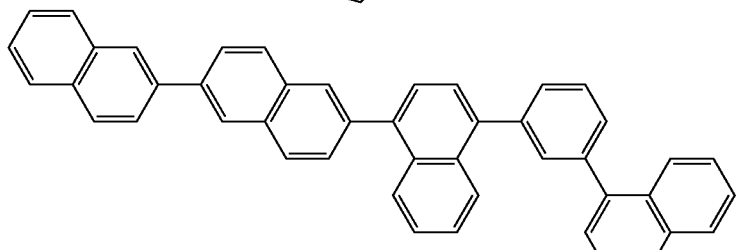

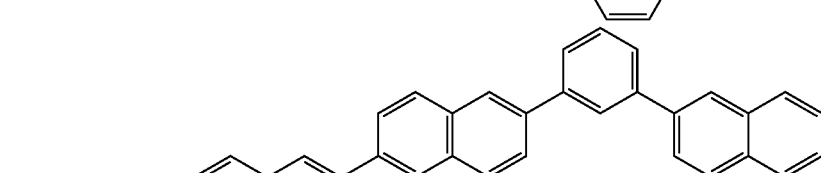

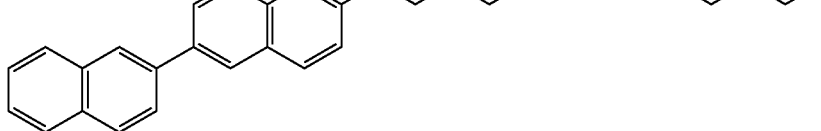

In the invention, it is preferred that the above-mentioned polycyclic fused aromatic skeleton part be phenanthrene shown by the following formula (5) or the derivative thereof.

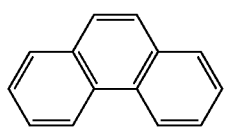

(5)

Examples of the the substituent of the phenanthrene derivative include alkyl, cycloalkyl, aralkyl, alkenyl, cycloalkenyl, alkinyl, hydroxyl, mercapto, alkoxy, alkylthio, arylether, arylthioether, aryl, heterocycle, halogen, haloalkane, haloalkene, haloalkine, cyano, aldehyde, carbonyl, carboxyl, ester, amino, nitro, silyl and siloxanyl.

As the phenanthrene derivative, a phenanthrene derivative shown by the following formula (5A) can be given, for example.

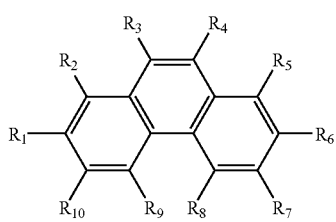

(5A)

In the above-mentioned formula (5A), $R_1$ to $R_{10}$ are independently a hydrogen atom, a substituted or unsubstituted aryl group having 5 to 30 ring carbon atoms, a branched or linear alkyl group having 1 to 30 carbon atoms, a substituted or unsubstituted cycloalkyl group having 3 to 20 carbon atoms, or a combination thereof.

Specific examples of the phenanthrene derivative shown by the formula (5) are given below.

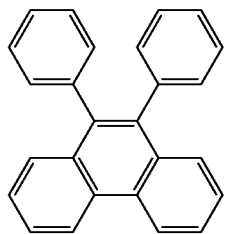
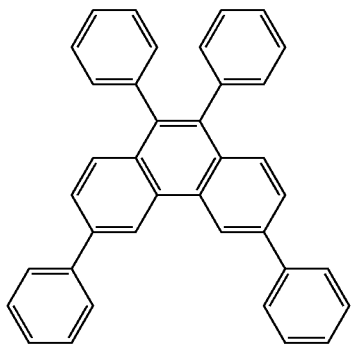
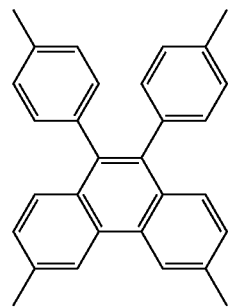
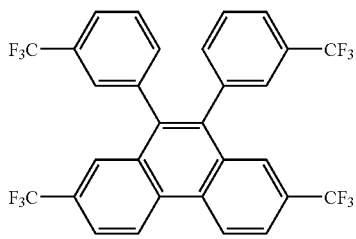
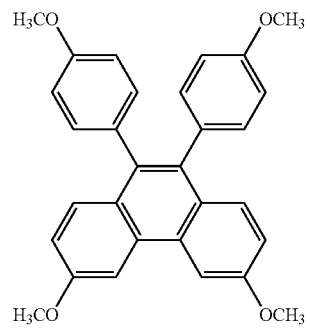
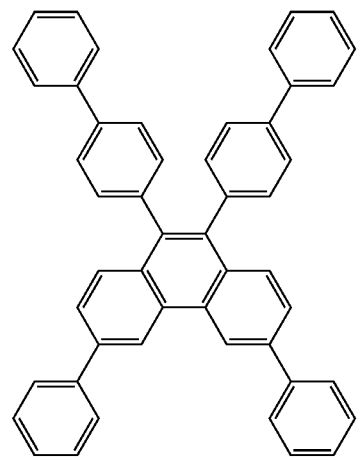
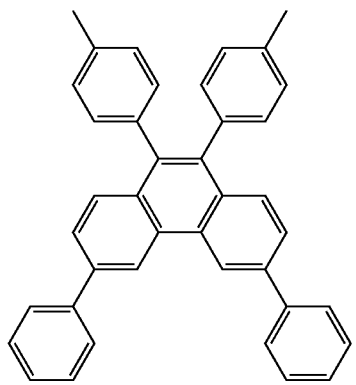
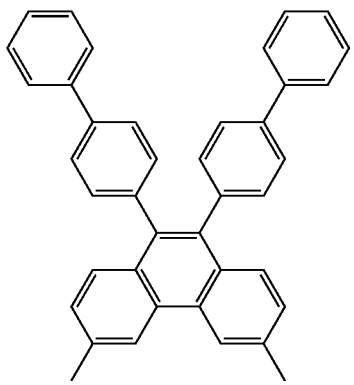
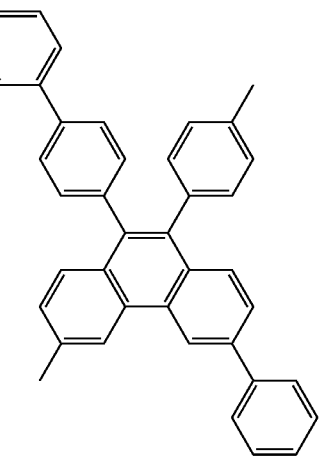

-continued
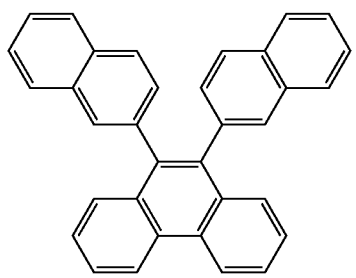 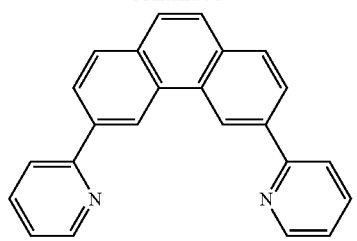 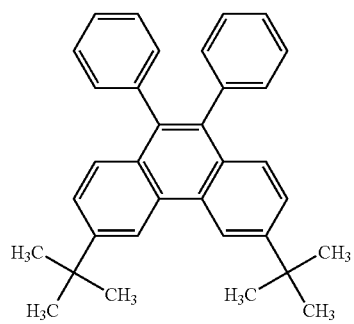
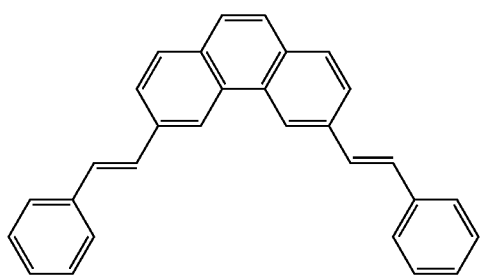 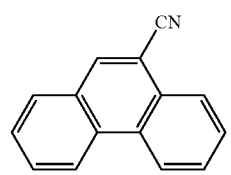
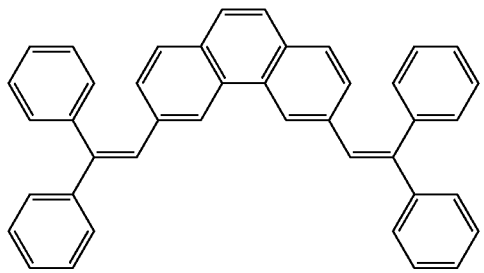 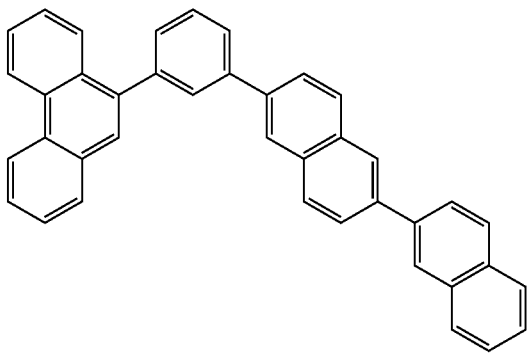
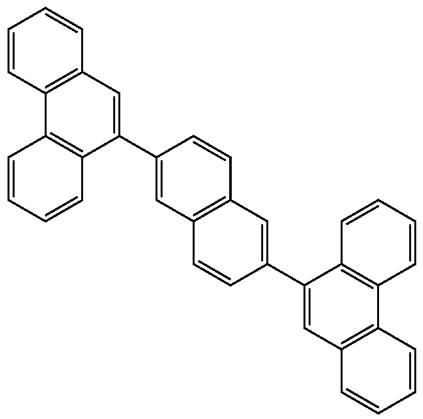 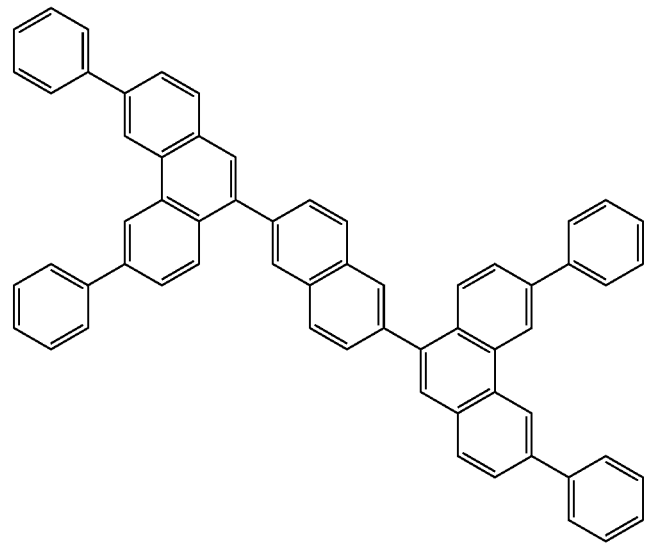

-continued
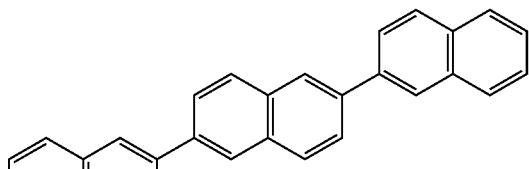
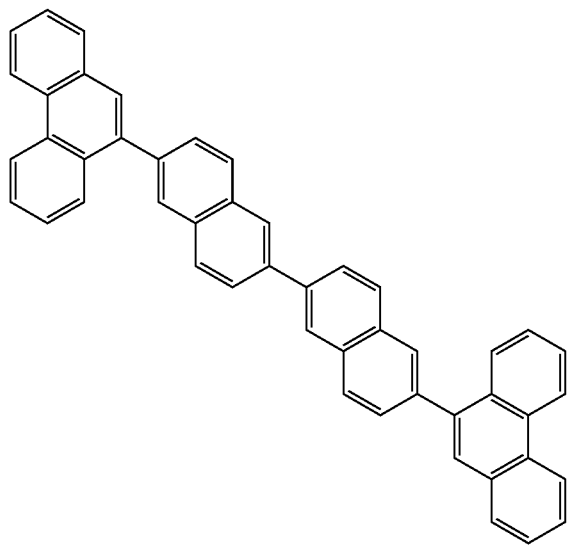
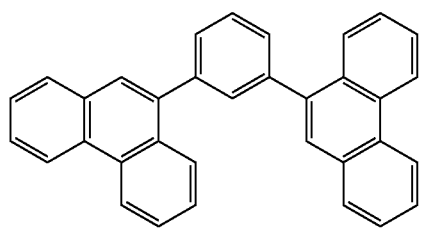
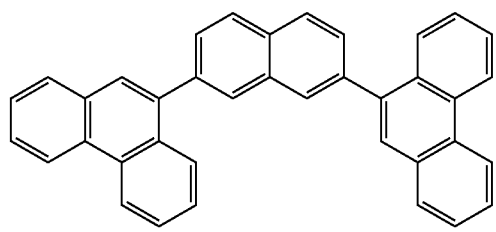
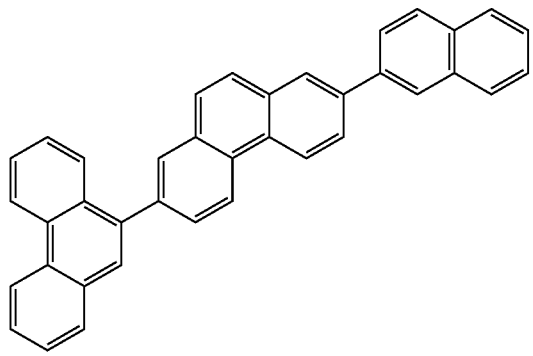
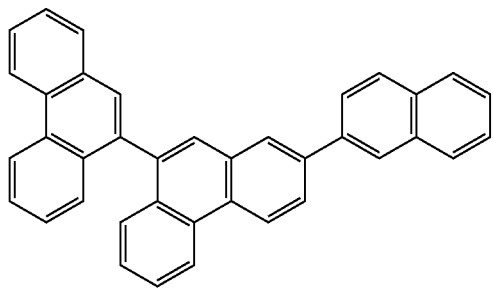
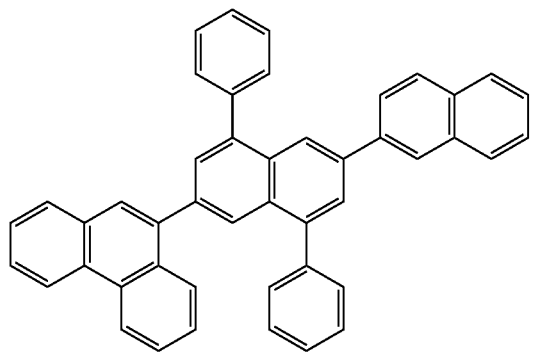
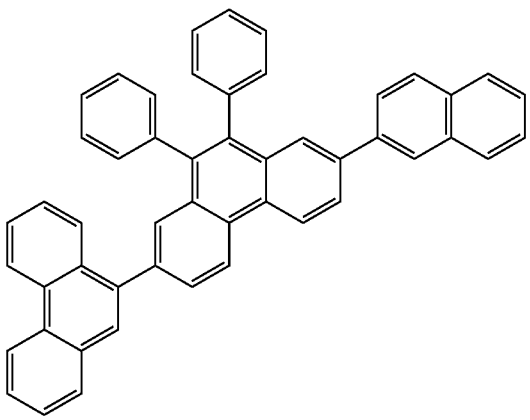

-continued
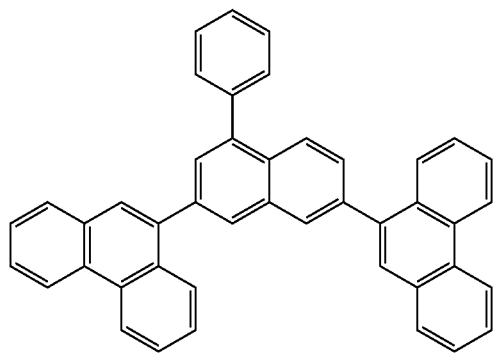
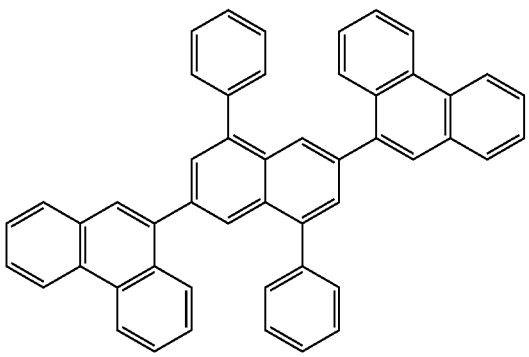
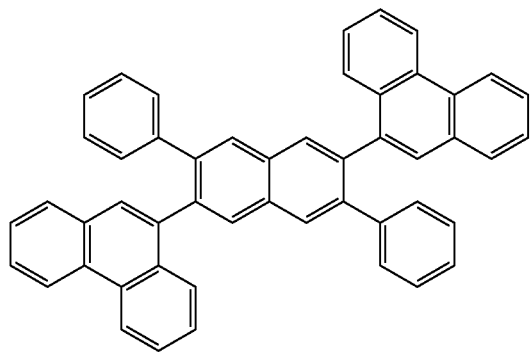
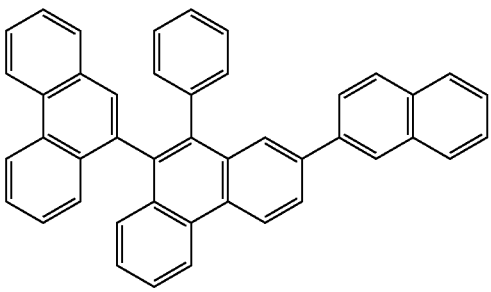
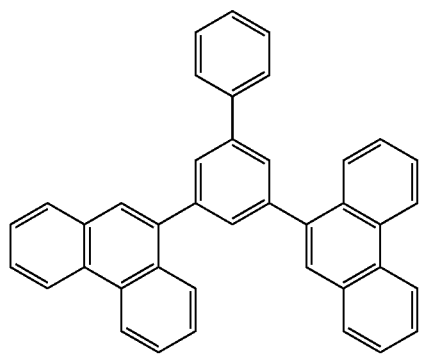
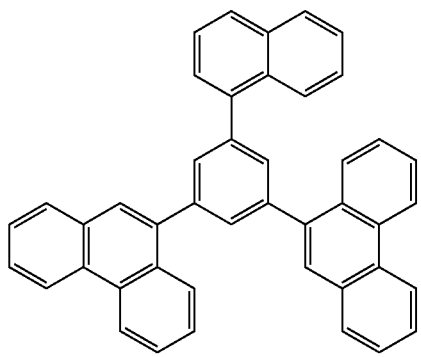
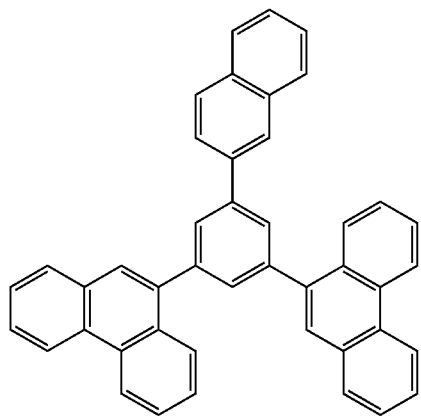
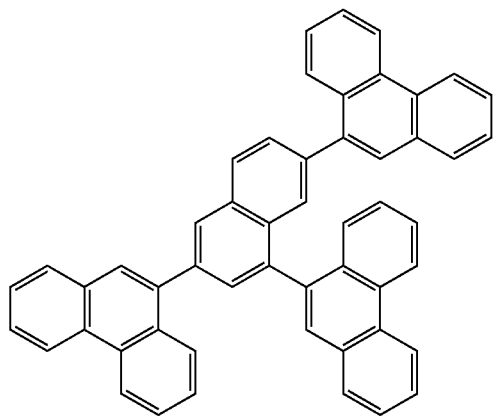
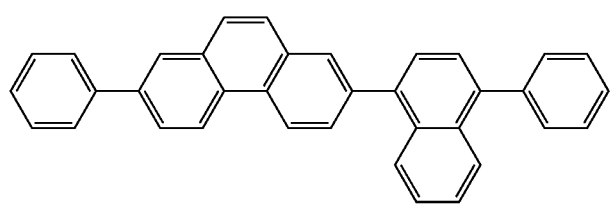

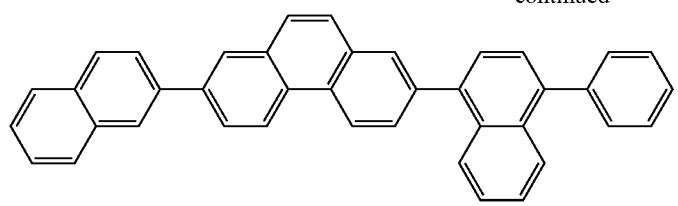
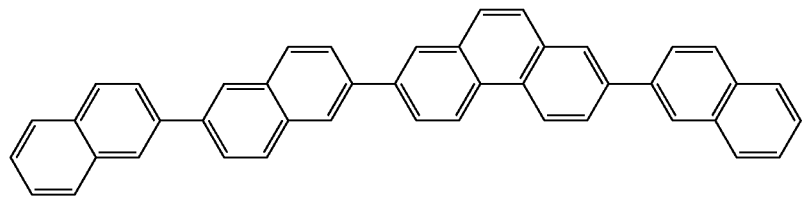
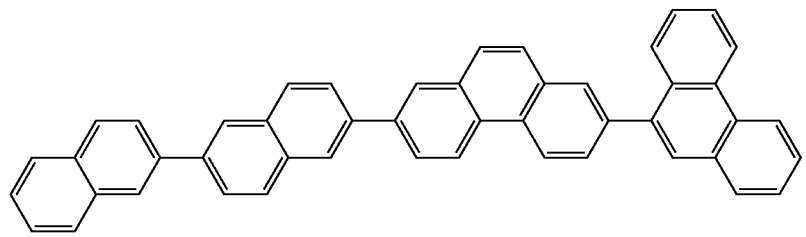
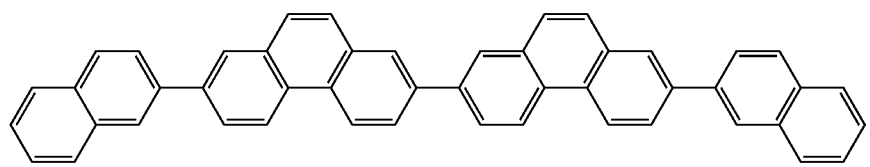
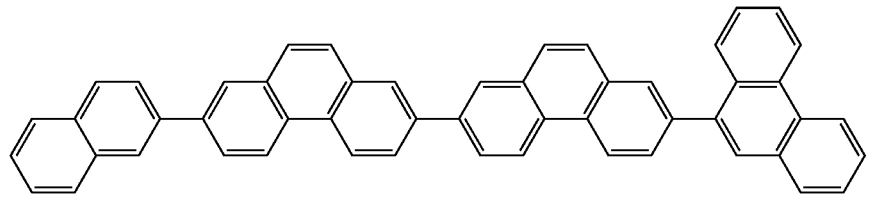
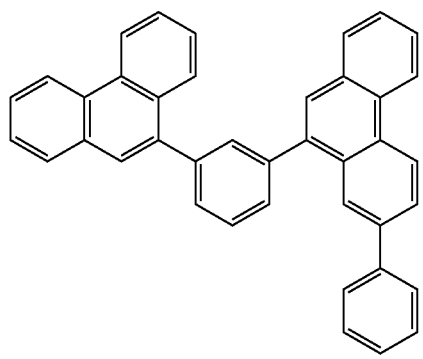
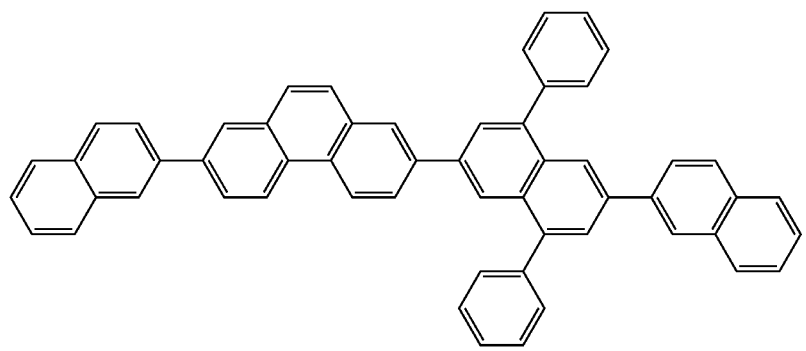

-continued
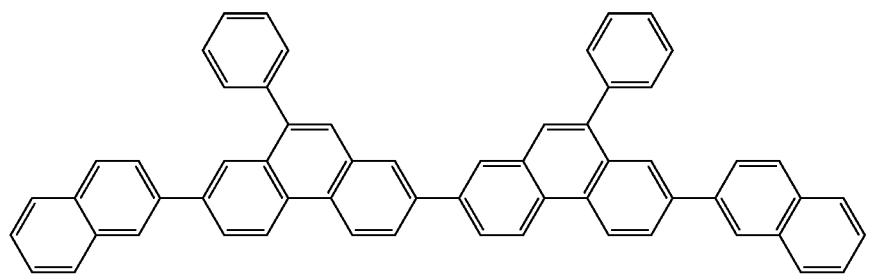
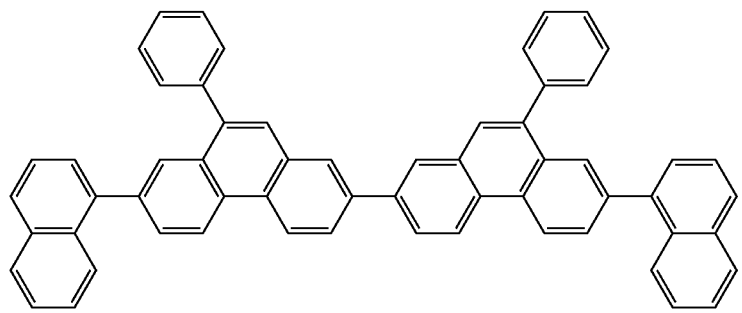
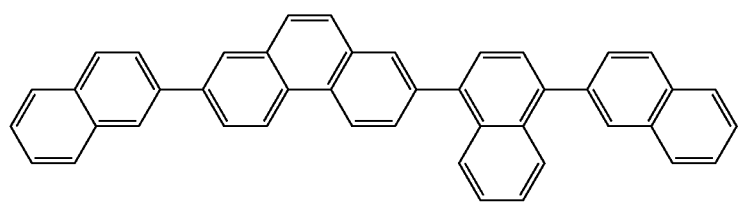
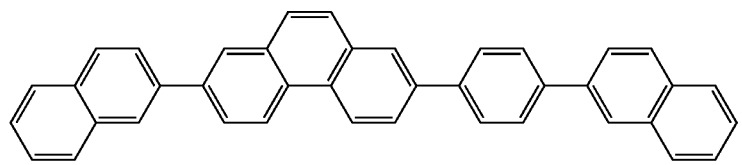
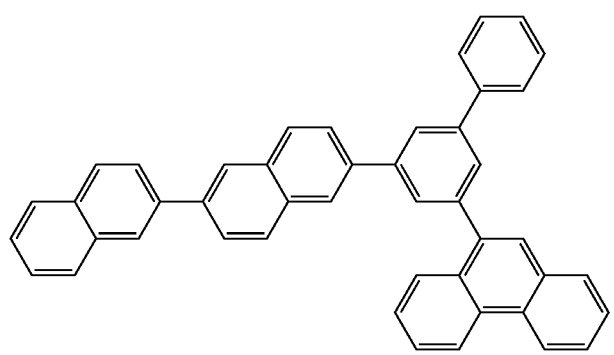
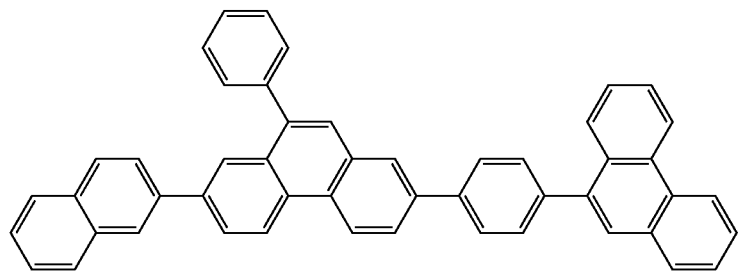

-continued
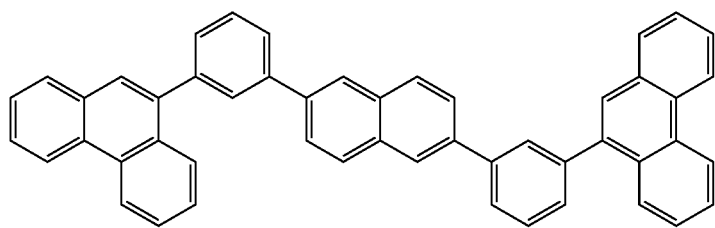
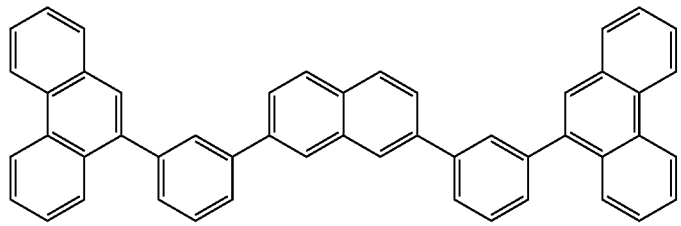
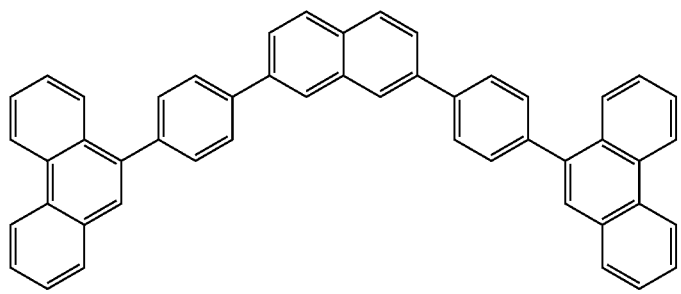
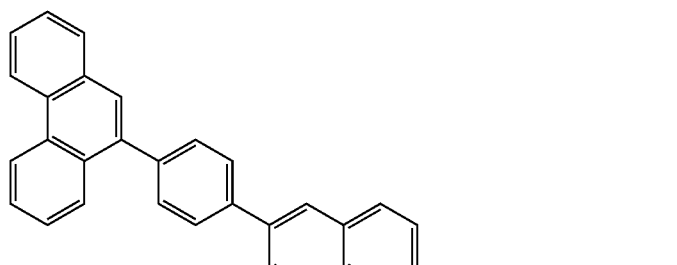
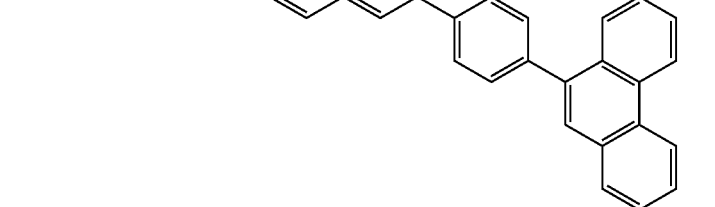
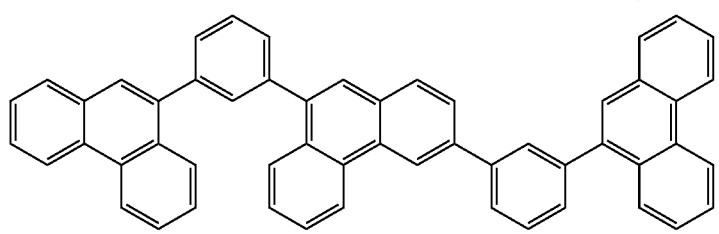
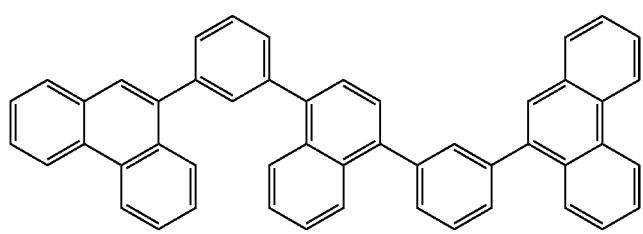

-continued
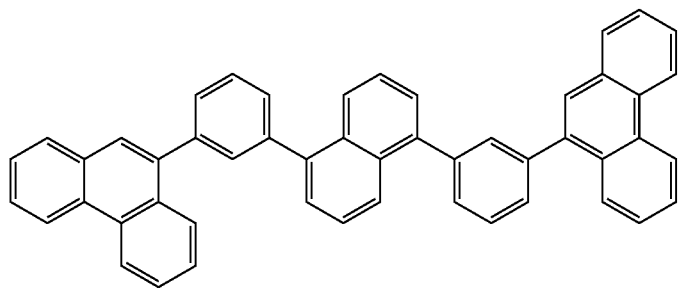

-continued
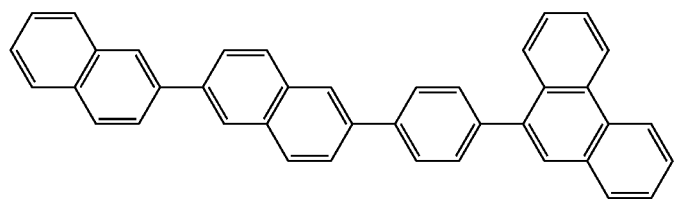
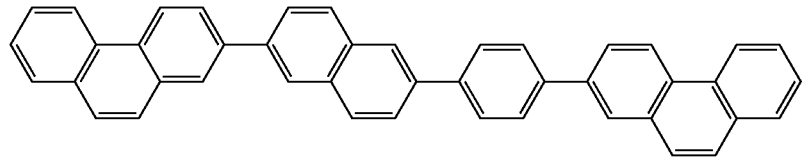
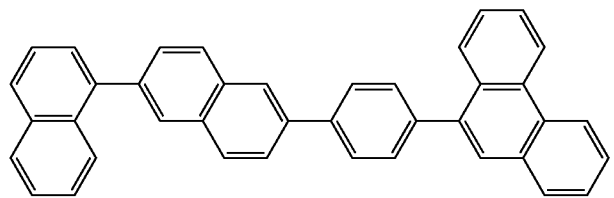
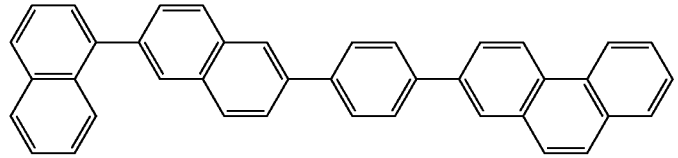
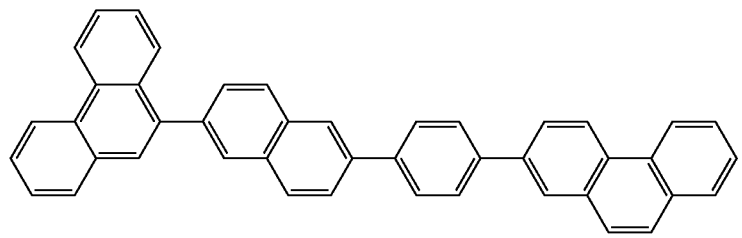
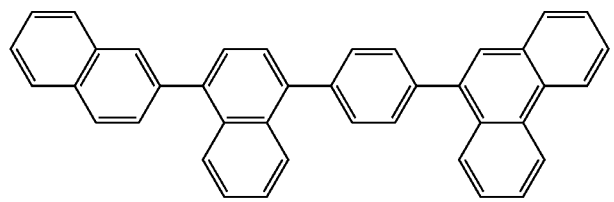
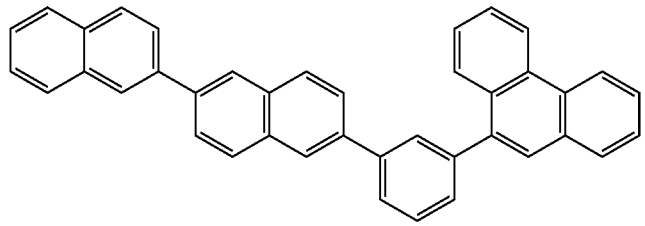
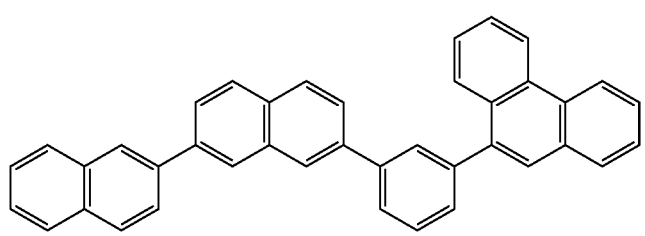

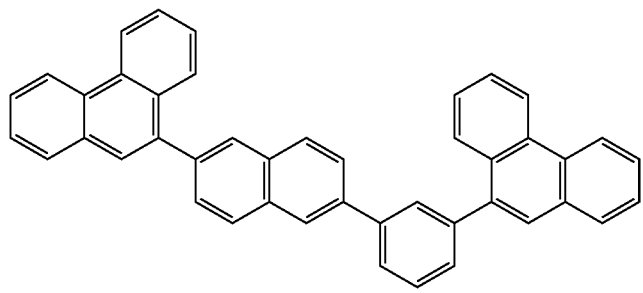
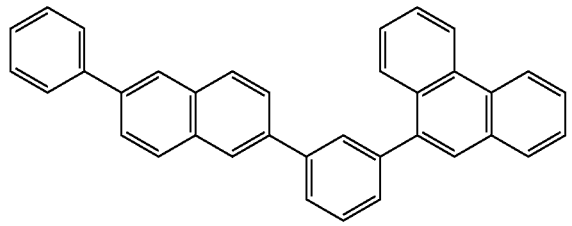
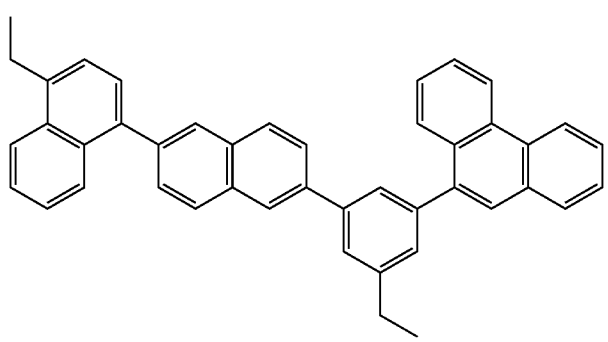
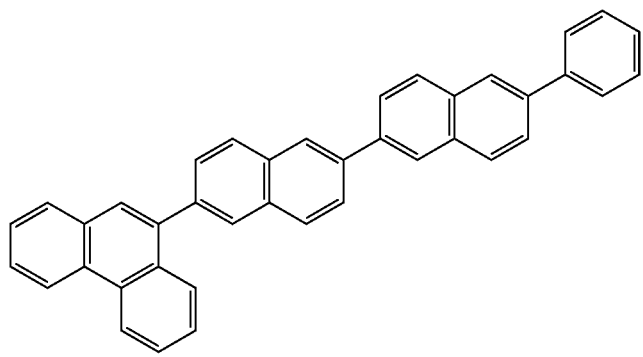
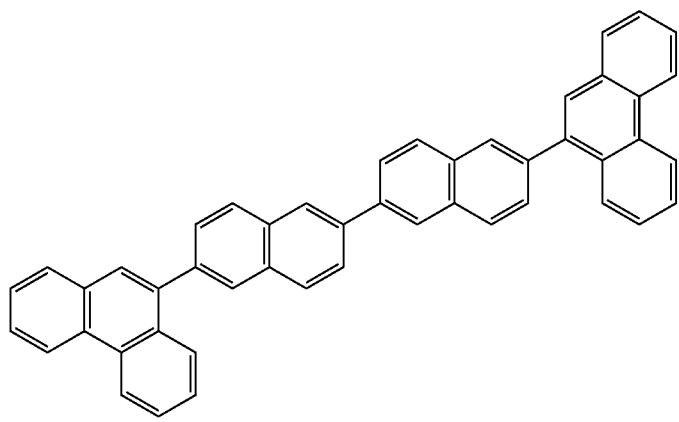

-continued
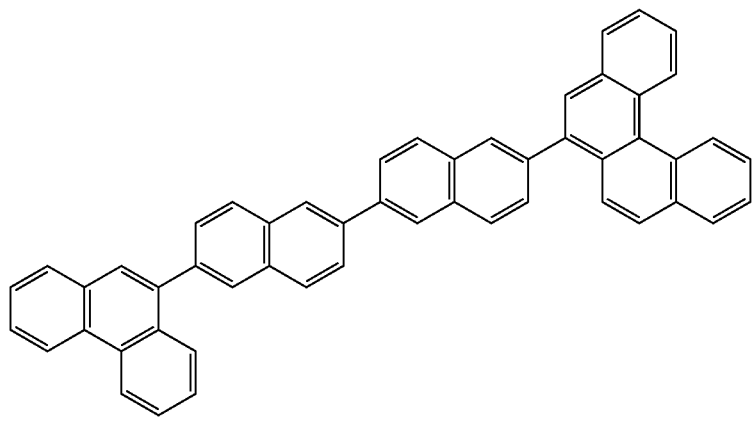
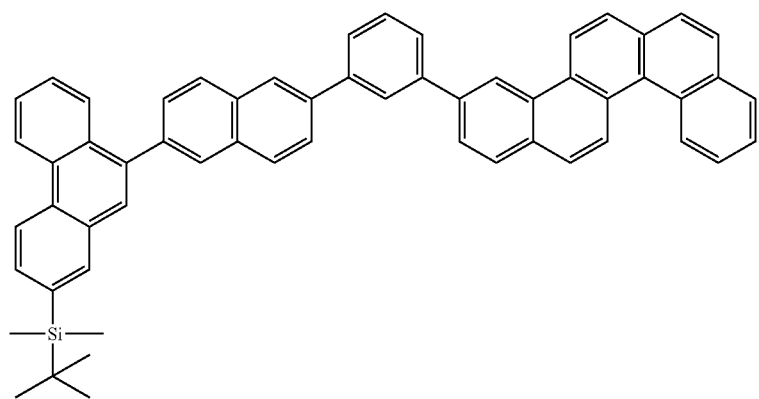
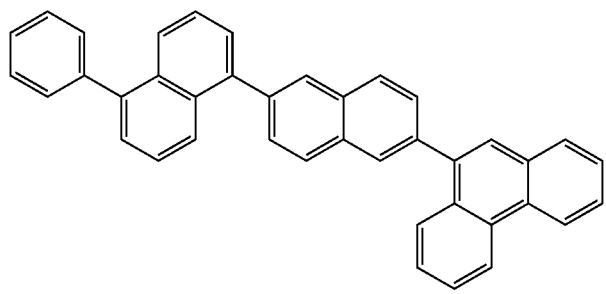
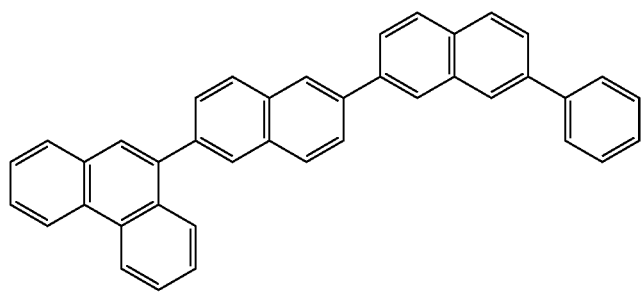

-continued
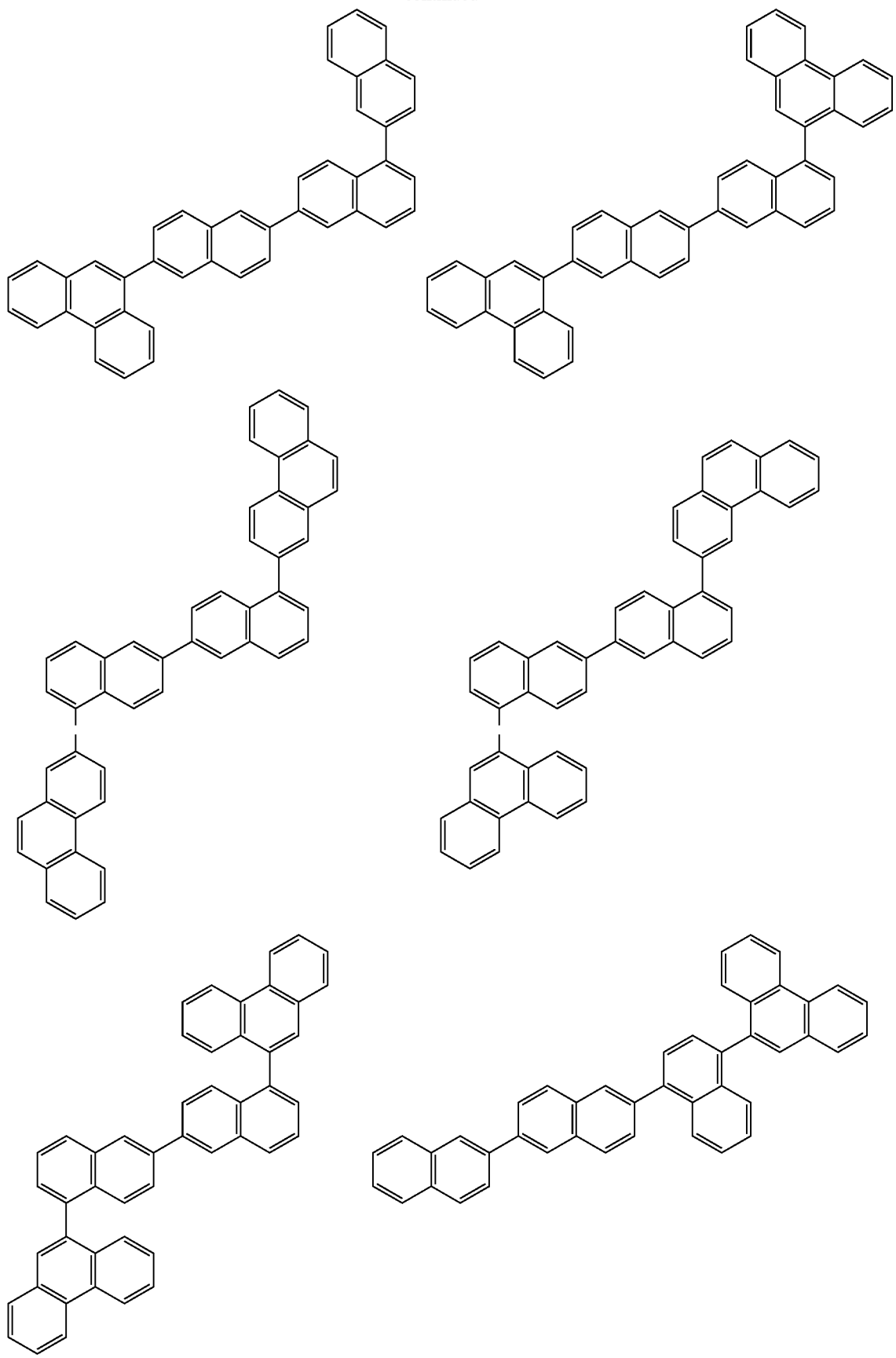

-continued
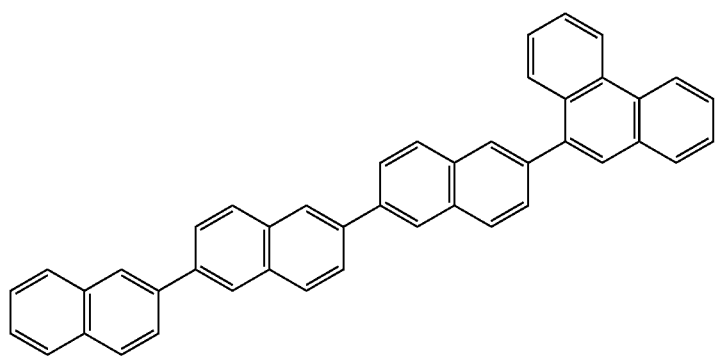
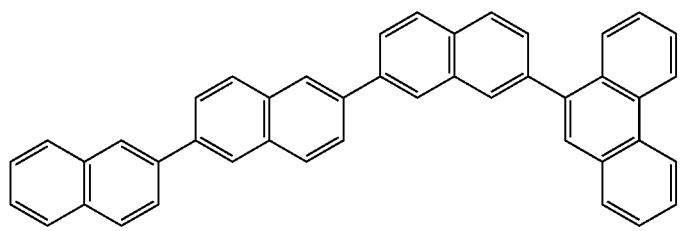
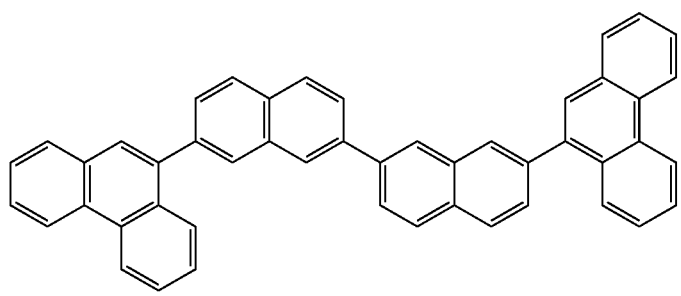
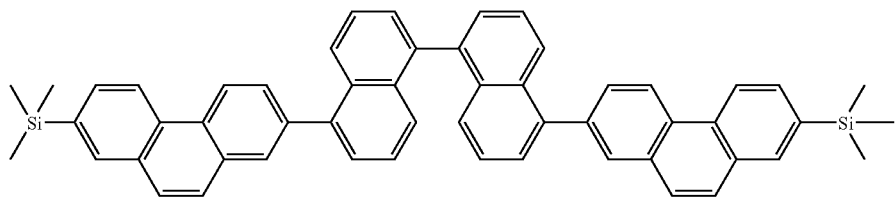
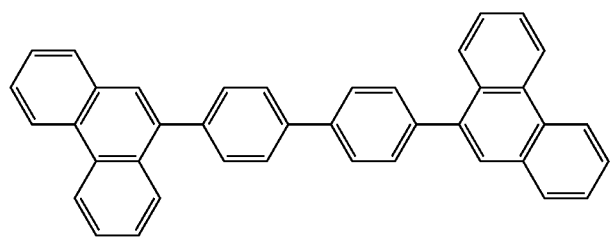
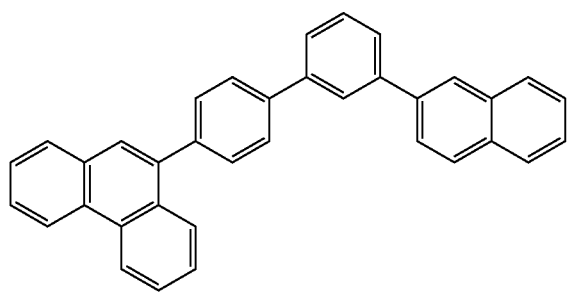

-continued
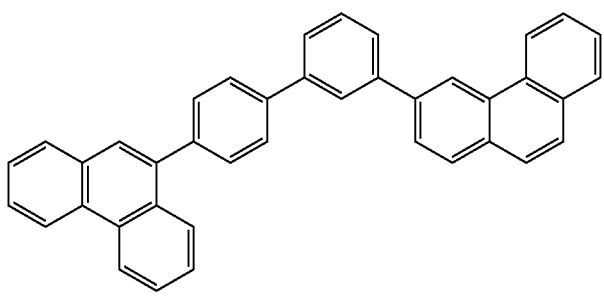
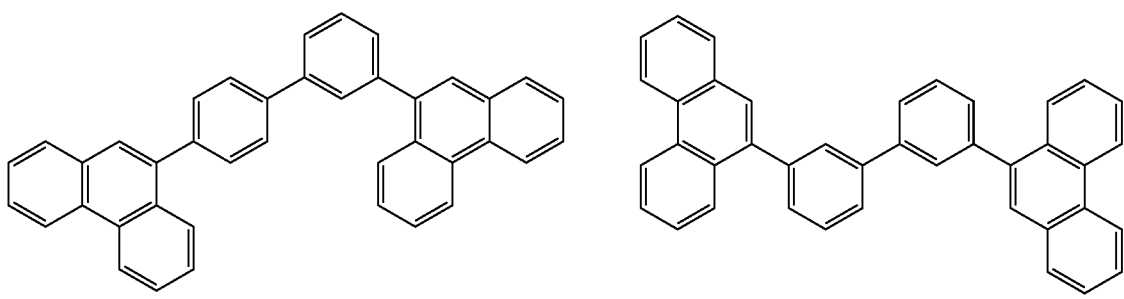
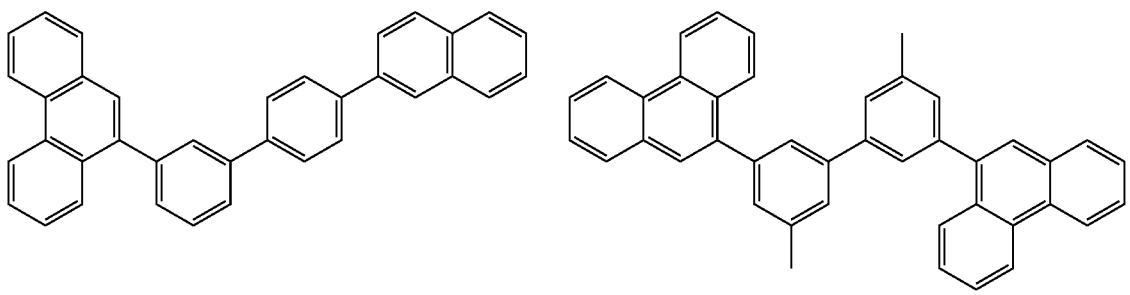
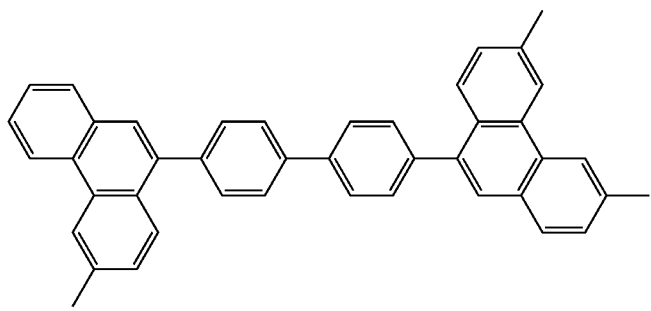
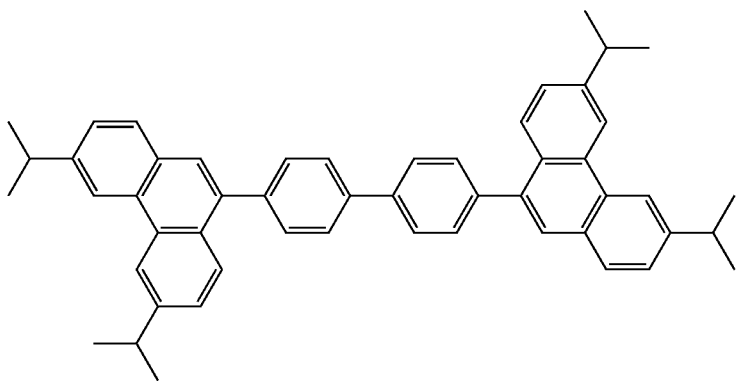

-continued
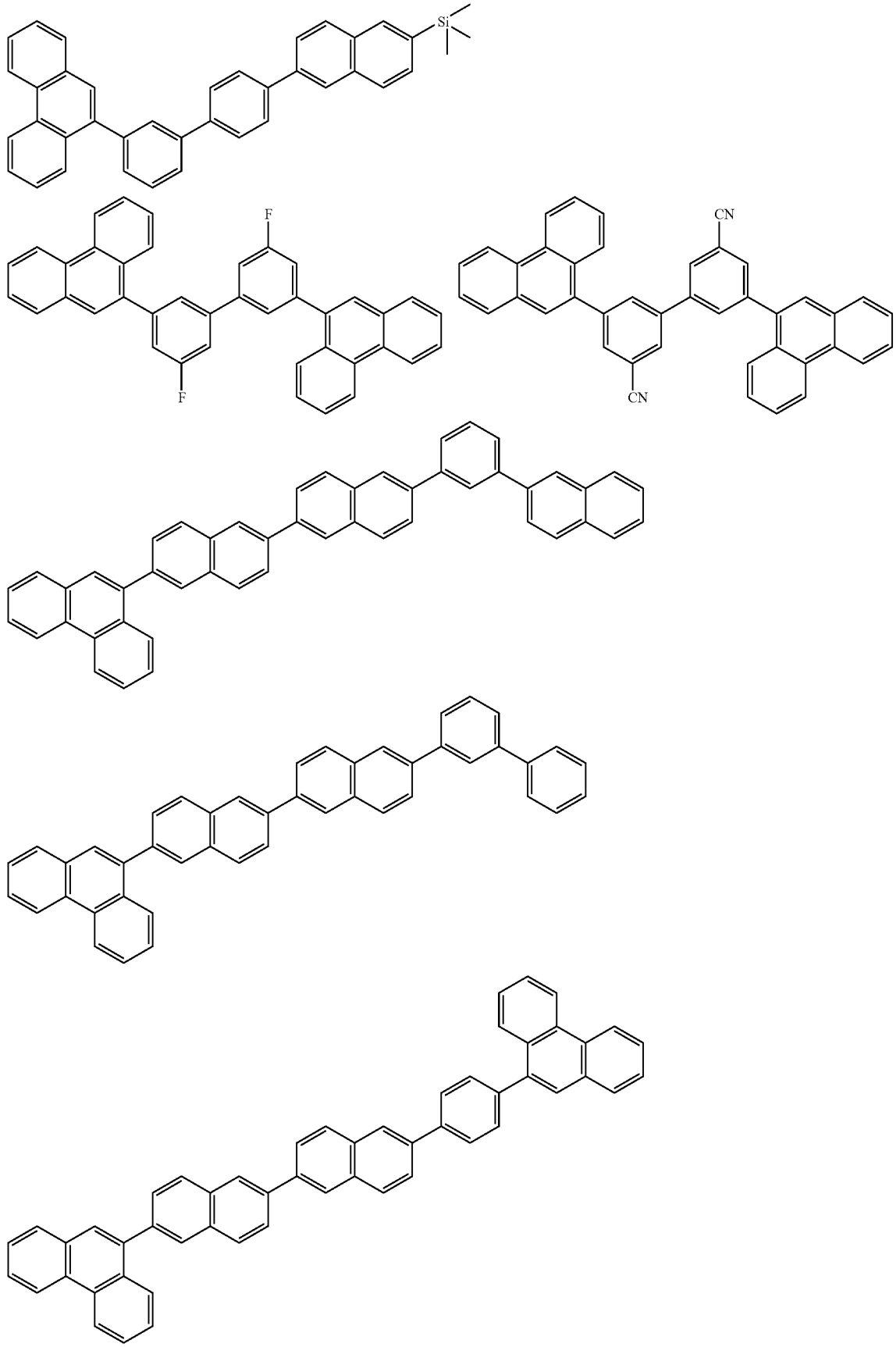

-continued

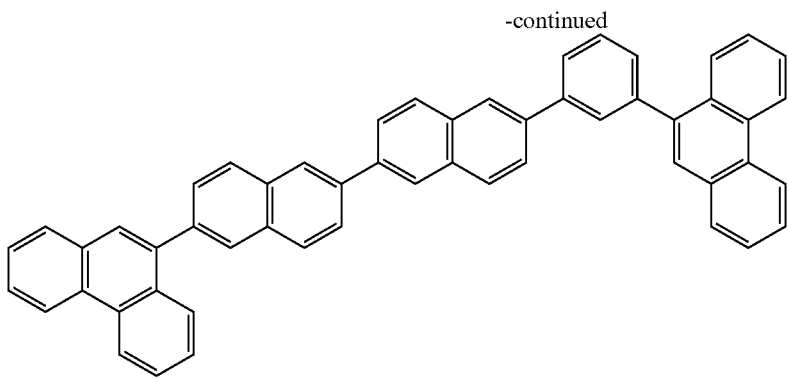

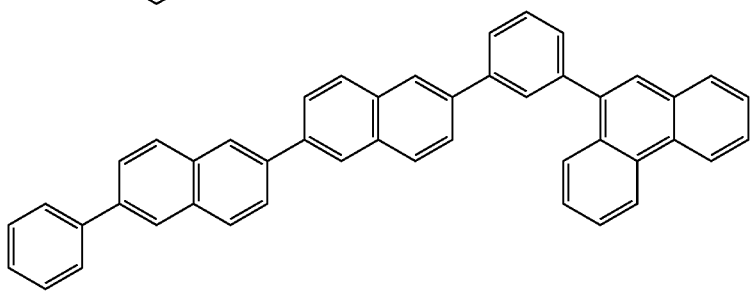

Furthermore, it is preferred that the polycyclic fused aromatic skeleton part be chrysene shown by the following formula (6) or the derivative thereof.

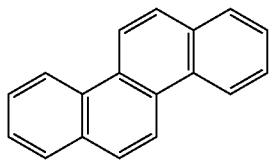
(6)

As the substituent of the chrysene derivative, those exemplified above as the substituent of the phenanthrene derivative can be given.

As the chrysene derivative, those shown by the following formula (6A) can be given, for example.

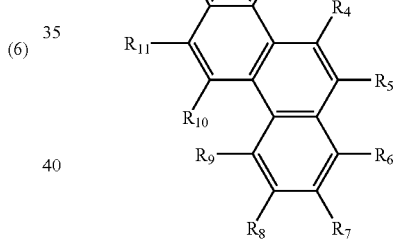
(6A)

In the above formula (6A), $R_1$ to $R_{12}$ are independently a hydrogen atom, or a substituted or unsubstituted aryl group having 5 to 30 ring carbon atoms, a branched or linear alkyl group having 1 to 30 carbon atoms, a substituted or unsubstituted cycloalkyl group having 3 to 20 carbon atoms, or a combination thereof.

Specific examples of the chrysene derivative shown by the formula (6) are given below.

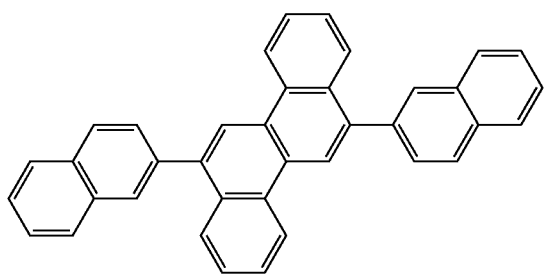

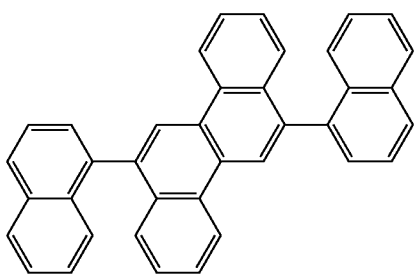

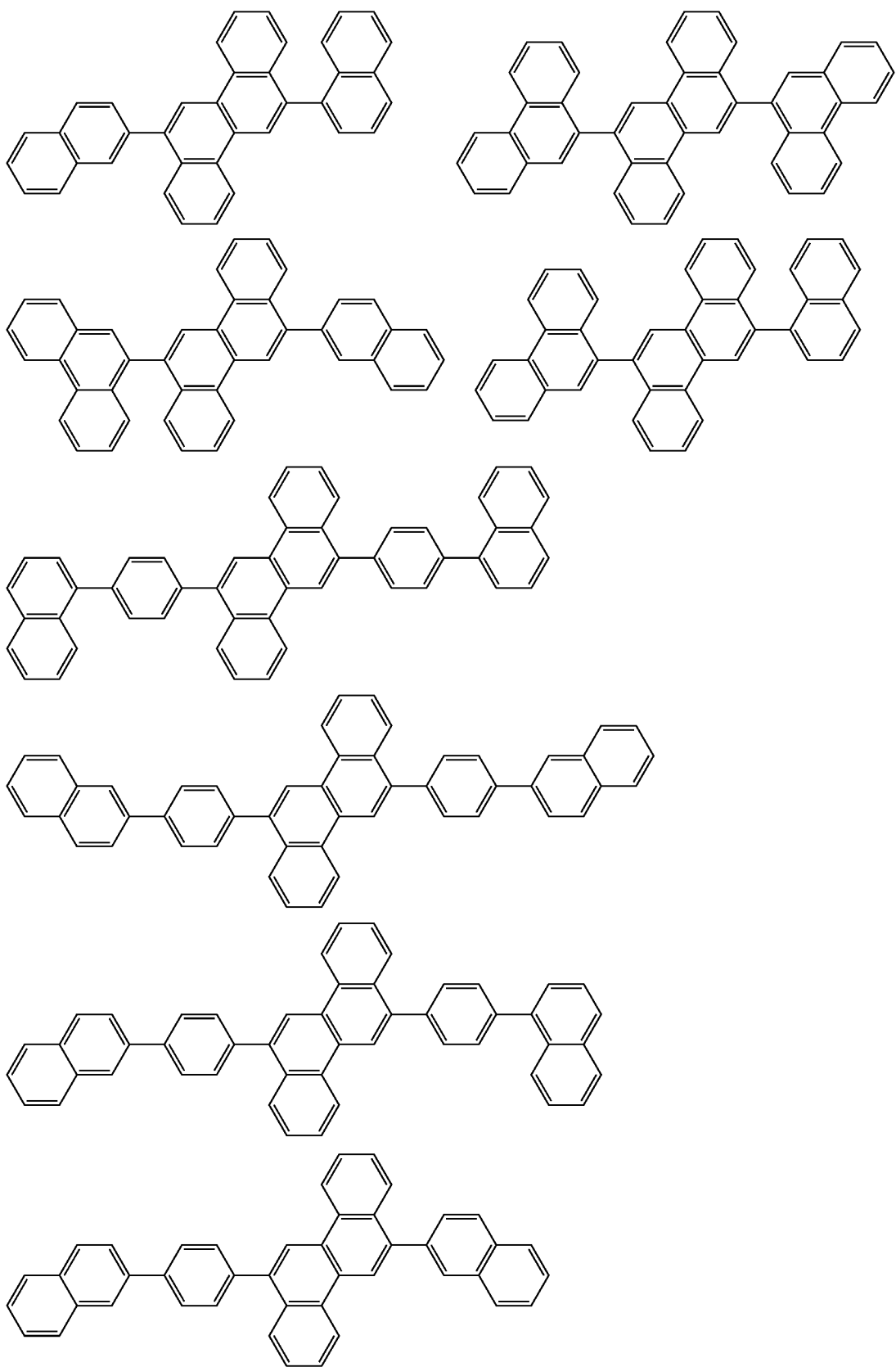

-continued
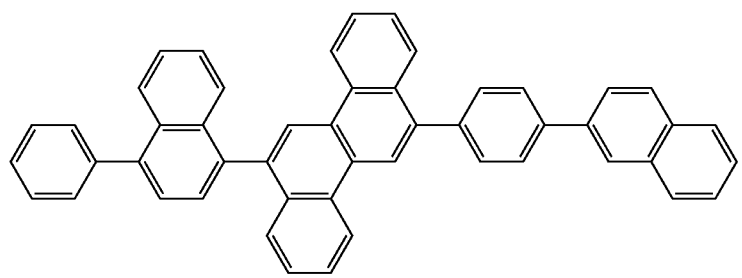
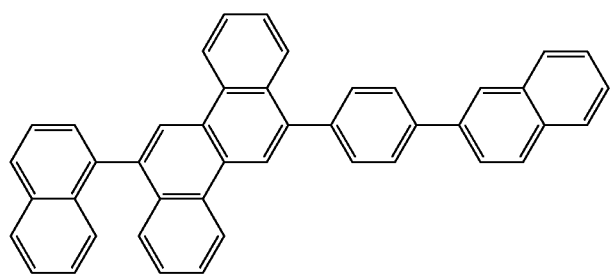
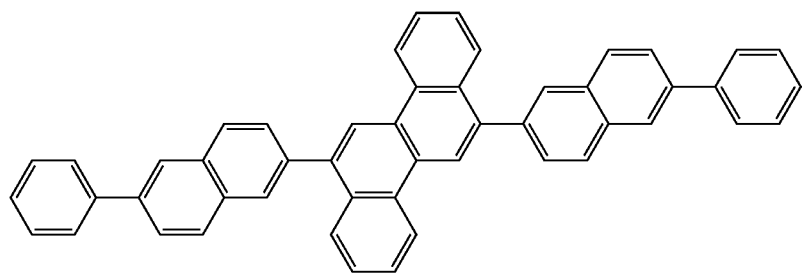
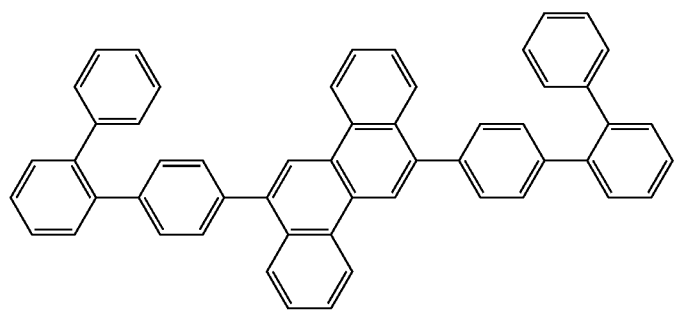
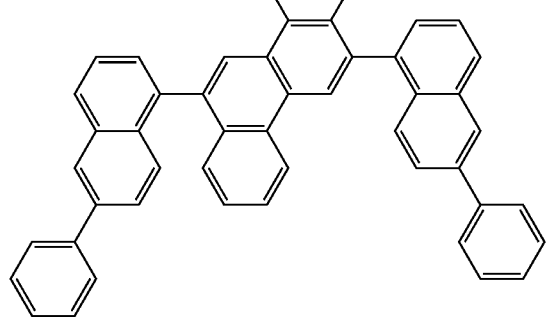

-continued
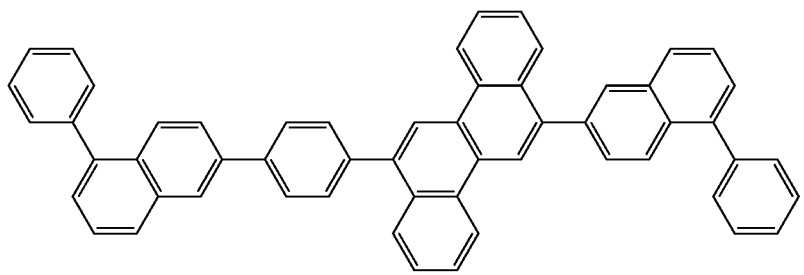
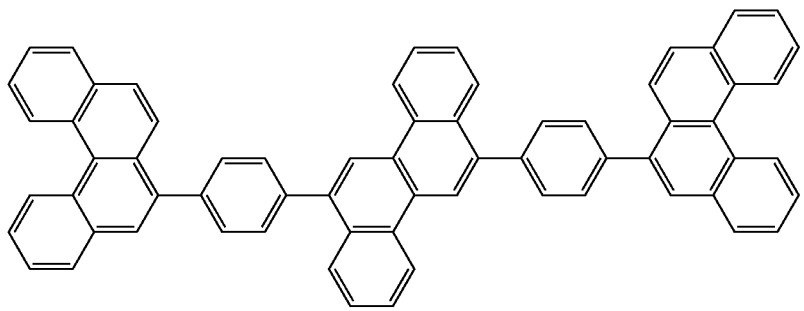
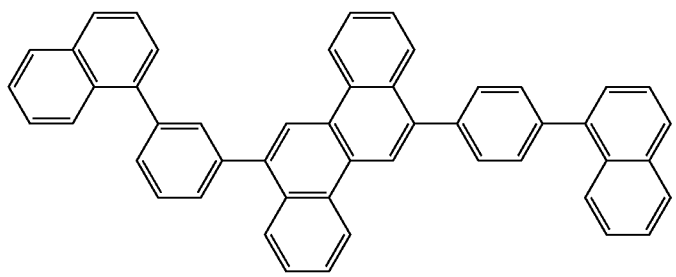
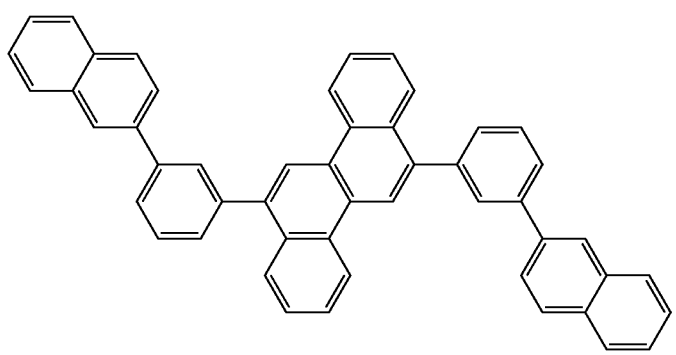
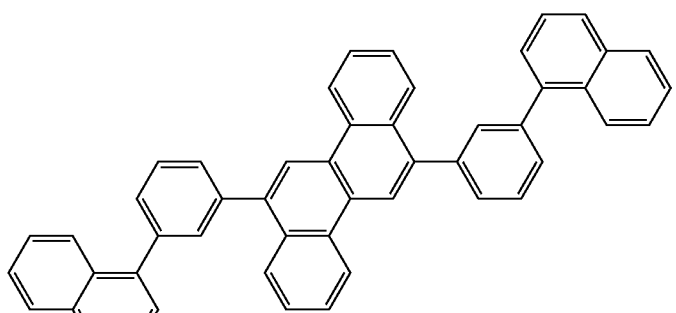

-continued
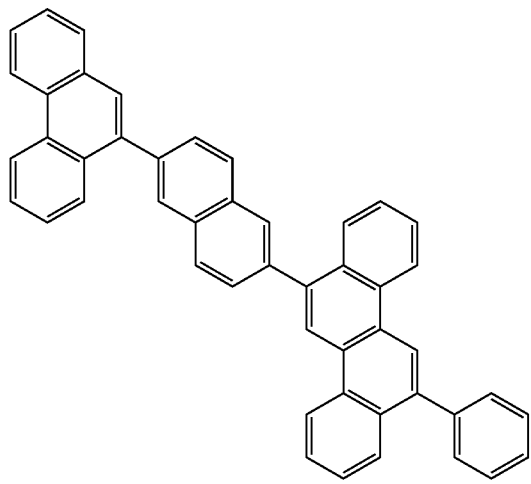
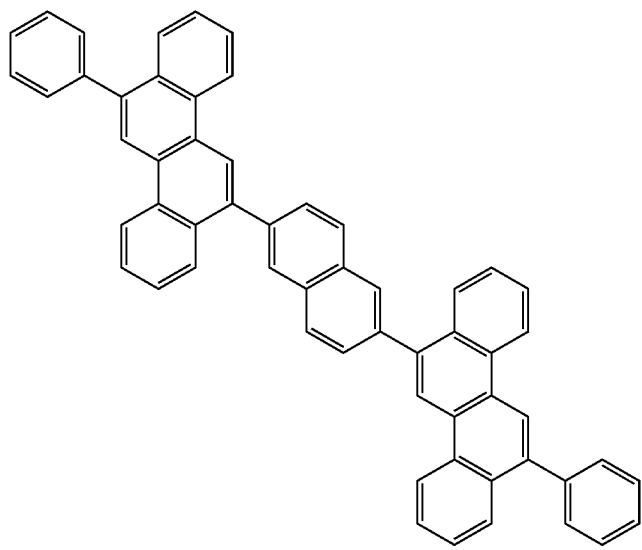
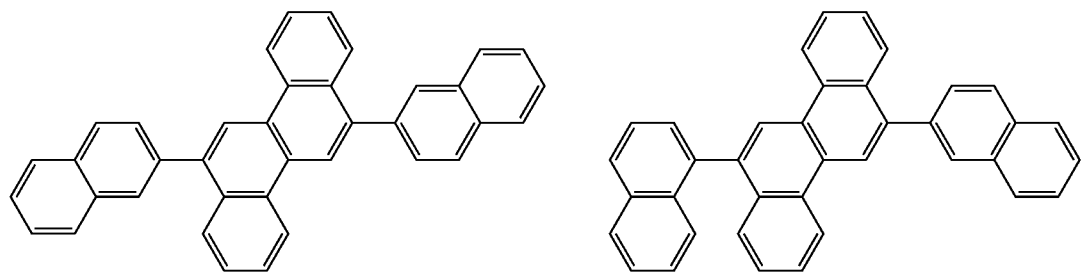
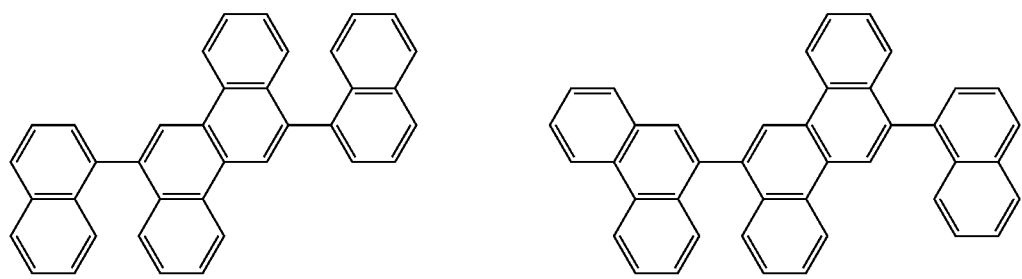

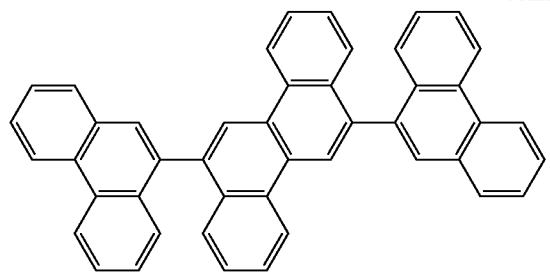
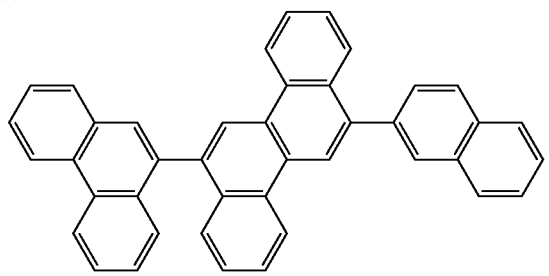
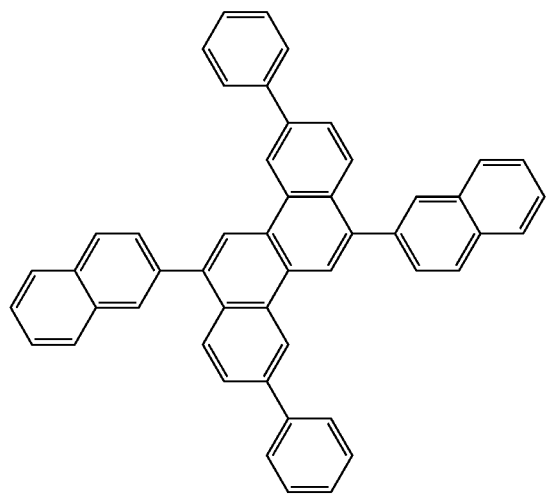
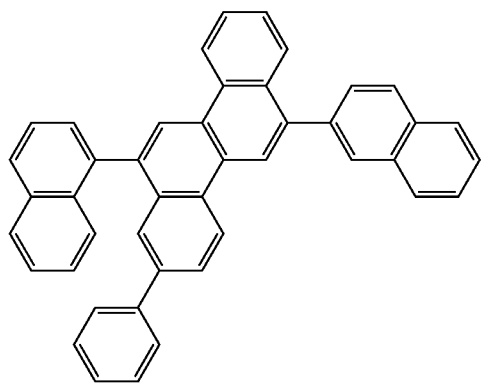
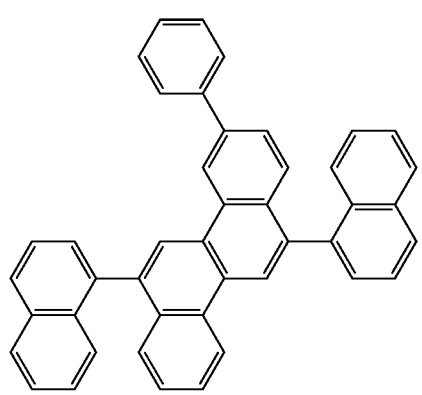
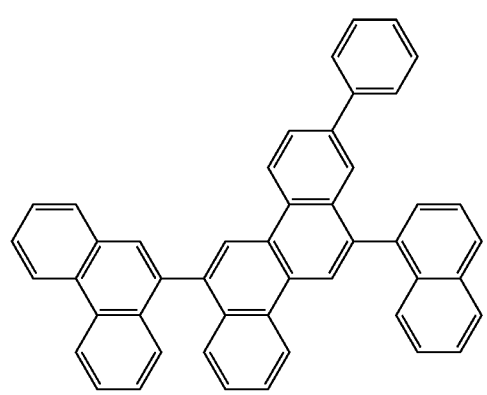
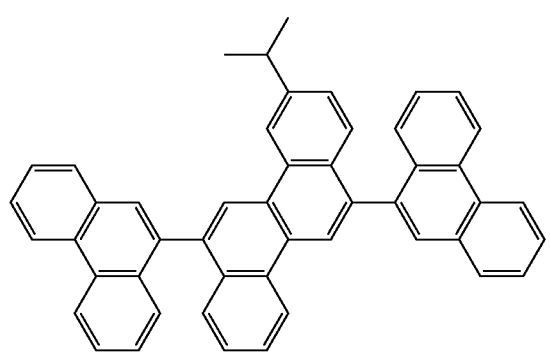
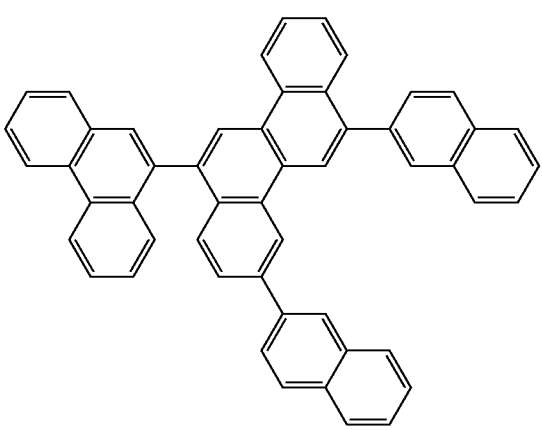

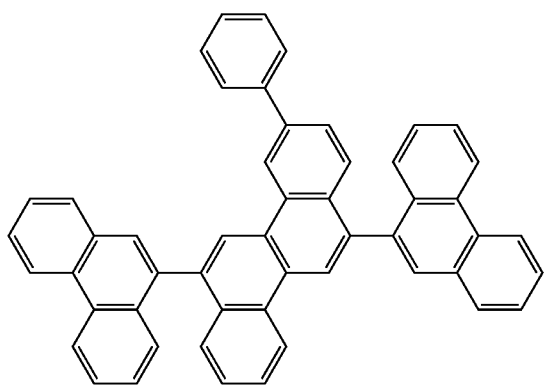
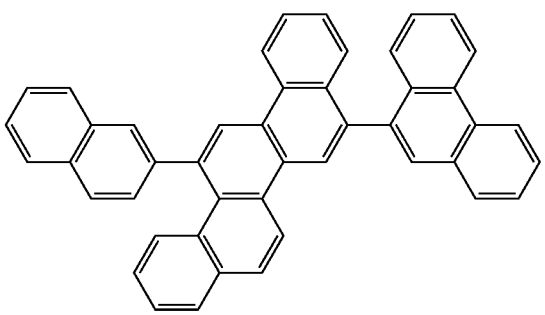
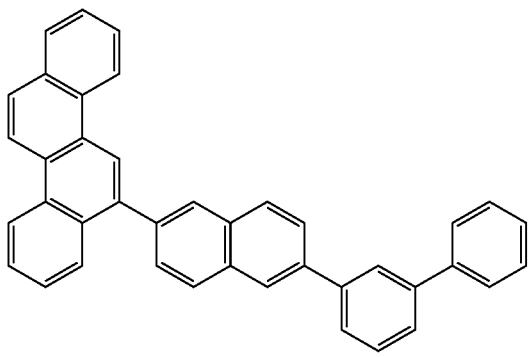
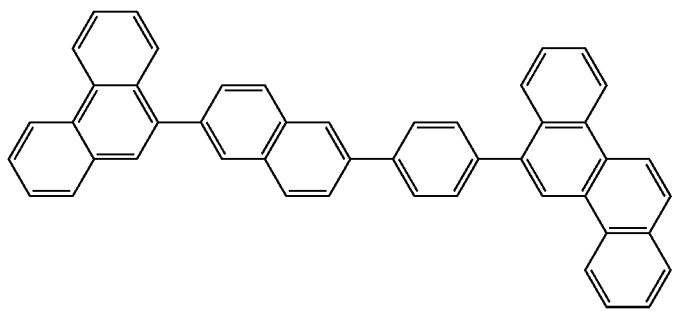
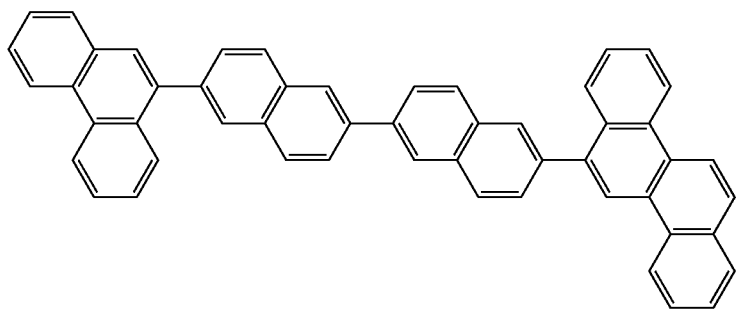

-continued
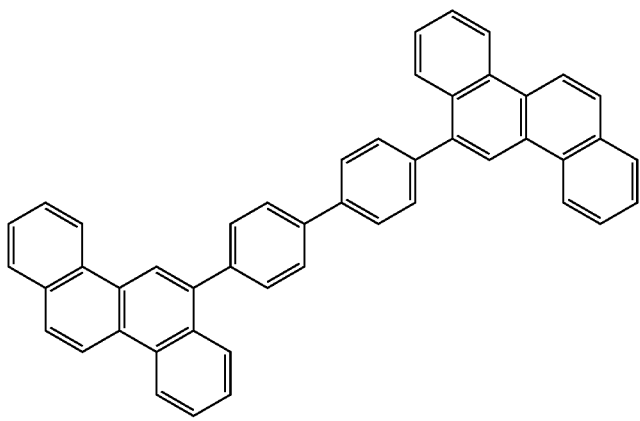
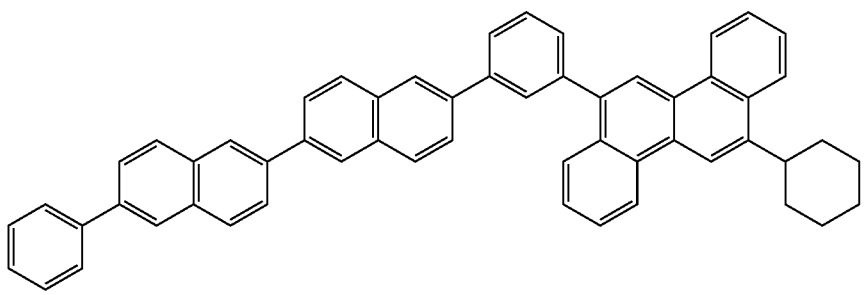
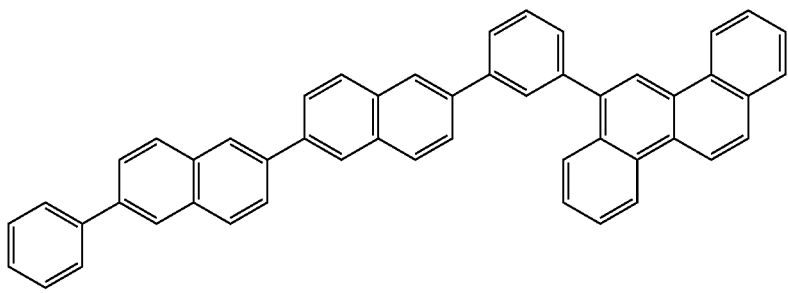
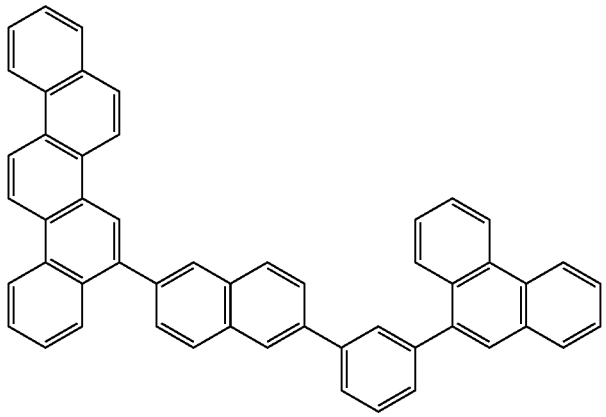

Furthermore, it is preferred that the polycyclic fused aromatic skeleton part be a compound (benzo[c]phenanthrene) shown by the following formula (7) or the derivative thereof.

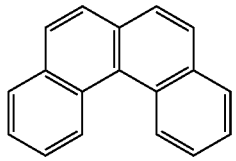

(7)

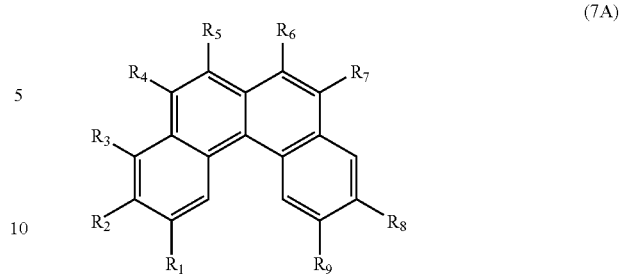

(7A)

As the substituent of a benzo[c]phenanthrene derivative, those exemplified above as the substituent of the phenanthrene derivative can be given.

As the benzo[c]phenanthrene derivative, a derivative shown by the following formula (7A) can be given, for example.

In formula (7A), $R_1$ to $R_9$ are independently a hydrogen atom or an aryl group having 5 to 30 ring carbon atoms, a branched or linear alkyl group having 1 to 30 carbon atoms, a substituted or unsubstituted cycloalkyl group having 3 to 20 carbon atoms or a combination thereof.

Specific examples of the benzo[c]phenanthrene derivative shown by the formula (7A) are given below.

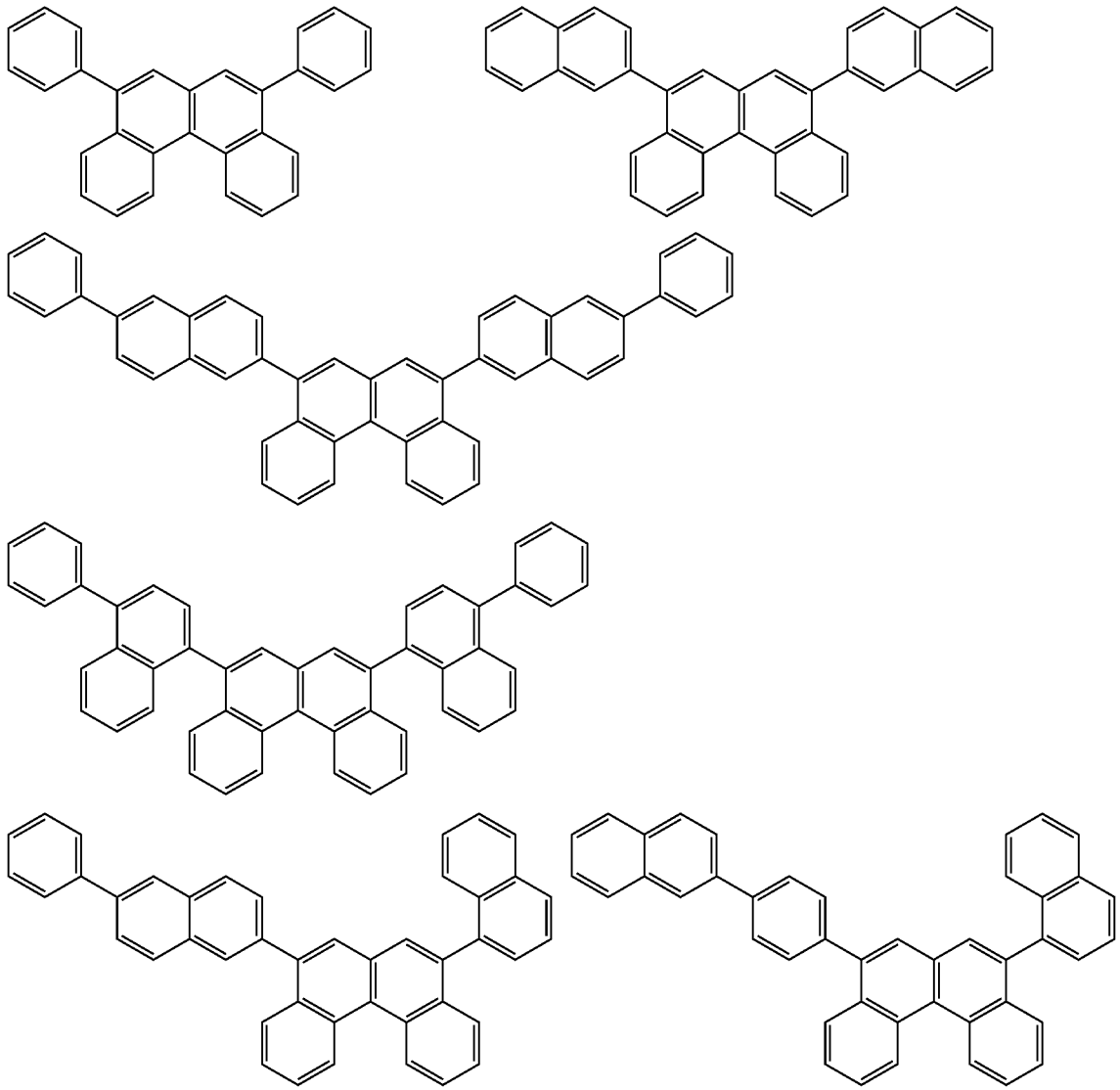

-continued
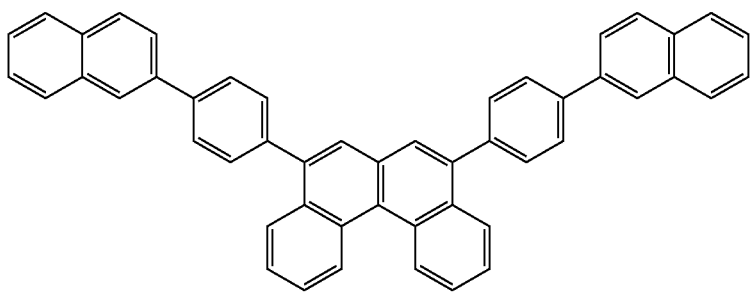
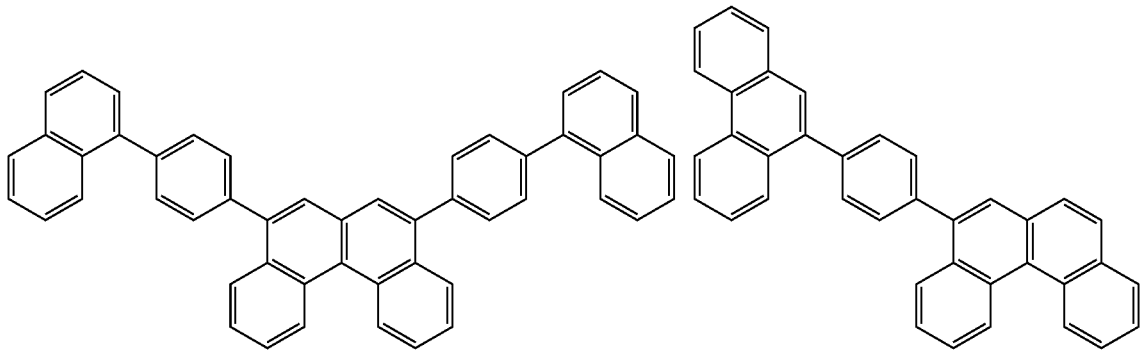
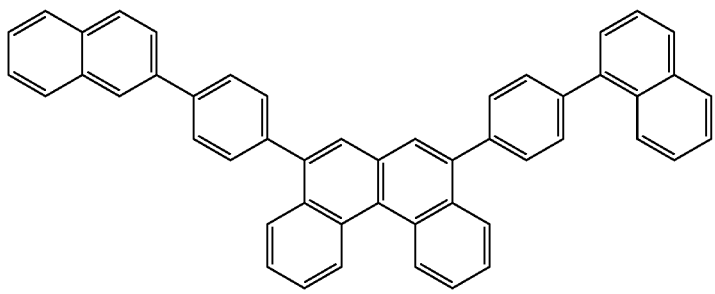
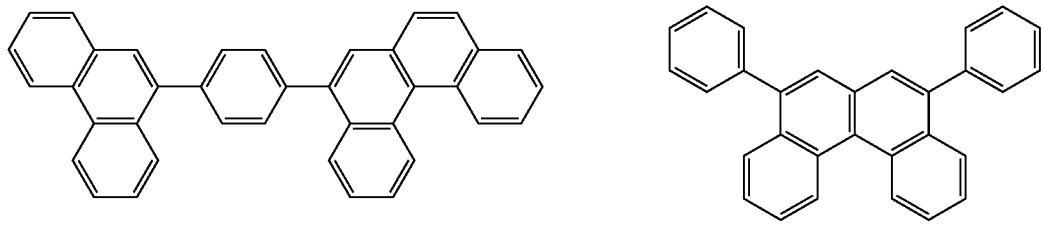
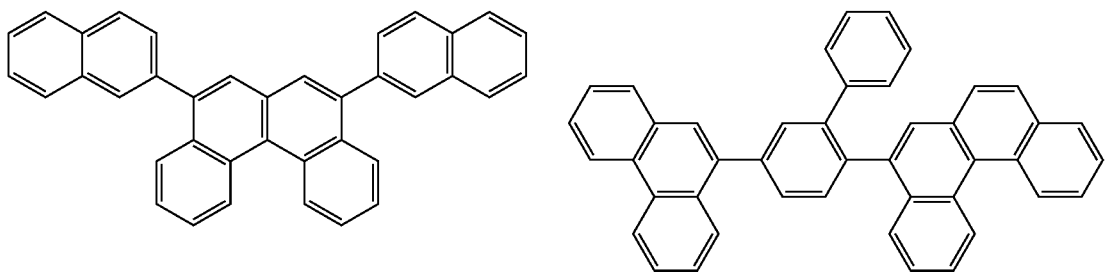

-continued
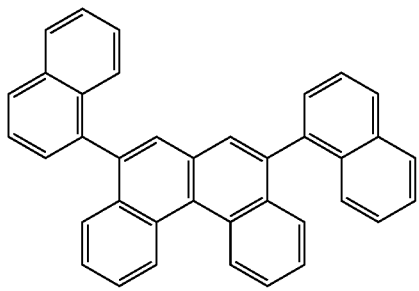

-continued

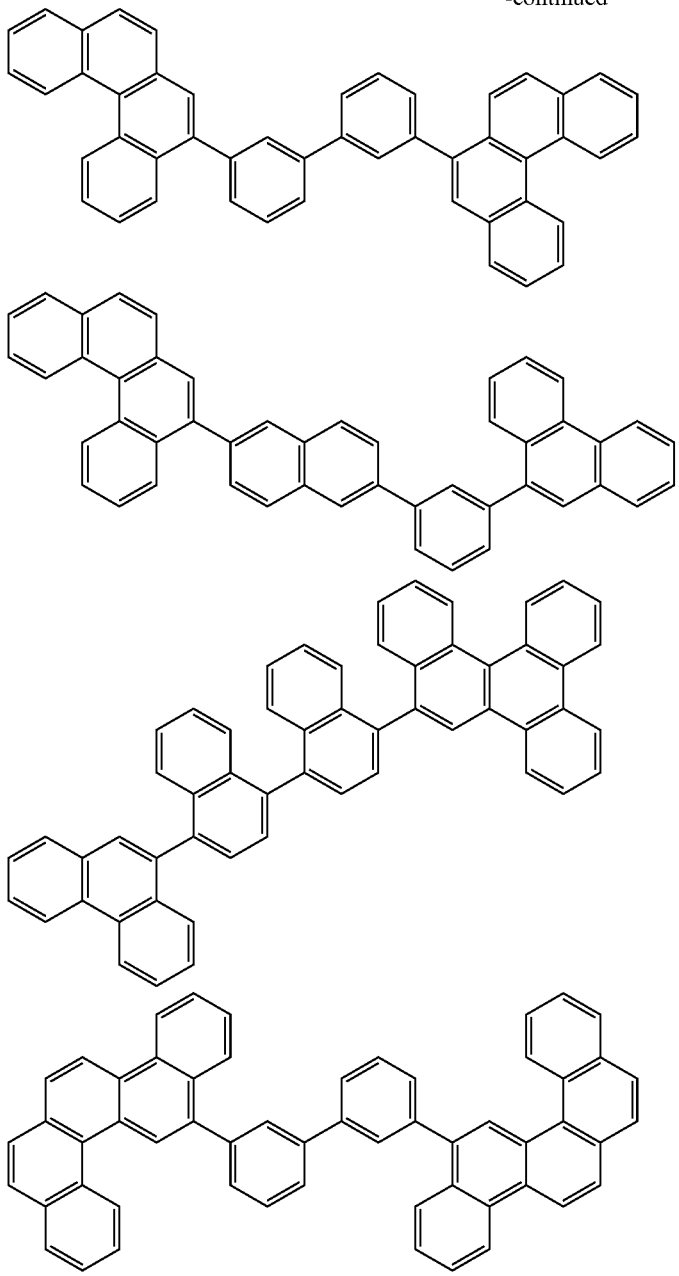

Furthermore, it is preferred that the above-mentioned polycyclic aromatic skeleton part be a compound (benzo[c]chrysene) shown by the following formula (8) or the derivative thereof.

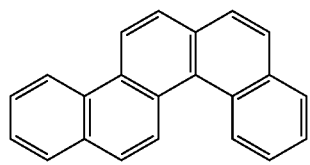

(8)

As the substituent of the chrysene derivative, those exemplified above as the substituent of the benzo[c]chrysene derivative can be given.

As the benzo[c]chrysene derivative, those shown by the following formula (8A) can be given, for example.

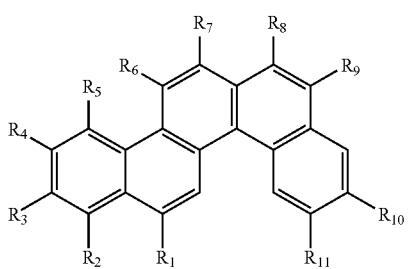

(8A)

In formula (8A), $R_1$ to $R_{11}$ are independently a hydrogen atom or an aryl group having 5 to 30 ring carbon atoms, a branched or linear alkyl group having 1 to 30 carbon atoms, a substituted or unsubstituted cycloalkyl group having 3 to 20 carbon atoms, or a combination thereof.

Specific examples of the benzo[c]chrysene derivative shown by the formula (8A) are given below.

As the substituent of such a compound, the following can be given, for example.

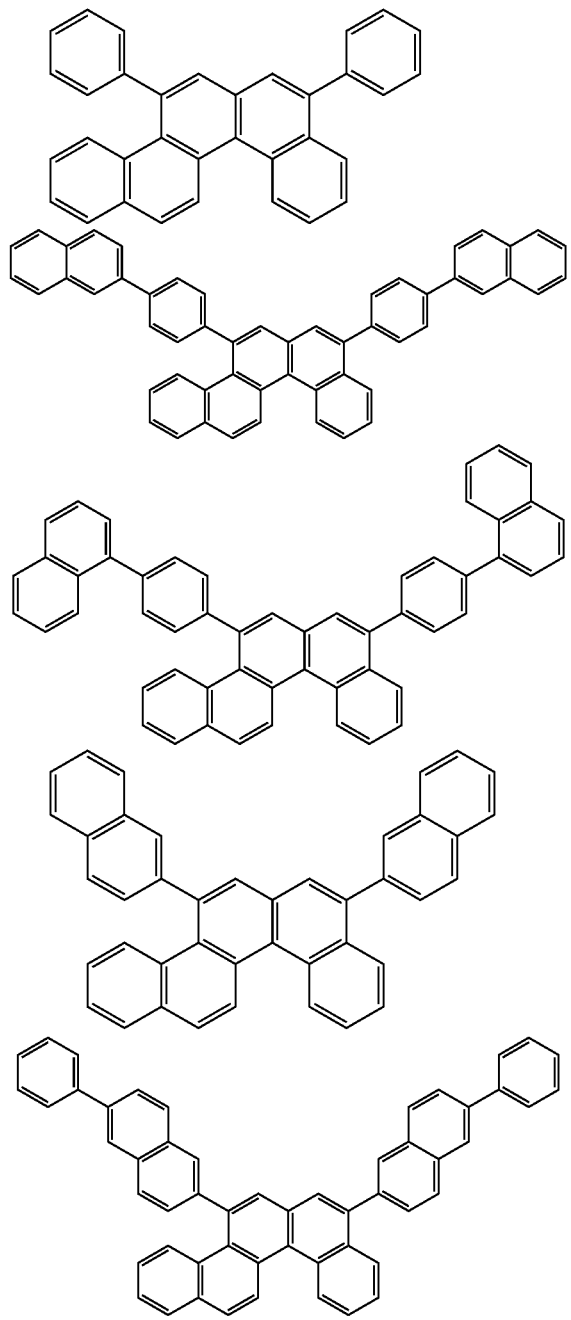

In the invention, it is preferred that the above-mentioned fused aromatic skeleton part be a compound (dibenzo[c,g] phenanthrene) shown by the following formula (9) or the derivative thereof.

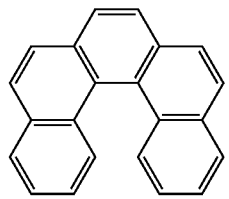

(9)

As the substituent for the dibenzo[c,g]phenanthrene, those exemplified above as the substituent of the phenanthrene derivative can be given.

As the substituent for such a compound, the following can be given, for example.

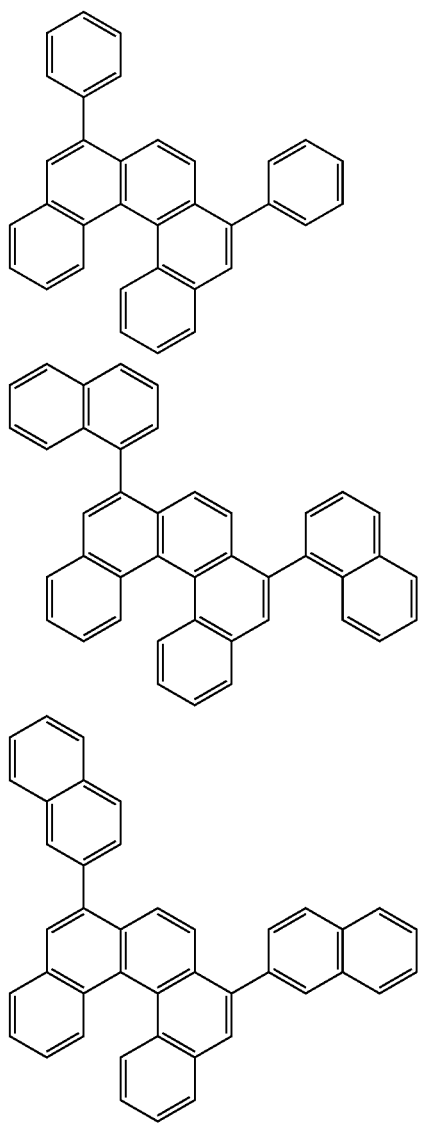

In the invention, it is preferred that the above-mentioned polycyclic fused aromatic skeleton part be fluoranthene shown by the following formula (10) or the derivative thereof.

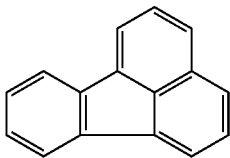

(10)

As the substituent for the fluoranthene derivative, those exemplified above as the substituent of the phenanthrene derivative can be given.

As the fluoranthene derivative, those shown by the following formula (10A) can be given, for example.

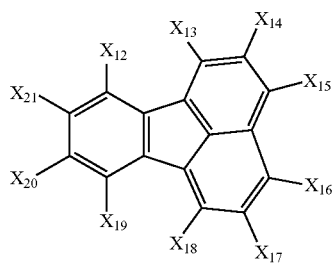

(10A)

In the formula (10A), $X_{12}$ to $X_{21}$ are a hydrogen atom, a halogen atom, a linear, branched or cyclic alkyl group, a linear, branched or cyclic alkoxy group, a substituted or unsubstituted aryl group, or a substituted or unsubstituted heteroaryl group.

As examples of the aryl group, a phenyl group, a naphthyl group or the like can be given. As examples of the heteroaryl group, a thienyl group, a pyridyl group or the like can be given.

$X_{12}$ to $X_{21}$ are preferably a hydrogen atom, a halogen atom (for example, a fluorine atom, a chlorine atom, a bromine atom), a linear, branched or cyclic alkyl group having 1 to 16 carbon atoms (for example, methyl, ethyl, n-propyl, isopropyl, n-butyl, isobutyl, sec-butyl, tert-butyl, n-pentyl, isopentyl, neopentyl, tert-pentyl, cyclopentyl, n-hexyl, 3,3-dimethylbutyl, cyclohexyl, n-heptyl, cyclohexylmethyl, n-octyl, tert-octyl, 2-ethylhexyl, n-nonyl, n-decyl, n-dodecyl, n-tetradecyl, n-hexadecyl or the like), a linear, branched or cyclic alkoxy group having 1 to 16 carbon atoms (for example, methoxy, ethoxy, n-propoxy, isopropoxy, n-butoxy, isobutoxy, sec-butoxy, n-pentyloxy, neopentyloxy, cyclopentyloxy, n-hexyloxy, 3,3-dimethylbutyloxy, cyclohexyoxy, n-heptyloxy, n-octyloxy, 2-ethylhexyoxy, n-nonyloxy, n-decyloxy, n-dodecyloxy, n-tetradecyloxyl, n-hexadecyloxy, or the like), a substituted or unsubstituted aryl group having 4 to 16 carbon atoms (for example, phenyl, 2-methylphenyl, 3-methylphenyl, 4-methylphenyl, 4-ethylphenyl, 4-n-propylphenyl, 4-isopropylphenyl, 4-n-butylphenyl, 4-tert-butylphenyl, 4-isopentylphenyl, 4-tert-pentylphenyl, 4-n-hexylphenyl, 4-cyclohexylphenyl, 4-n-octylphenyl, 4-n-decylphenyl, 2,3-dimethylphenyl, 2,4-dimethylphenyl, 2,5-dimethylphenyl, 3,4-dimethylphenyl, 5-indanyl, 1,2,3,4-tetrahydro-5-naphthyl, 1,2,3,4-tetrahydro-6-naphthyl, 2-methoxyphenyl, 3-methoxyphenyl, 4-methoxyphenyl, 3-ethoxyphenyl, 4-ethoxyphenyl, 4-n-propoxyphenyl, 4-isopropoxyphenyl, 4-n-buthoxyphenyl, 4-n-pentyloxyphenyl, 4-n-hexyloxyphenyl, 4-cyclohexyloxyphenyl, 4-n-hepthyloxyphenyl, 4-n-octyloxyphenyl, 4-n-decyloxyphenyl, 2,3-dimethoxyphenyl, 2,5-dimethoxyphenyl, 3,4-dimethoxyphenyl, 2-methoxy-5-methylphenyl, 3-methyl-4-methoxyphenyl, 2-fluorophenyl, 3-fluorophenyl, 4-fluorophenyl, 2-chlorophenyl, 3-chlorophenyl, 4-chlorophenyl, 4-bromophenyl, 4-trifluoromethylphenyl, 3,4-dichlorophenyl, 2-methyl-4-chlorophenyl, 2-chloro-4-methylphenyl, 3-chloro-4-methylphenyl, 2-chloro-4-methoxyphenyl, 4-phenylphenyl, 3-phenylphenyl, 4-(4'-methylphenyl)phenyl, 4-(4'-methoxyphenyl)phenyl, 1-naphthyl, 2-naphthyl, 4-ethoxy-1-naphthyl, 6-methoxy-2-naphthyl, 7-ethoxy-2-naphthyl or the like), or a substituted or unsubstituted heteroaryl group (2-furyl, 2-thienyl, 3-thienyl, 2-pyridyl, 3-pyridyl, 4-pyridyl or the like). More preferably, $X_{12}$ to $X_{21}$ are a hydrogen atom, a fluorine atom, a chlorine atom, an alkyl group having 1 to 10 carbon atoms, an alkoxy group having 1 to 10 carbon atoms, an aryl group having 6 to 12 carbon atoms or a heteroaryl group having 6 to 12 carbon atoms. Further preferably, $X_{12}$ to $X_{21}$ are a hydrogen atom, a fluorine atom, a chlorine atom, an alkyl group having 1 to 6 carbon atoms, an alkoxy group having 1 to 6 carbon atoms or an aryl group having 6 to 10 carbon atoms.

As specific examples of the fluoranthene derivative shown by the formula (10A), the following can be given.

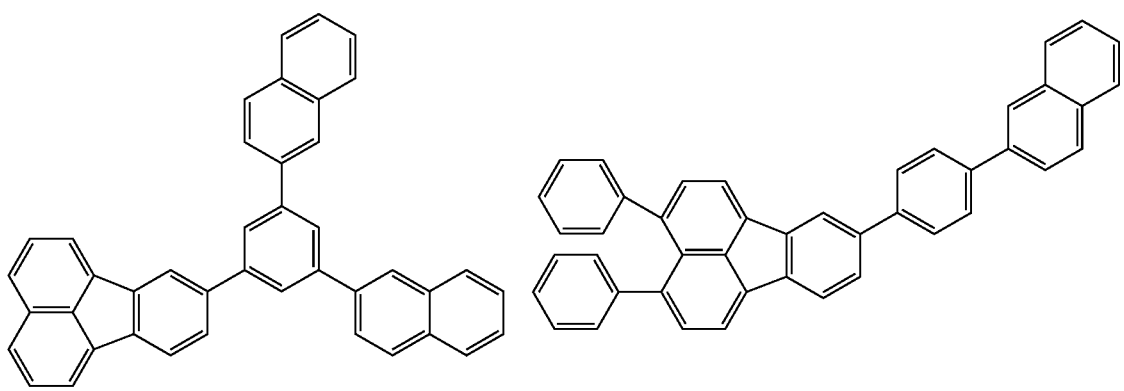

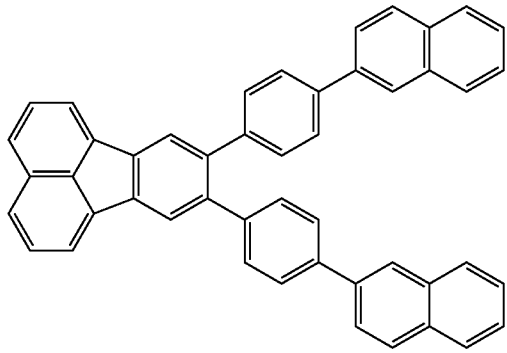
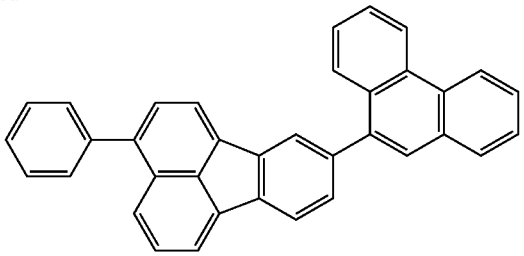
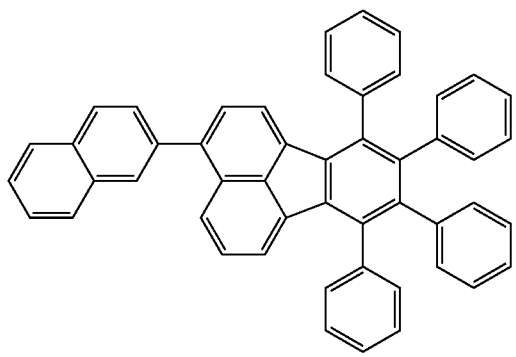
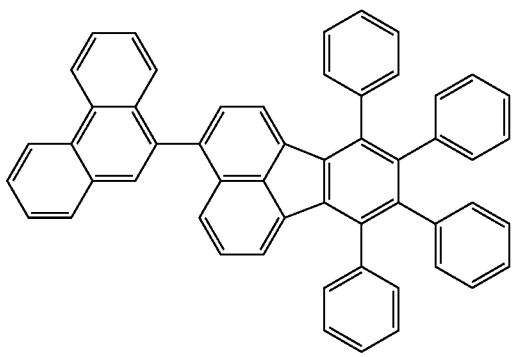
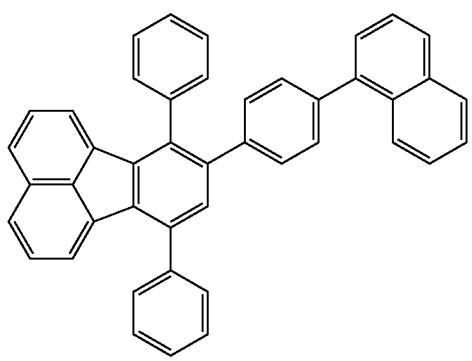
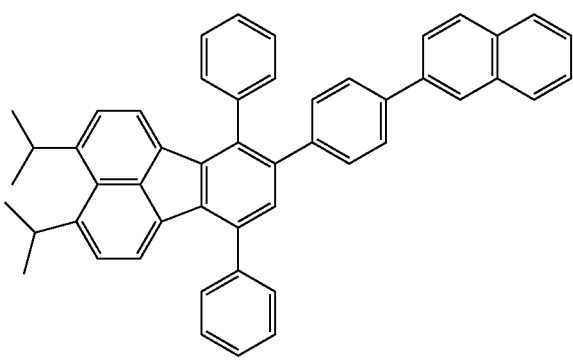
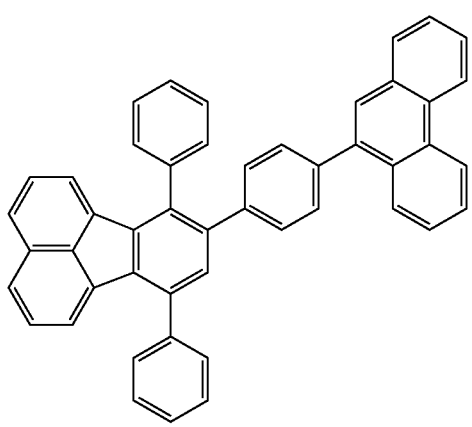
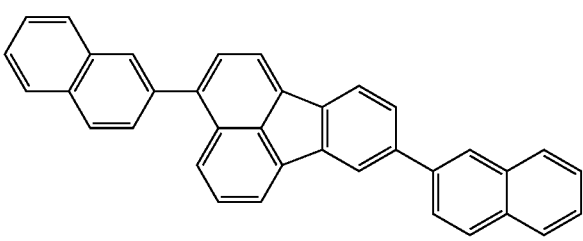

-continued
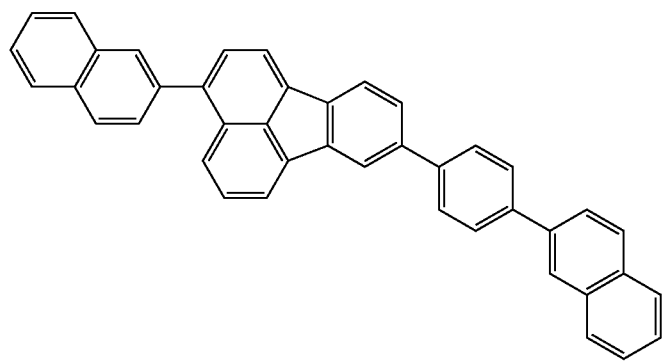
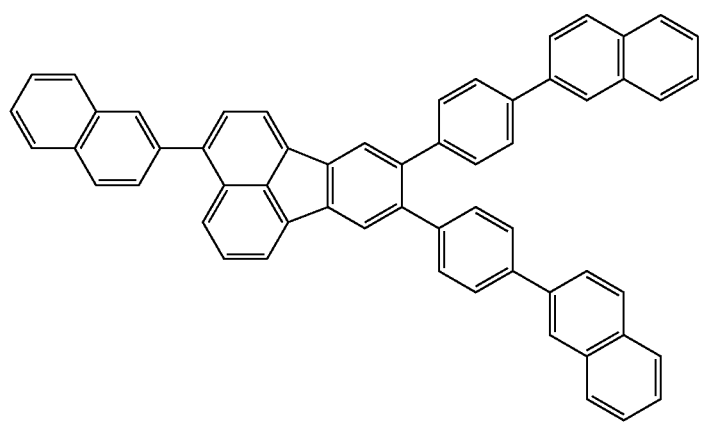
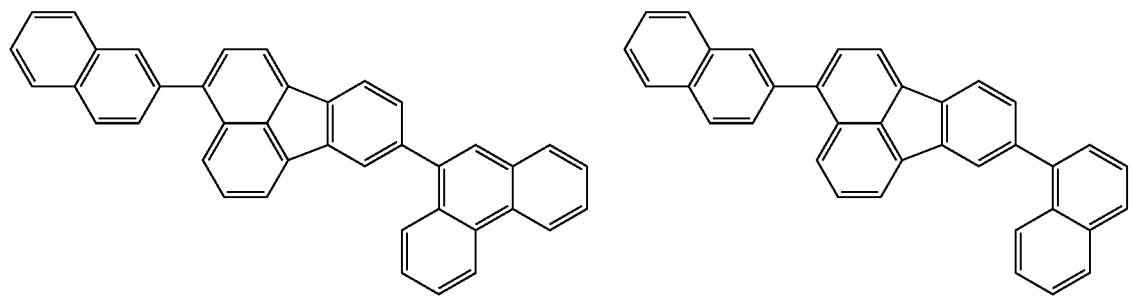
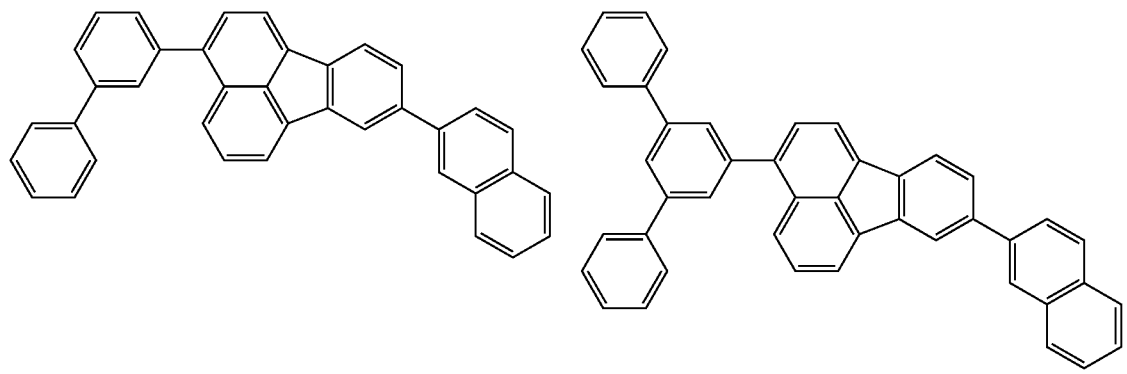

-continued
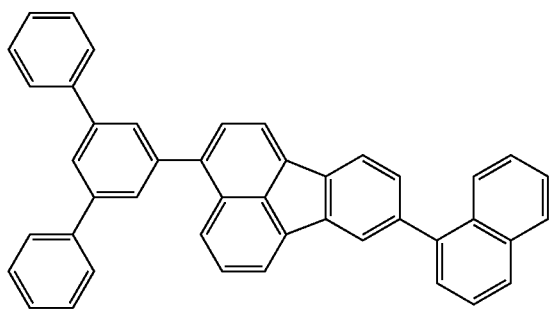
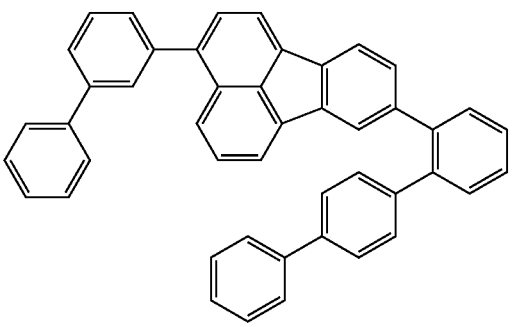
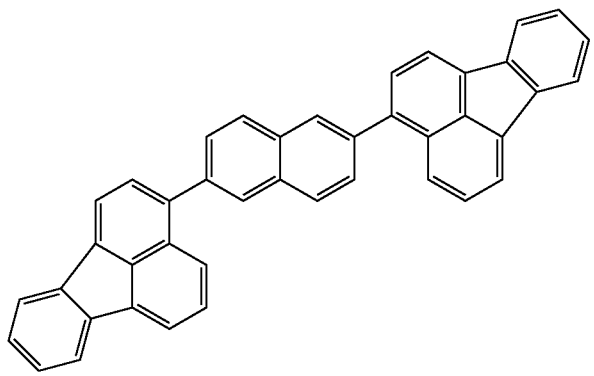
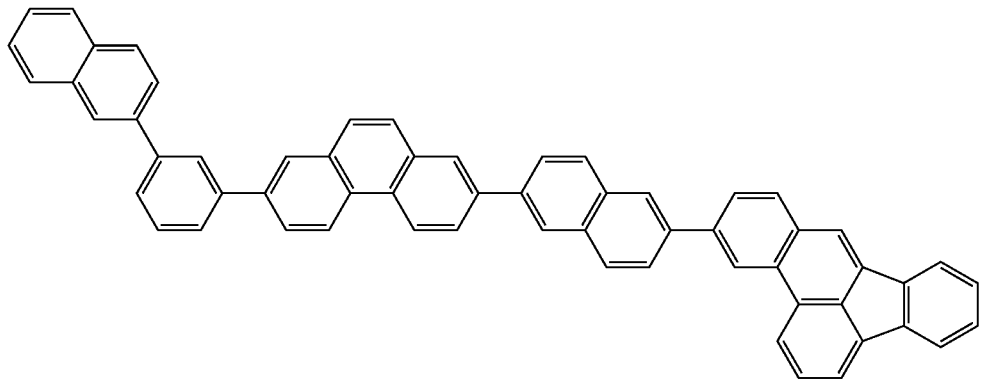
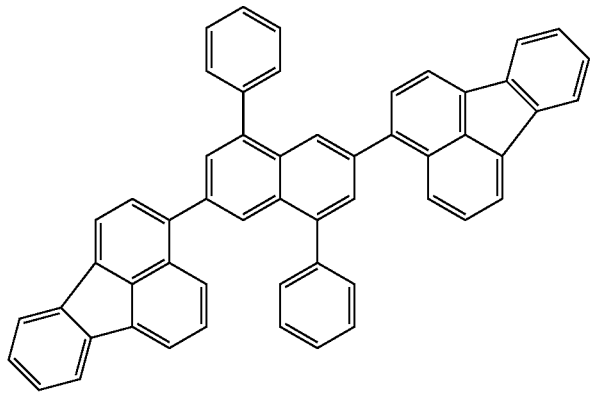

-continued
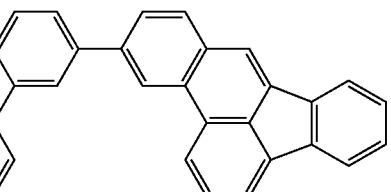
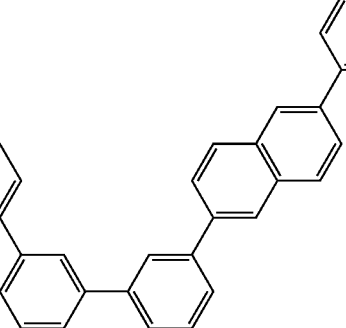
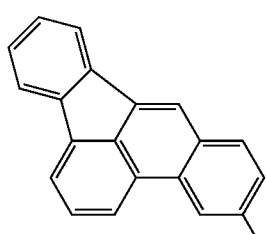
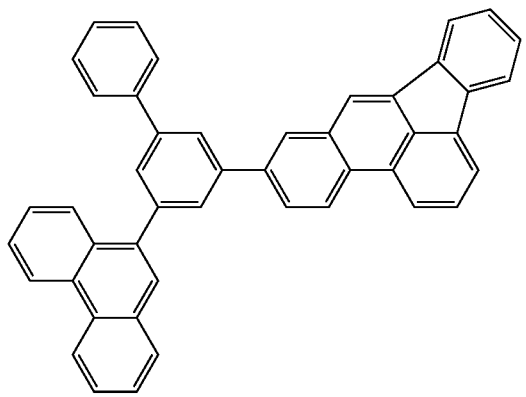
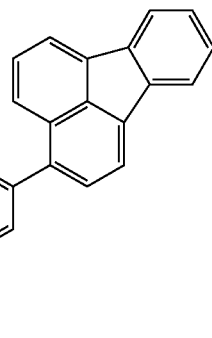
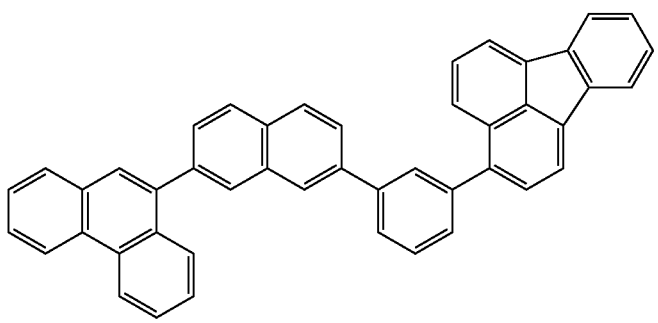
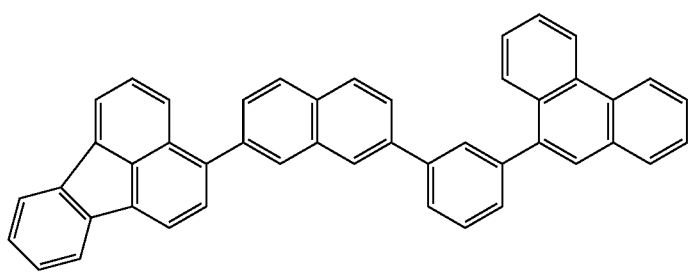

-continued

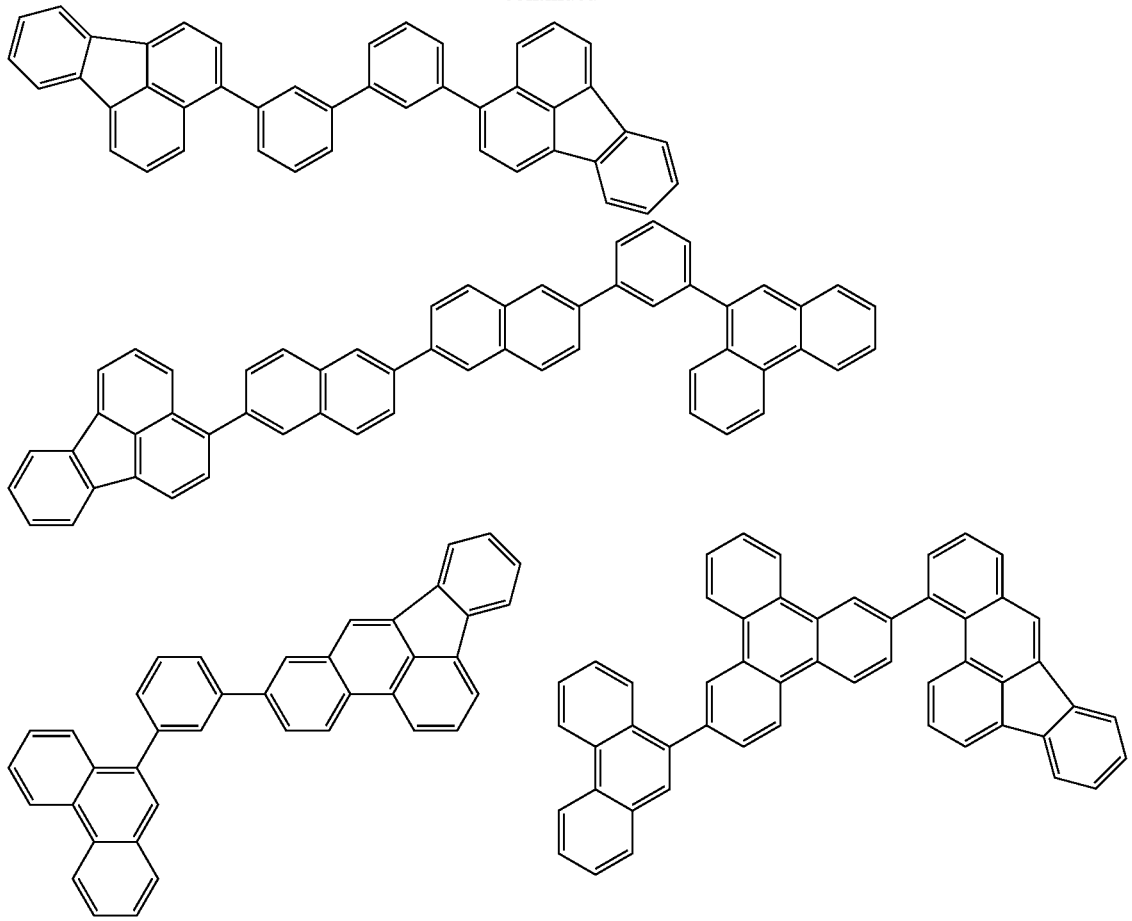

As the substituted or unsubstituted benzofluoranthene, for example, benzo[b]fluoranthene shown by the following formula (101) or the derivative thereof, benzo[k]fluoranthene shown by the following formula (102) or the derivative thereof can be given.

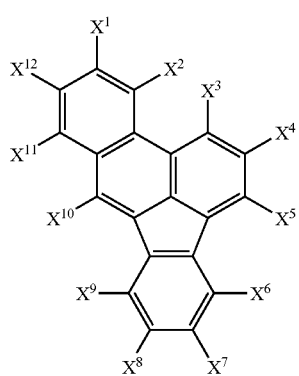

(101)

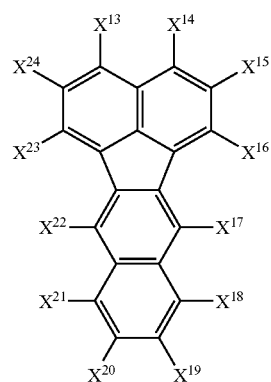

(102)

In the formulas (101) and (102), $X^1$ to $X^{24}$ are a hydrogen atom, a halogen atom, a linear, branched or cyclic alkyl group, a linear, branched or cyclic alkoxy group, a substituted or unsubstituted aryl group or a substituted or unsubstituted heteroaryl group.

Examples of the aryl group include a phenyl group, a naphthyl group or the like can be given. As the heteroaryl group, a furyl group, a thienyl group, a pyridyl group or the like can be given.

$X^1$ to $X^{24}$ are preferably a hydrogen atom, a halogen atom (for example, a fluorine atom, a chlorine atom, and a bromine atom), a linear, branched or cyclic alkyl group having 1 to 16 carbon atoms (for example, a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a cyclopentyl group, a n-hexyl group, a 3,3-dimethylbutyl group, a cyclohexyl group, a n-heptyl group, a cyclohexylmethyl group, a n-octyl group, a tert-octyl group, a 2-ethylhexyl group, a n-nonyl group, a n-decyl group, a n-dodecyl group, a n-tetradecyl group, a n-hexadecyl group, or the like), a linear, branched or cyclic alkoxy group having 1 to 16 carbon atoms (for example, a methoxy group, an ethoxy group, a n-propoxy group, an isopropoxy group, a n-butoxy group, an isobutoxy group, a sec-butoxy group, a n-pentyloxy group, a neopentyloxy group, a cyclopentyloxy group, a n-hexyloxy group, a 3,3-dimethylbutyloxy group, a cyclohexyloxy group, a n-heptyloxy group, a n-octyloxy group, a 2-ethylhexyloxy group, a n-nonyloxyl group, a n-decyloxy group, a n-dodecyloxy group, a n-tetradecyloxy group, a n-hexadecyloxy group or the like), a substituted or unsubstituted aryl group having 4 to 16 carbon atoms (for example, a phenyl group, a 2-methylphenyl group, a 3-methylphenyl group, a 4-methylphenyl group, a 4-ethylphenyl group, a 4-n-propylphenyl group, a 4-isopropylphenyl group, a 4-n-butylphenyl group, a 4-tert-butylphenyl group, a 4-isopentylphenyl group, a 4-tert-pentylphenyl group, a 4-n-hexylphenyl group, a 4-cyclohexylphenyl group, a 4-n-octylphenyl group, a 4-n-decylphenyl group, a 2,3-dimethylphenyl group, a 2,4-dimethylphenyl group, a 2,5-dimethylphenyl group, a 3,4-dimethylphenyl group, a 5-indanyl group, a 1,2,3,4-tetrahydro-5-naphthyl group, a 1,2,3,4-tetrahydro-6-naphthyl group, a 2-methoxyphenyl group, a 3-methoxyphenyl group, a 4-methoxyphenyl group, a 3-ethoxyphenyl group, a 4-ethoxyphenyl group, a 4-n-propoxyphenyl group, a 4-isopropoxyphenyl group, a 4-n-butoxyphenyl group, a 4-n-pentyloxyphenyl group, a 4-n-hexyloxyphenyl group, a 4-cyclohexylphenyl group, a 4-n-hepthyloxyphenyl group, a 4-n-octyloxyphenyl group, a 4-n-decyloxyphenyl group, a 2,3-dimethoxyphenyl group, a 2,5-dimethoxyphenyl group, a 3,4-dimethoxyphenyl group, a 2-methoxy-5-methylphenyl group, a 3-methyl-4-methoxyphenyl group, a 2-fluorophenyl group, a 3-fluorophenyl group, a 4-fluorophenyl group, a 2-chlorophenyl group, a 3-chlorophenyl group, a 4-chlorophenyl group, a 4-bromophenyl group, a 4-trifluoromethylphenyl group, a 3,4-dichlorophenyl group, a 2-methyl-4-chlorophenyl group, a 2-chloro-4-methylphenyl group, a 3-chloro-4-methylphenyl group, a 2-chloro-4-methoxyphenyl group, a 4-phenylphenyl group, a 3-phenylphenyl group, a 4-(4'-methylphenyl)phenyl group, a 4-(4'-methoxyphenyl) phenyl group, a 1-naphthyl group, a 2-naphthyl group, a 4-ethoxy-1-naphthyl group, a 6-methoxy-2-naphthyl group, a 7-ethoxy-2-naphthyl group), or a substituted or unsubstituted heteroaryl group (a 2-furyl group, a 2-thienyl group, a 3-thienyl group, a 2-pyridyl group, a 3-pyridyl group, a 4-pyridyl group, or the like). More preferably, $X^1$ to $X^{24}$ are a hydrogen atom, a fluorine atom, a chlorine atom, an alkyl group having 1 to 10 carbon atoms, an alkoxy group having 1 to 10 carbon atoms or an aryl group having 6 to 12 carbon atoms. Further preferably, $X^1$ to $X^{24}$ are a hydrogen atom, a fluorine atom, a chlorine atom, an alkyl group having 1 to 6 carbon atoms, an alkoxy group having 1 to 6 carbon atoms or an aryl group having 6 to 10 carbon atoms.

As the benzo[b]fluoranthene derivative shown by the formula (101), the following can be given, for example.

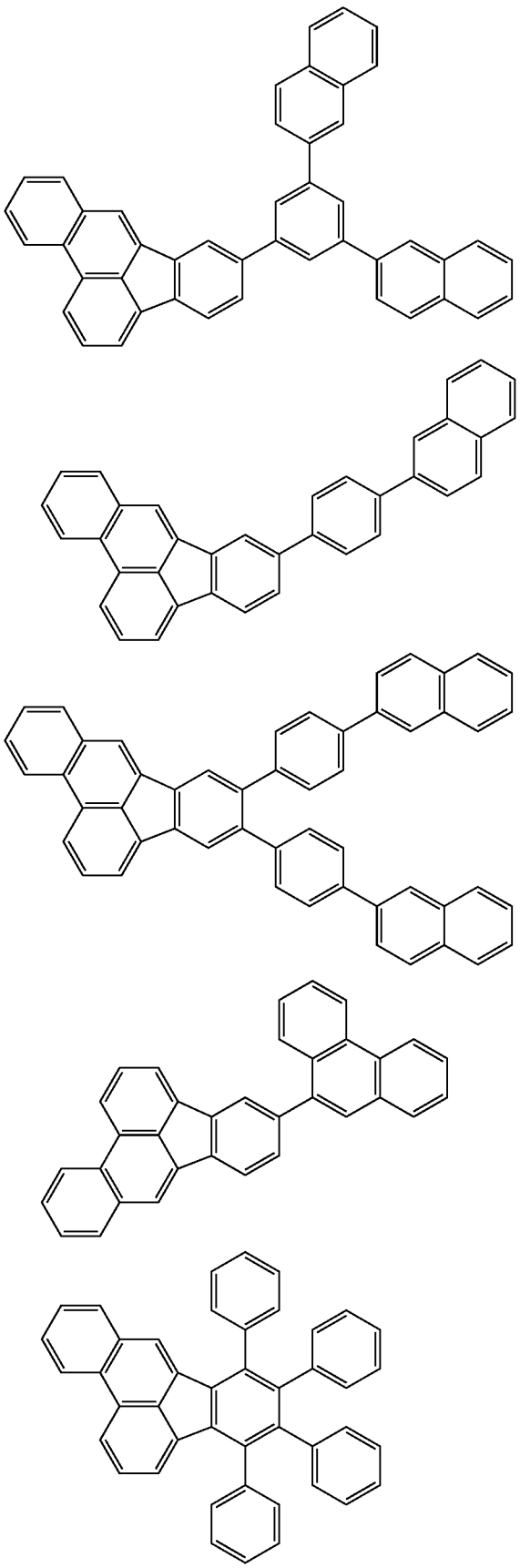

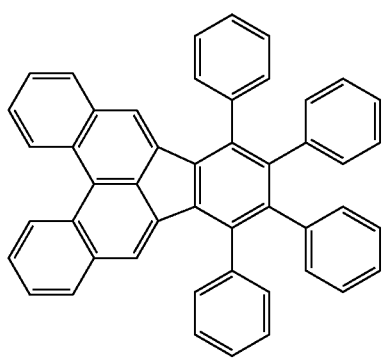
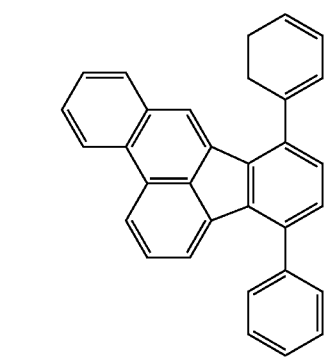 [SMILES: C1=CCCC(c2ccc(-c3ccccc3)c3c2-c2cc4ccccc4c4cccc-3c24)=C1]
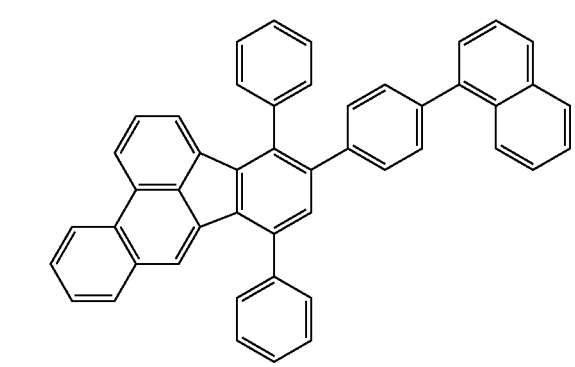
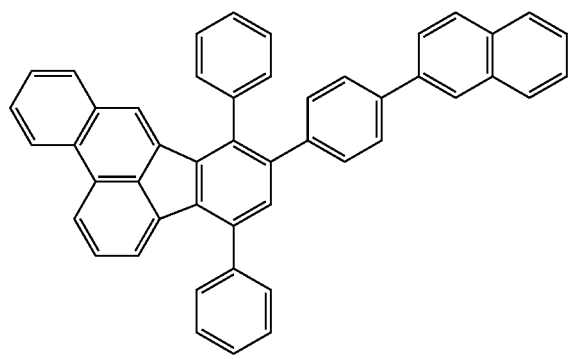
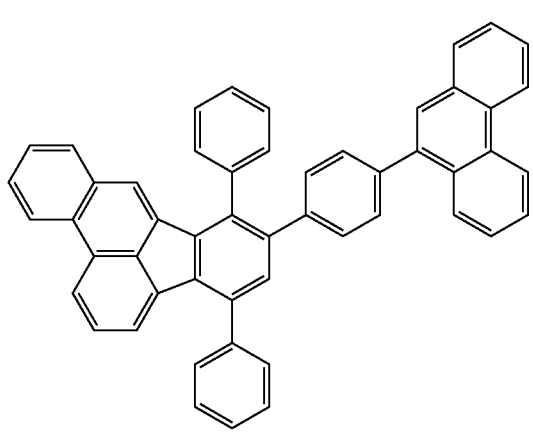
As the benzo[k]fluoranthene derivative shown by the formula (102), the following can be given, for example.
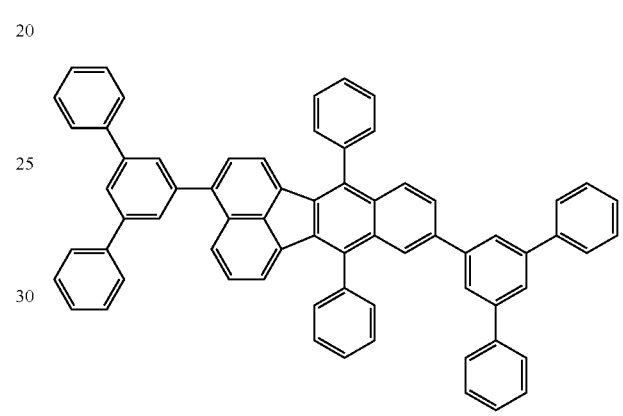
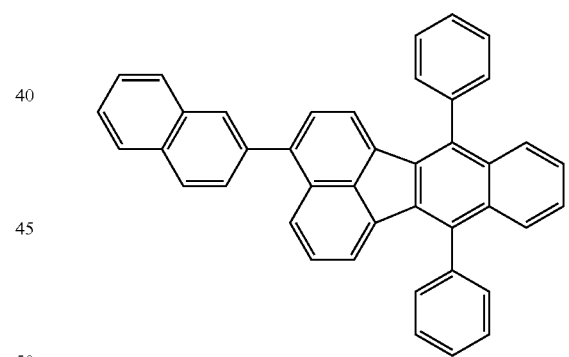
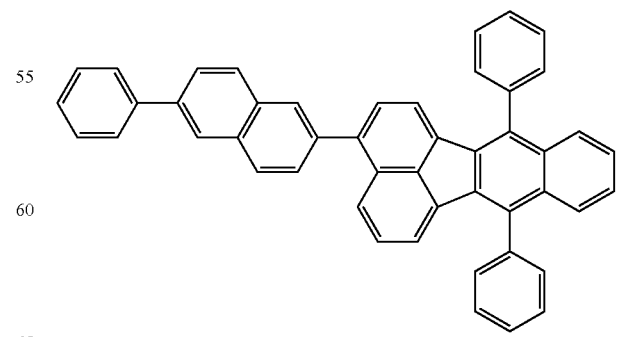

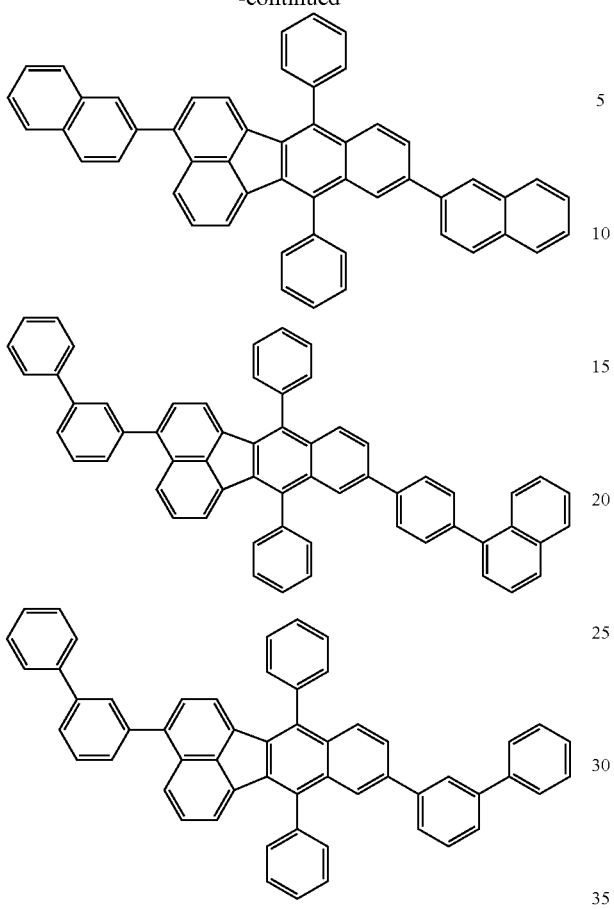

Furthermore, it is preferred that the above-mentioned polycyclic fused aromatic skeleton part be triphenylene shown by the following formula (11) or the derivative thereof.

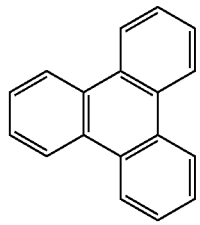

(11)

As the substituent for the triphenylene derivative, those exemplified above as the substituent of the phenantherene derivative can be given.

As the triphenylene derivative, those shown by the following formula (11A) can be given, for example.

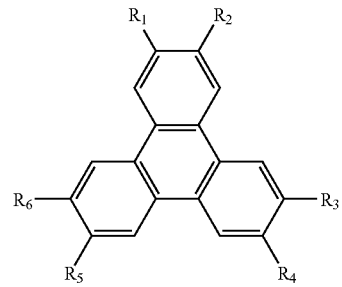

(11A)

In the formula (11A), $R_1$ to $R_6$ are independently a hydrogen atom or a substituted or unsubstituted aryl group having 5 to 30 ring carbon atoms, a branched or linear alkyl group having 1 to 30 carbon atoms, a branched or linear alkenyl group having 2 to 30 carbon atoms, a substituted or unsubstituted cycloalkyl group having 3 to 20 carbon atoms or a combination thereof.

Specific examples of the triphenylene derivative shown by the formula (11A) are given below.

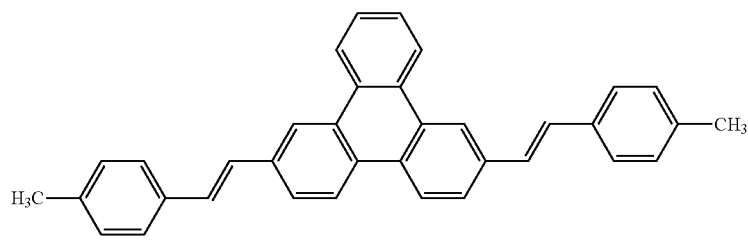

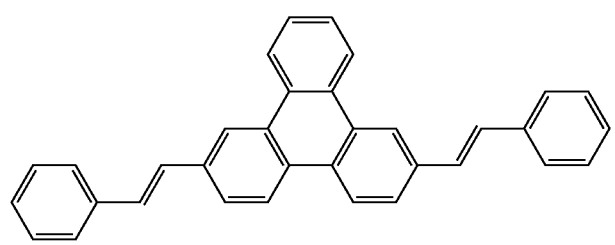

-continued
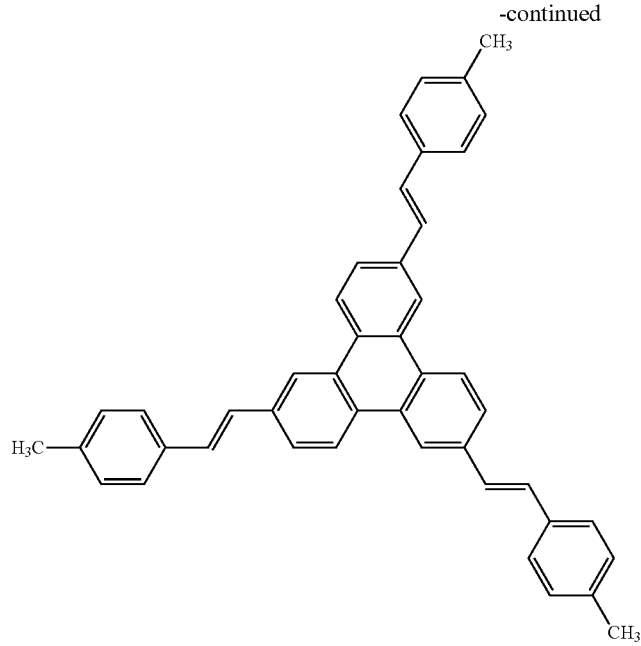
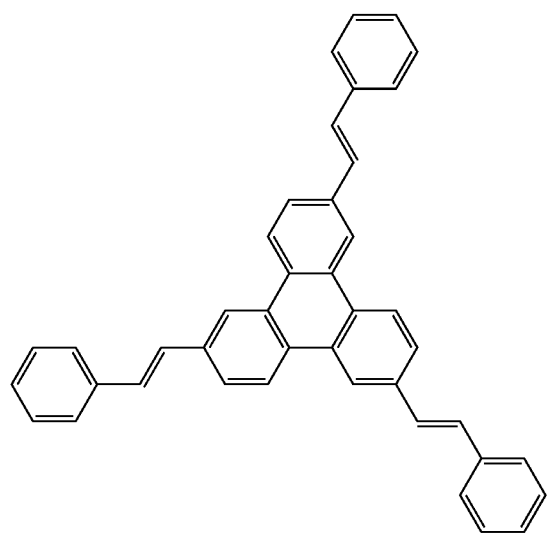
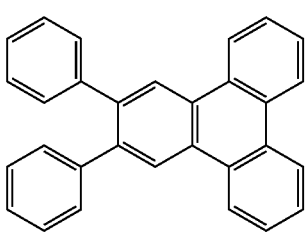
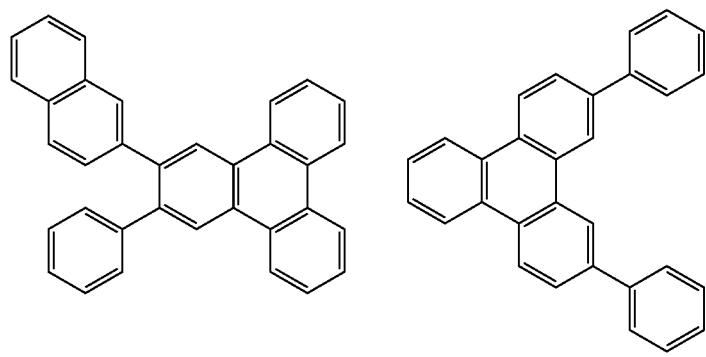

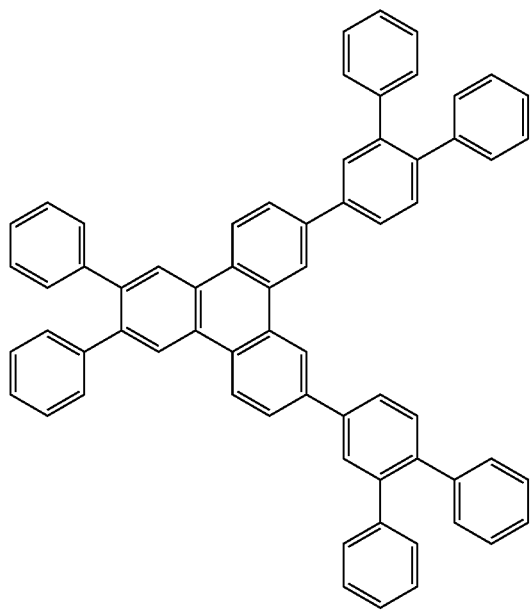
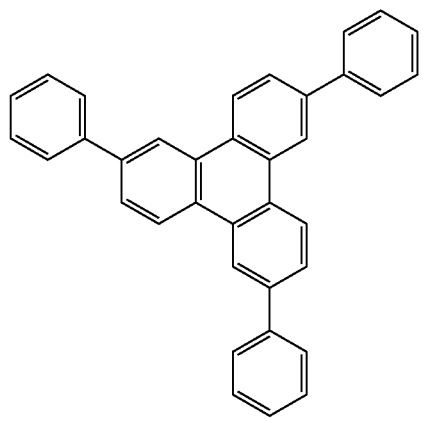
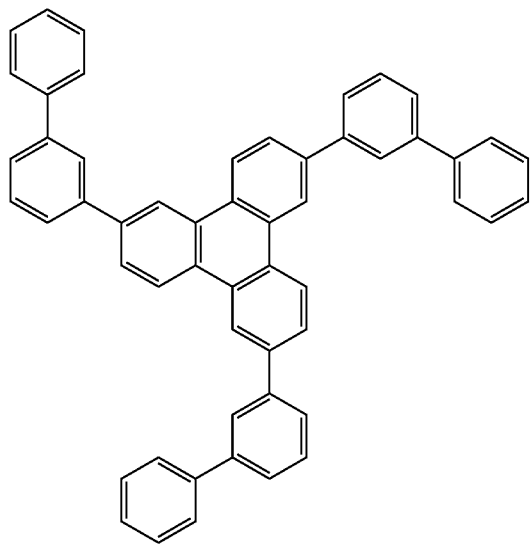
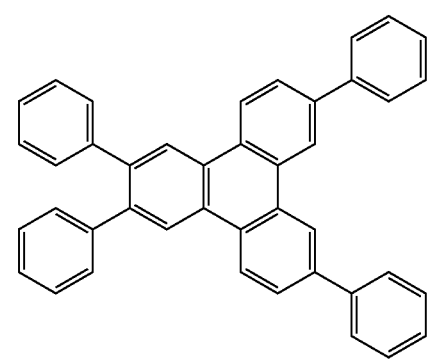
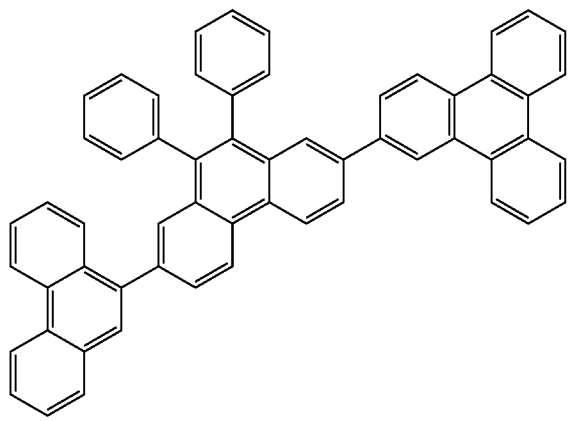
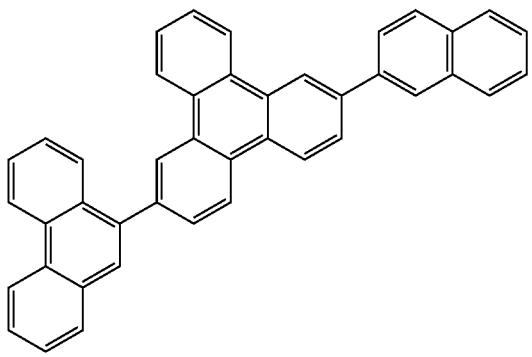

-continued
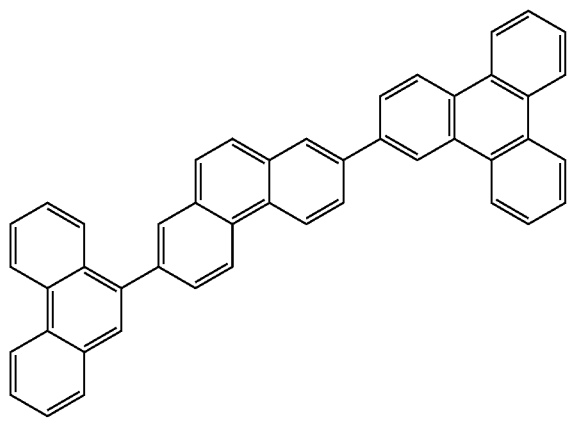

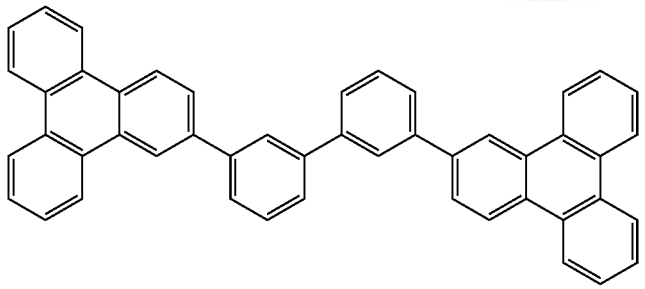
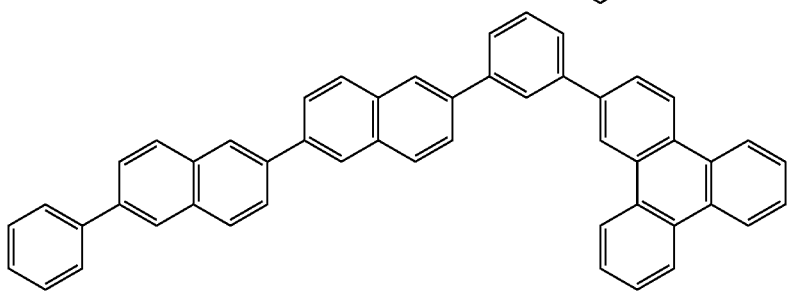
The polycyclic fused aromatic skeleton part may contain a nitrogen atom. The polycyclic fused aromatic skeleton part may be the following.
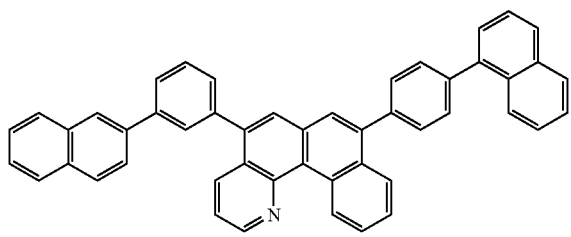
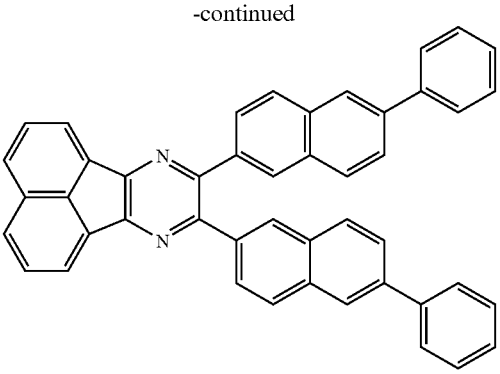
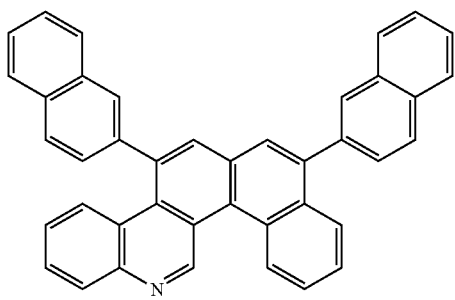
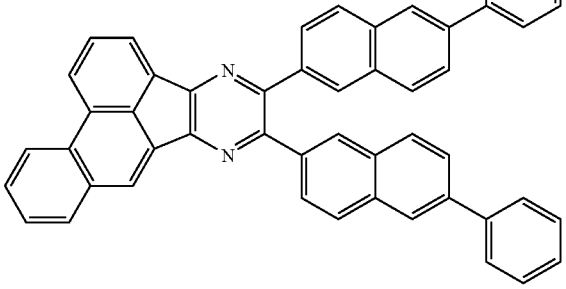
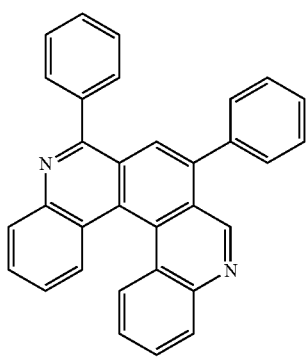
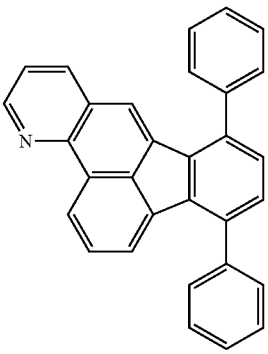 [SMILES: c1ccc(-c2ccc(-c3ccccc3)c3c2-c2cccc4c2c-3cc2cccnc24)cc1]

The heterocycle-containing compound is preferably shown by the following formula (5) or (6).

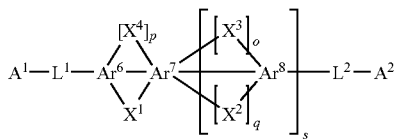
(5)

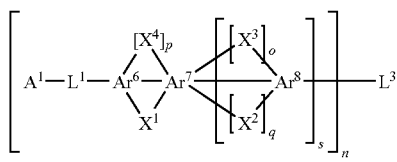
(6)

In the formulas (5) and (6), $Ar^6$, $Ar^7$ and $Ar^8$ are independently a substituted or unsubstituted aromatic hydrocarbon group having 6 to 24 ring carbon atoms or a substituted or unsubstituted aromatic heterocyclic group having 3 to 24 atoms that form a ring (hereinafter referred to as "ring atoms"); $Ar^6$, $Ar^7$ and $Ar^8$ may have one or a plurality of substituent Y, and when plural, Ys may differ from each other and are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, an aromatic hydrocarbon group having 6 to 24 ring carbon atoms or a substituted or unsubstituted aromatic heterocycle group having 3 to 24 ring atoms which bonds to $Ar^6$, $Ar^7$ and $Ar^8$ with a carbon-carbon ring.

In the formulas (5) and (6), $X^1$, $X^2$, $X^3$ and $X^4$ are independently O, S, N—$R^1$ or $Cr^2R^3$, o, p and q are 0 or 1, and s is 1, 2 or 3. Here, $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atom, a substituted or unsubstituted aromatic hydrocarbon group having 6 to 24 ring carbon atoms, or a substituted or unsubstituted aromatic heterocyclic group having 3 to 24 ring atoms.

In the formulas (5) and (6), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a divalent aromatic hydrocarbon group having 6 to 24 ring carbon atoms, or a substituted or unsubstituted divalent aromatic heterocyclic group having 3 to 24 ring atoms which bonds to $Ar^6$ with a carbon-carbon bond.

In the formula (5), $L^2$ is a single bond, an alkylene group having 1 to 20 carbon atoms, a substituted or unsubstituted divalent aromatic hydrocarbon group having 3 to 20 ring carbon atoms, a divalent silyl group having 2 to 20 carbon atoms, a substituted or unsubstituted cycloalkylene group having 6 to 24 ring carbon atoms, or a substituted or unsubstituted divalent aromatic heterocyclic group having 3 to 24 ring atoms which bonds to $Ar^8$ with a carbon-carbon bond.

In the formula (6), n is 2, 3 or 4 which independently forms a dimmer, a trimer or a tetramer with $L^3$ being a linkage group.

In the formula (6), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon atom having 6 to 24 ring carbon atoms, or a substituted or unsubstituted divalent aromatic heterocyclic group having 3 to 24 ring atoms which bonds to $Ar^8$ with a carbon-carbon bond, when n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms, or a substituted or unsubstituted trivalent aromatic heterocyclic group having 3 to 24 ring atoms which bonds to $Ar^8$ with a carbon-carbon bond, and when n is 4, a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms, or a substituted or unsubstituted tetravalent aromatic heterocyclic group having 3 to 24 ring atoms which bonds to $Ar^8$ with a carbon-carbon bond.

In the formulas (5) and (6), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms which bonds to $L^1$ with a carbon-carbon bond.

In formula (5), $A^2$ is a hydrogen atoms, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms and bonds to $L^2$ with a carbon-carbon bond.

The material shown by the formula (5) is preferably any one of those shown by the following formulas (10) to (13), (17), (19) and (21). The material shown by the formula (6) is preferably any one of those shown by the following formulas (9), (14) to (16), (18), (20) and (22).

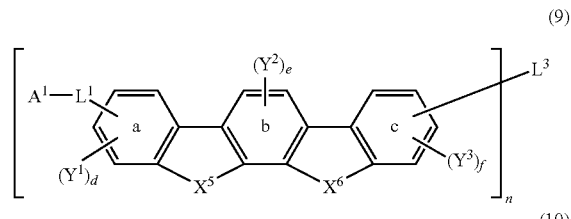
(9)

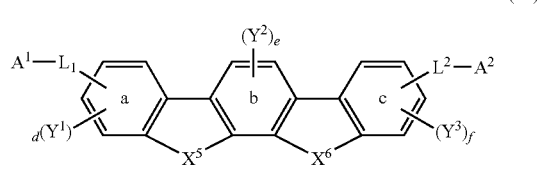
(10)

In the formulas (9) and (10), $X^5$ and $X^6$ are independently O, S, N—$R^1$ or $CR^2R^3$. Here, $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms.

In the formulas (9) and (10), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to the benzene ring a with a carbon-carbon bond.

In the formula (9), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c with a carbon-carbon bond.

In the formula (10), n is 2, 3 or 4 which independently forms a dimmer, a trimer or a tetramer with $L^3$ being a linkage group.

In the formula (10), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon atom having 6 to 24 ring carbon atoms, or a substituted or unsubstituted divalent aromatic heterocyclic group having 3 to 24 ring atoms which bonds to the benzene ring c with a carbon-carbon bond, when n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms, or a substituted or unsubstituted trivalent aromatic heterocyclic group having 3 to 24 atoms which bonds to the benzene ring c with a carbon-carbon bond, and when n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms, or a substituted or unsubstituted tetravalent aromatic heterocyclic group having 3 to 24 ring atoms which bonds to the benzene ring c with a carbon-carbon bond.

In the formulas (9) and (10), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms which bonds to $L^1$ with a carbon-carbon bond.

In the formula (9), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^2$ with a carbon-carbon bond.

In the formulas (9) and (10), $Y^1$, $Y^2$ and $Y^3$ are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms which bonds to benzene rings a, b and c with a carbon-carbon bond, d and f are 0, 1, 2 or 3, and e is 0, 1 or 2.

In the formulas (9) and (10), $A^1$, $A^2$, $L^1$, $L^2$ and $L^3$ do not include a carbonyl group.

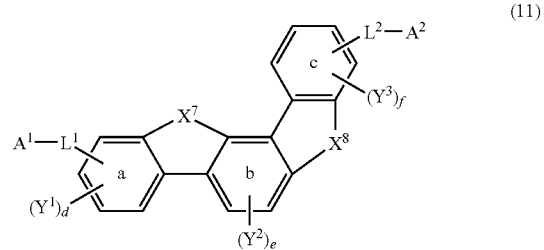

(11)

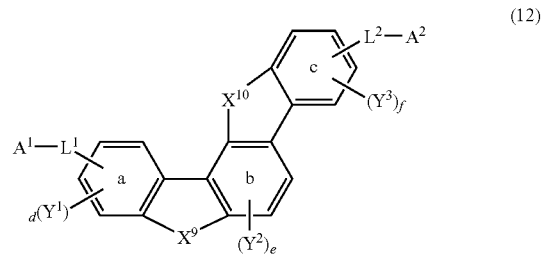

(12)

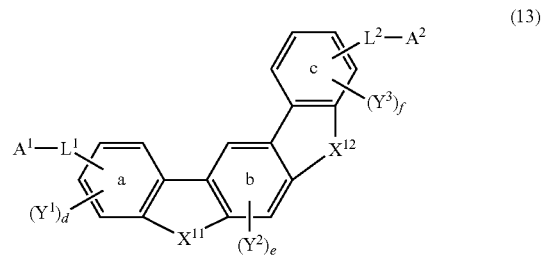

(13)

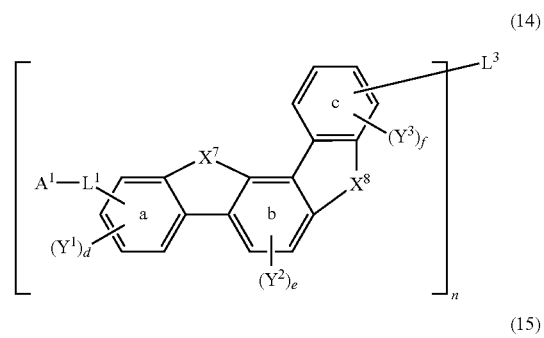

(14)

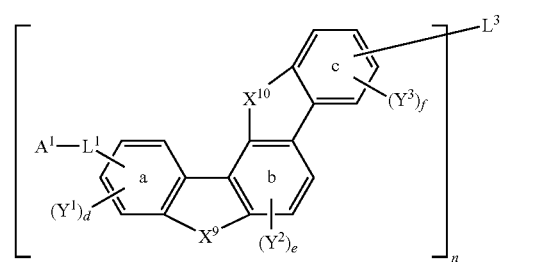

(15)

-continued

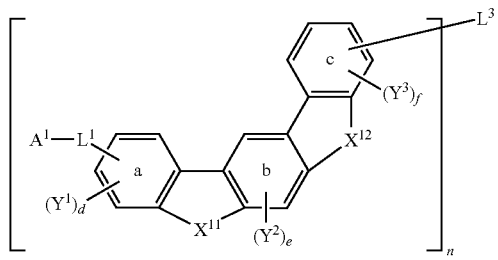
(16)

In the formulas (11) to (16), $X^7$, $X^8$, $X^9$, $X^{10}$, $X^{11}$ and $X^{12}$ are independently O, S, N—$R^1$ or $CR^2R^3$.

In the formulas (11) to (16), $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms.

In the formulas (11) to (16), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to the benzene ring a with a carbon-carbon bond.

In the formulas (11) to (13), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to the benzene ring c with a carbon-carbon bond.

In the formulas (14) to (16), n is 2, 3 or 4 which independently forms a dimmer, a trimer or a tetramer with $L^3$ being a linkage group.

In the formulas (14) to (16), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon atom having 6 to 24 ring carbon atoms, or a substituted or unsubstituted divalent aromatic heterocyclic group having 3 to 24 ring atoms which bonds to the benzene ring c with a carbon-carbon bond, when n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms, or a substituted or unsubstituted trivalent aromatic heterocyclic group having 3 to 24 atoms which bonds to the benzene ring c with a carbon-carbon bond, and when n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms, or a substituted or unsubstituted tetravalent aromatic heterocyclic group having 3 to 24 ring atoms which bonds to the benzene ring c with a carbon-carbon bond.

In the formulas (11) to (16), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^1$ with a carbon-carbon bond.

In the formulas (11) to (13), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or an aromatic heterocyclic group having 3 to 24 ring atoms which bond to $L^2$ with a carbon-carbon bond.

In the formulas (11) to (16), $Y^1$, $Y^2$ and $Y^3$ are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms which bonds to the benzene rings a, b and c with a carbon-carbon bond, d and f are 0, 1, 2, or 3, and e is 0, 1 or 2.

In the formulas (11) to (16), $A^1$, $A^2$, $L^1$, $L^2$ and $L^3$ do not include a carbonyl group.

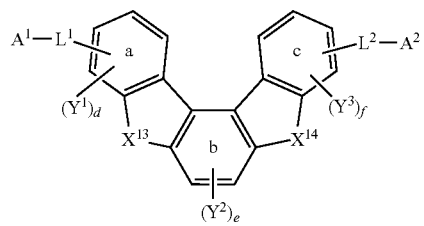
(17)

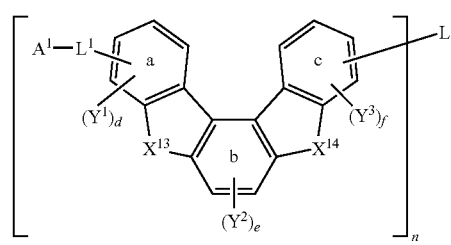
(18)

In the formulas (17) and (18), $X^{13}$ and $X^{14}$ are independently O, S, N—$R^1$ or $CR^2R^3$. Here, $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms.

In the formulas (17) and (18), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to the benzene ring a with a carbon-carbon bond.

In the formula (17), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted mono- or divalent aromatic heterocyclic group having 3 to 24 ring atoms which bonds to the benzene ring c with a carbon-carbon bond.

In the formula (18), n is 2, 3 or 4 which independently forms a dimmer, a trimer or a tetramer with $L^3$ being a linkage group.

In the formula (18), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to the benzene ring c with a carbon-carbon bond, when n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms, or a substituted or unsubstituted trivalent aromatic heterocyclic group having 3 to 24 atoms which bonds to the benzene ring c with a carbon-carbon bond, and when n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms, or a substituted or unsubstituted tetravalent aromatic heterocyclic group having 3 to 24 ring atoms which bond to the benzene ring c with a carbon-carbon bond.

In the formulas (17) and (18), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^1$ with a carbon-carbon bond.

In the formula (17), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^2$ with a carbon-carbon bond.

In the formulas (17) and (18), $Y^1$, $Y^2$ and $Y^3$ are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms which bonds to the benzene rings a, b and c with a carbon-carbon bond, d and f are 0, 1, 2 or 3, and e is 0, 1 or 2.

In the formulas (17) and (18), $A^1$, $A^2$, $L^1$, $L^2$ and $L^3$ do not include a carbonyl group.

It is preferred that the compound shown by the above formula (9) or (10) be a benzofuranodibenzofuran derivative shown by the following formula (19) or (20).

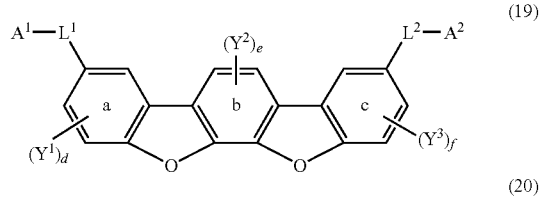

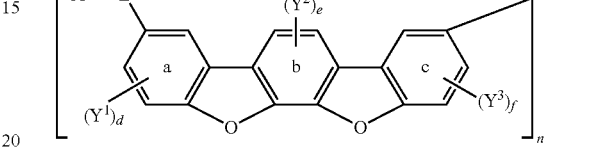

In the formulas (19) and (20), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring a with a carbon-carbon bond.

In the formula (19), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to the benzene ring c with a carbon-carbon bond.

In the formula (19), n is 2, 3 or 4 which independently forms a dimmer, a trimer or a tetramer with $L^3$ being a linkage group.

In the formula (20), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon atom having 6 to 24 ring carbon atoms, or a substituted or unsubstituted divalent aromatic heterocyclic group having 3 to 24 ring atoms which bonds to the benzene ring c with a carbon-carbon bond, when n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms, or a substituted or unsubstituted trivalent aromatic heterocyclic group having 3 to 24 atoms which bonds to the benzene ring c with a carbon-carbon bond, and when n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms, or a substituted or unsubstituted tetravalent aromatic heterocyclic group having 3 to 24 ring atoms which bonds to the benzene ring c with a carbon-carbon bond.

In formulas (19) and (20), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L_1$ with a carbon-carbon bond.

In the formula (18), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L_2$ with a carbon-carbon bond.

In the formulas (19) and (20), $Y^1$, $Y^2$ and $Y^3$ are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms which bonds to the benzene rings a, b and c with a carbon-carbon bond, d and f are 0, 1, 2 or 3, and e is 0, 1 or 2.

In the formulas (19) and (20), $A^1$, $A^2$, $L^1$, $L^2$ and $L^3$ do not include a carbonyl group.

It is preferred that the compound shown by the above formula (13) or (16) be a benzofuranodibenzofuran derivative shown by the following formula (21) or (22).

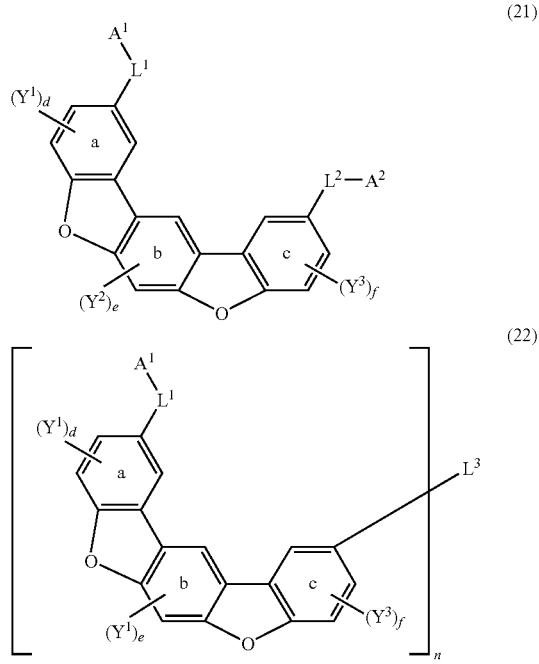

In the formulas (21) and (22), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to the benzene ring a with a carbon-carbon bond.

In the formula (21), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to a benzene ring c with a carbon-carbon bond.

In the formula (22), n is 2, 3 or 4 which independently forms a dimmer, a trimer or a tetramer with $L^3$ being a linkage group.

In the formula (22), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms, or a substituted or unsubstituted divalent aromatic heterocyclic group having 3 to 24 ring atoms which bonds to the benzene ring c with a carbon-carbon bond, when n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms, or a substituted or unsubstituted trivalent aromatic heterocyclic group having 3 to 24 atoms which bonds to the benzene ring c with a carbon-carbon bond, and when n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms, or a substituted or unsubstituted tetravalent aromatic heterocyclic group having 3 to 24 ring atoms which bonds to the benzene ring c with a carbon-carbon bond.

In the formulas (21) and (22), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^1$ with a carbon-carbon bond.

In the formula (21), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^2$ with a carbon-carbon bond.

In the formulas (21) and (22), $Y^1$, $Y^2$ and $Y^3$ are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms which bonds to the benzene rings a, b and c with a carbon-carbon bond, d and f are 0, 1, 2 or 3, and e is 0, 1 or 2.

In the formulas (21) and (22), $A^1$, $A^2$, $L^1$, $L^2$ and $L^3$ do not include a carbonyl group.

In the formulas (5) to (22), specific examples of each group will be given below.

As the substituted or unsubstituted aromatic hydrocarbon group having 6 to 24 ring carbon atoms shown by $Ar^6$ to $Ar^8$, Y, $Y^1$ to $Y^3$, $R^1$ to $R^3$, $L^1$ to $L^3$ and $A^1$ to $A^2$, residues with a corresponding valency such as substituted or unsubstituted benzene, naphthalene, biphenyl, terphenyl, fluorene, phenanthrene, triphenylene, perylene, chrysene, fluoranthene, benzofluorene, benzotriphenylene, benzocchrysene, anthracene or the like, can be given, for example. Of these, benzene, naphthalene, biphenyl, terphenyl, fluorene and phenanthrene are preferable.

As the substituted or unsubstituted aromatic heterocyclic group having 3 to 24 ring atoms shown by $Ar^6$ to $Ar^8$, Y, $Y^1$ to $Y^3$, $R^1$ to $R^3$, $L^1$ to $L^3$ and $A^1$ to $A^2$, residues with a corresponding valency such as pyridine, pyridazine, pyrimidine, pyrazine, 1,3,5-triazine, carbazole, dibenzofuran, dibenzothiophene, phenoxazine, phenothiazine and dihydroacrydine can be given, for example. Pyridine, pyridazine, pyrimidine, pyrazine, carbazole, dibenzofuran, dibenzothiophene, phenoxadine, and dihydroacridine are preferable. As the at least one substituted or unsubstituted monovalent fused aromatic heterocyclic group having 8 to 24 ring atoms shown by $R^1$, those with a fused structure can be selected from the examples of the aromatic heterocyclic group.

As the alkyl group having 1 to 20 carbon atoms, the alkylene group, the trivalent or tetravalent alkane shown by Y, $Y^1$ to $Y^3$, $L^1$ to $L^3$ and $R^1$ to $R^3$, methyl, ethyl, propyl, isopropyl, n-butyl, s-butyl, t-butyl, isobutyl, n-pentyl, n-hexyl, n-heptyl, n-octyl, n-nonyl, n-decyl, n-undecyl, n-dodecyl, n-tridecyl, n-teteradecyl, n-pentadecyl, n-hexadecyl, n-heptadecyl, n-octadecyl, neopentyl, 1-methylpentyl, 1-methylpentyl, 2-methylpentyl, 1-pentylhexyl, 1-butylpentyl, 1-heptyloctyl, 3-methylpentyl or the like or a di- to tetravalent groups of them can be given. Methyl, ethyl, propyl, isopropyl, n-butyl, s-butyl, isobutyl, t-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, neopentyl, 1-methylpentyl, 1-pentylhexyl, 1-butylpentyl and 1-heptyloctyl are preferable.

As the substituted or unsubstituted cycloalkyl group having 3 to 20 ring carbon atoms, the cycloalkylene group, the trivalent or tetravalent cycloalkane shown by Y, $Y^1$ to $Y^3$, $L^1$ to $L^3$, $R^1$ to $R^3$ and $A^1$ to $A^2$, cyclopropyl, cyclobutyl, cyclopentyl, cyclohexyl or di- to tetravalent groups of these can be given, for example. Cyclobutyl, cyclopentyl and cyclohexyl are preferable.

As the alkoxy group having 1 to 20 carbon atoms shown by Y, $Y^1$ to $Y^3$, methoxy, ethoxy, methoxy, i-propoxy, n-propoxy, n-butoxy, s-butoxy, t-butoxy or the like can be given. Methoxy, ethoxy, methoxy, i-propoxy and n-propoxy are preferable.

As the silyl group having 1 to 20 carbon atoms shown by Y, $Y^1$ to $Y^3$, $L^1$ to $L^3$, $R^1$ to $R^3$ and $A^1$ to $A^2$, trimethylsilyl, triethylsilyl, tributylsilyl, trioctylsilyl, triisobutylsilyl, dimethylethylsilyl, dimethylisopropylsilyl, dimethylpropylsilyl, dimethylbutylsilyl, dimethyl-tert-butylsilyl, diethylisopropylsilyl, phenyldimethylsilyl, diphenylmethylsilyl, diphenyl-tert-butyl, triphenylsilyl or di- to trivalent groups of these. Trimethyl, triethylsilyl and tributylsilyl are preferable.

As the aralkyl group having 7 to 24 carbon atoms shown by Y, $Y^1$ to $Y^3$, and $R^1$ to $R^3$, benzyl, phenethyl, phenylpropyl or the like can be given.

As the substituent for each of the above-mentioned groups in the formulas (5) to (22), an alkyl group having 1 to 10 carbon atoms (methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl or the like), a cycloalkyl group having 3 to 40 ring carbon atoms (cyclopropyl, cyclobutyl, cylcopentyl, cyclohexyl, 4-methylcyclohexyl, 1-adamantyl, 2-adamantyl, 1-norbornyl, 2-norbornyl, or the like), an alkoxy group having 1 to 6 carbon atoms (ethoxy, methoxy, i-propoxy, n-propoxy, s-butoxy, t-butoxy, pentoxy, hexyloxy, or the like), a cyclolalkoxy group having 3 to 10 ring carbon atoms (cyclopentoxy, cyclohexyloxy or the like), an aromatic hydrocarbon group having 6 to 40 ring carbon atoms, an aromatic heterocyclic group having 3 to 40 ring atoms, an amino group substituted with an aromatic hydrocarbon group having 6 to 40 ring carbon atoms, an ester group with an aromatic hydrocarbon group having 6 to 40 ring carbon atoms, an ester group with an alkyl group having 1 to 6 carbon atoms, a cyano group, a nitro group, a halogen atom, or the like can be given.

Of these, an alkyl group having 1 to 6 carbon atoms, a phenyl group, a pyridyl group, a carbazolyl group and a dibenzofuranyl group are preferable. The number of the substituent is preferably 1 to 2.

In the materials shown by the formulas (6), (9), (14) to (16), (18), (20) or (22), it is preferred that n be 2.

In the formula (9), (10) to (13), (17), (19) or (21), it is preferred that the total number of the substituent shown by $Y^1$, $Y^2$ and $Y^3$ be 3 or less. In the formula (10), (14) to (16), (18), (20) or (22), the total number of substituent shown by $Y^1$, $Y^2$ and $Y^3$ in each structure $[\ ]_n$ be 3 or less.

In the formula (5) or (6), it is preferred that $X^1$ and $X^2$ or $X^3$ and $X^4$ are respectively shown by N—$R^1$ and that N—$R^1$ of $X^1$ and N—$R^1$ of $X^2$ differ from each other, or N—$R^1$ of $X^3$ and N—$R^1$ of $X^4$ differ from each other.

In the formula (9) or (10), it is preferred that $X^5$ and $X^6$ are respectively shown by N—$R^1$, and that N—$R^1$ of $X^5$ and N—$R^1$ of $X^6$ differ from each other.

In the formulas (11) to (16), it is preferred that $X^7$ and $X^8$, $X^9$ and $X^{10}$, or $X^{11}$ and $X^{12}$ are respectively shown by N—$R^1$, and that N—$R^1$ of $X^7$ and N—$R^1$ of $X^8$ differ from each other, N—$R^1$ of $X^9$ and N—$R^1$ of $X^{10}$ differ from each other, or N—$R^1$ of $X^{11}$ and N—$R^1$ of $X^{12}$ differ from each other.

In the formula (17) or (18), it is preferred that $X^{13}$ and $X^{14}$ are respectively shown by N—$R^1$, and that N—$R^1$ of $X^{13}$ and N—$R^1$ of $X^{14}$ differ from each other.

In the formulas (5), (6), (9) to (18), it is preferred that $X^1$ and $X^2$, $X^3$ and $X^4$, $X^5$ and $X^6$, $X^7$ and $X^8$, $X^9$ and $X^{10}$, $X^{11}$ and $X^{12}$, $X^{13}$ and $X^{14}$ and $X^{15}$ and $X^{16}$ are respectively an oxygen atom.

As the heterocycle-containing compound, a carbazole derivative is preferable. A carbazole derivative means a compound which contains one or more carbazole group.

As the organic metal complex, a phosphorescent dopant material used in an organic EL device is preferable. There are no specific restrictions on the organic metal complex insofar as the organic metal complex gives phosphorescence emission when used in an organic EL device and has a high decomposition temperature which is higher than the melting point of the organic material by 30° C. or more.

In respect of luminous efficiency or the like, it is preferred that the organic metal complex be one which has a metal element selected from Ir, Pt, Os, Cu, Ru and Re as the central metal.

In addition, in respect of luminous efficiency or the like, it is preferred that the organic metal complex be one which is composed of a ligand selected from phenylquinoline, phenylisoquinoline, phenylpyridine, phenylpyrimidine, phenylpyrazine and phenylimidazole.

Specific examples of these dopant materials include the following, in addition to PQIr(iridium(III)bis(2-phenylquinolyl-N,C²')acetylacetonate), Ir(ppy)₃(fac-tris(2-phenylpyridine)iridium).

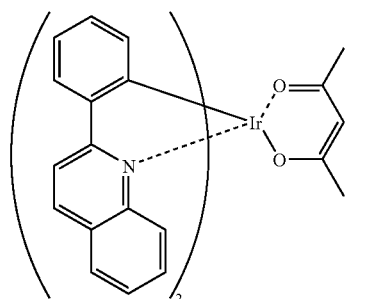

PQIr

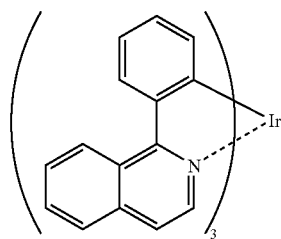

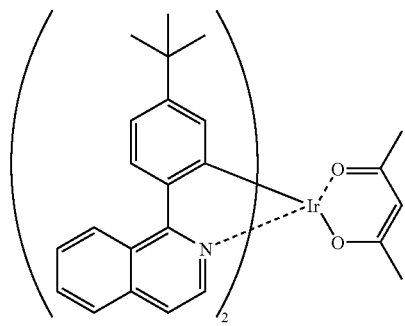

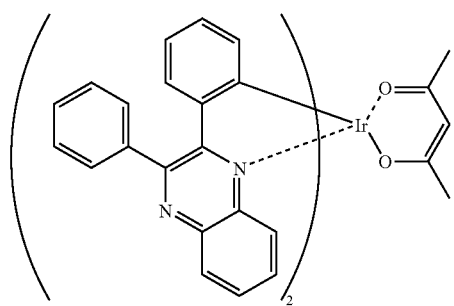

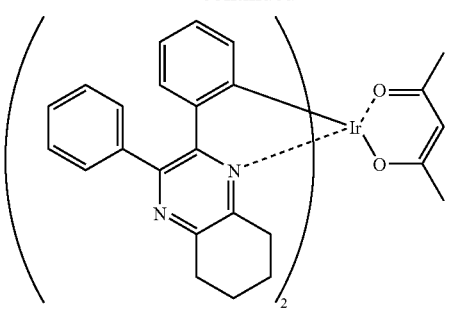

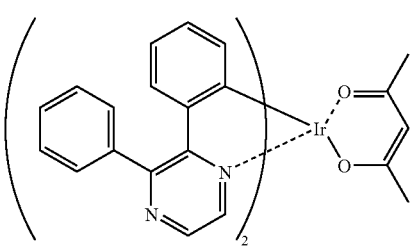

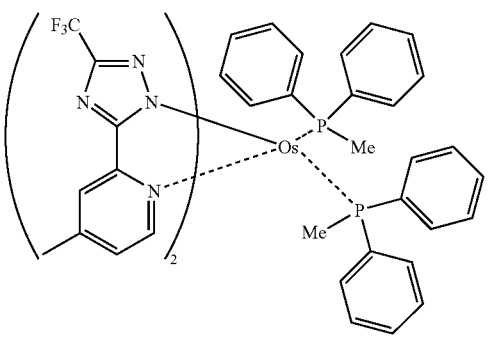

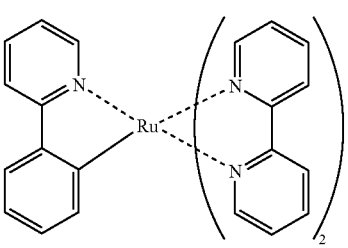

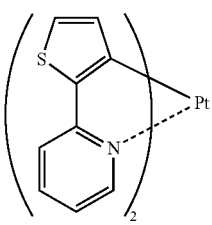

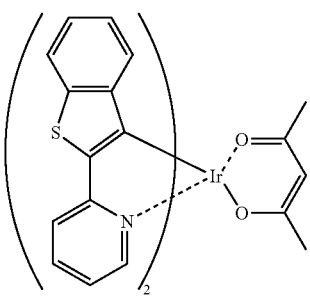

113
-continued
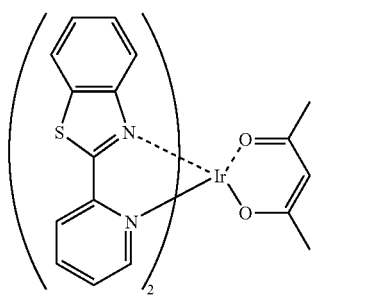
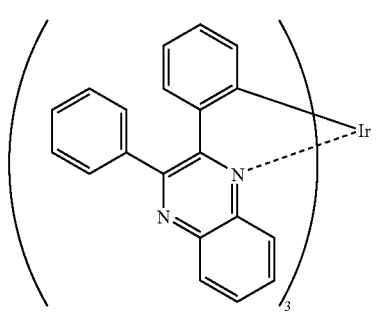
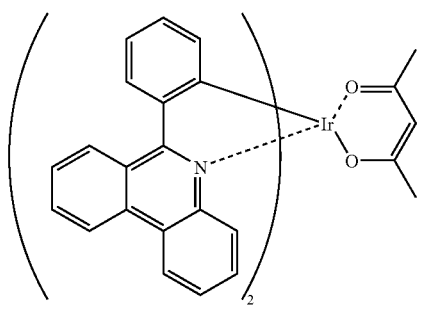
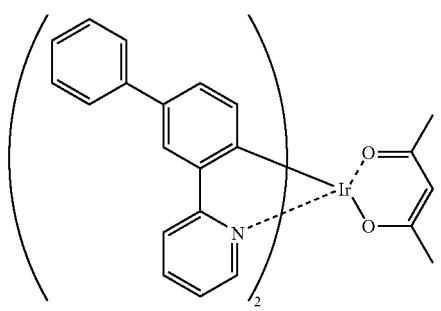
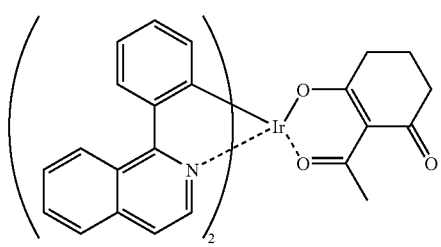
114
-continued
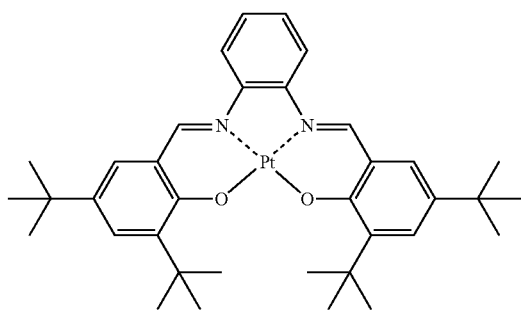
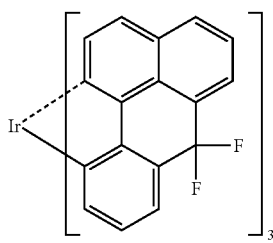
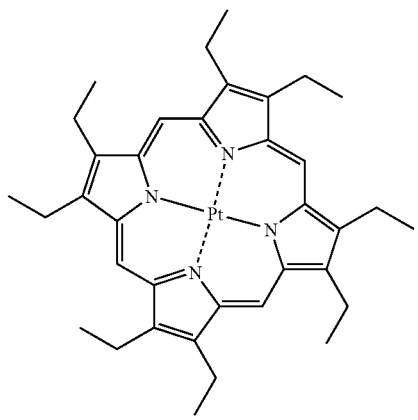
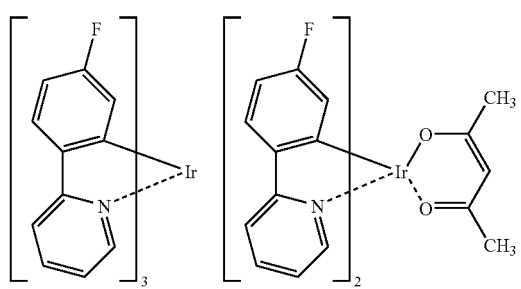
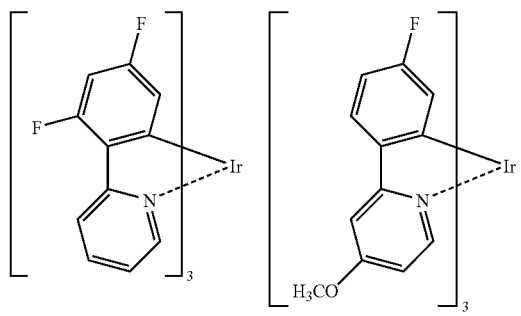

115
-continued
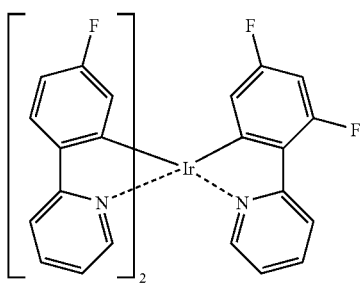
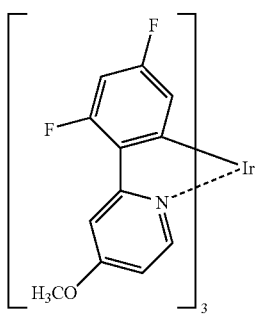
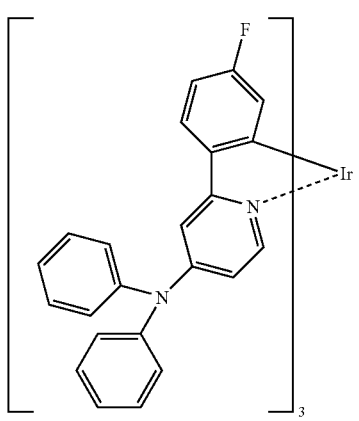
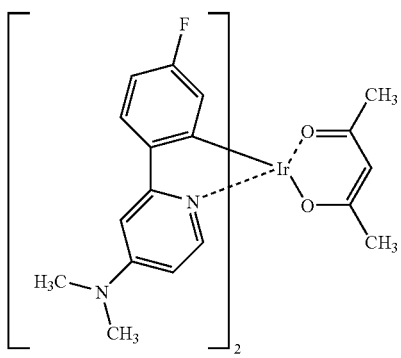
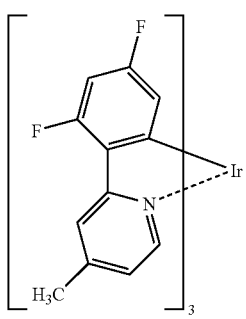
116
-continued
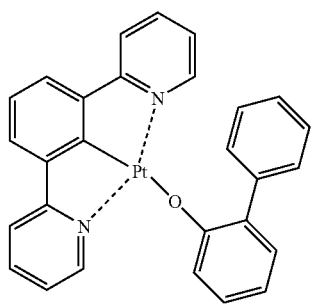
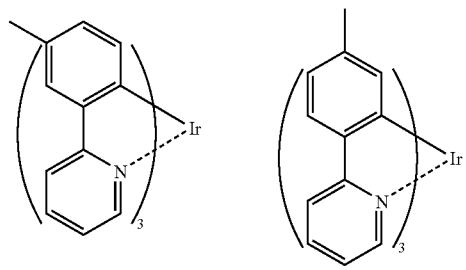
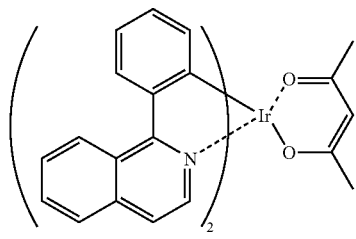
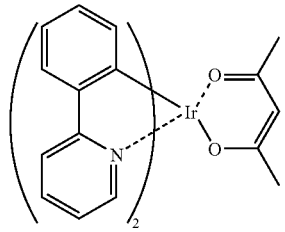
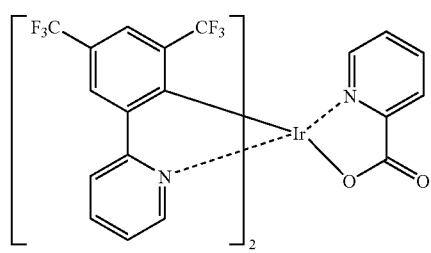
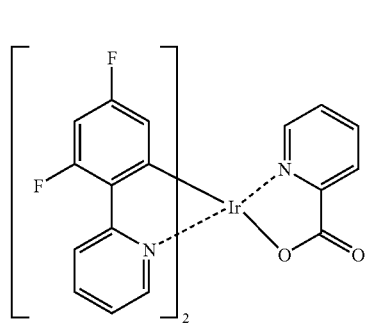

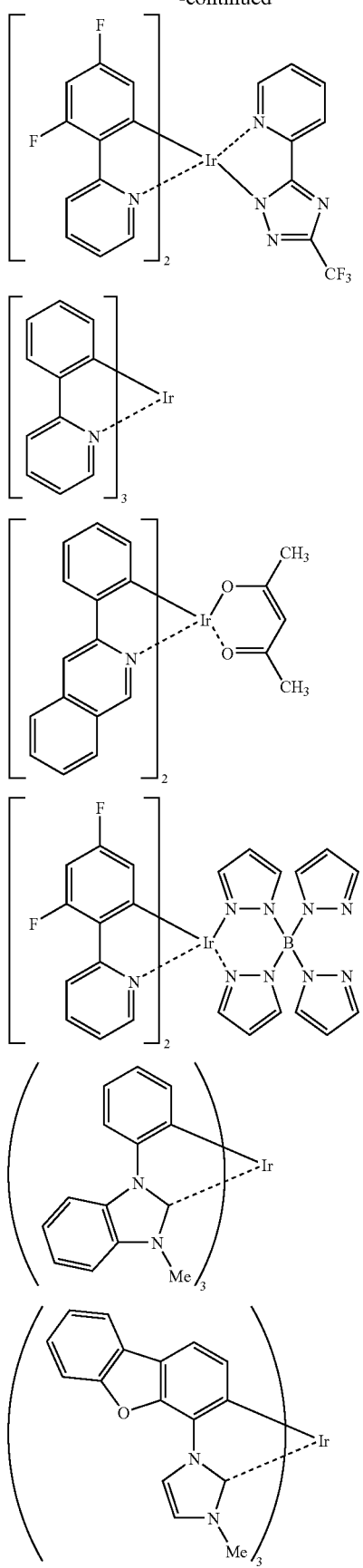
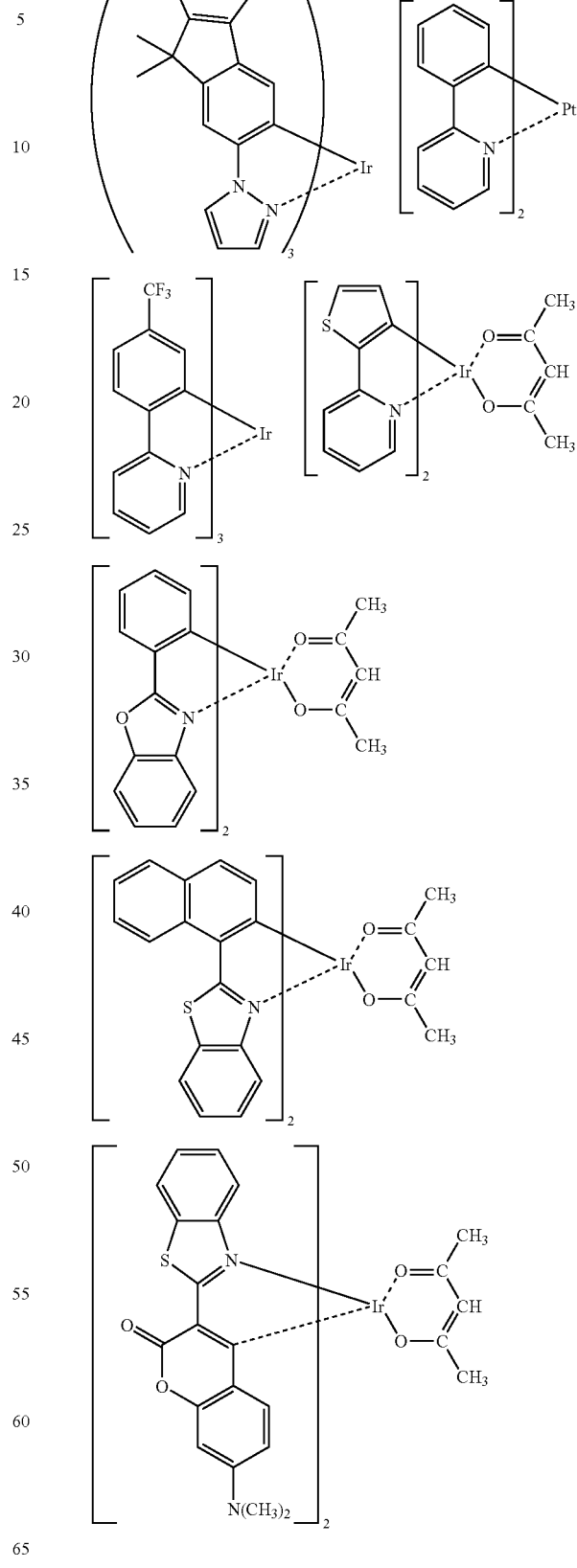

-continued

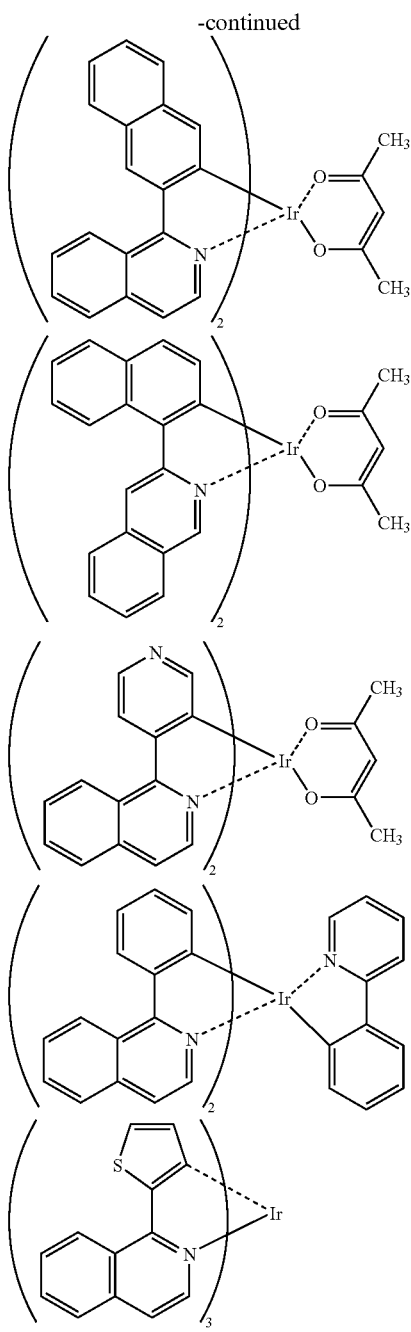

In order to be suitable for deposition, the organic metal complex preferably has a molecular weight of 200 to 2000, more preferably 200 to 1500, and further preferably 500 to 1000.

When the organic material is a host material and the organic metal complex is a dopant material, it is preferred that the amount ratio of the host material and the dopant material be 99.5:0.5 to 70:30 in mass ratio. In this amount range, the effects of mixing a dopant, for example, improved luminous efficiency, can be obtained, leading to less possibility of concentration quenching. It is more preferred that the amount ratio be 95:5 to 85:15. It is possible to use a plurality of dopants.

The average particle size of the composite organic EL material of the invention is preferably 20 to 80 μm.

The above-mentioned composite material has a high degree of flowability, and seldom suffers from clogging in a screw part when used in a flash deposition apparatus.

In the invention, the average particle size is measured by laser diffraction (Mie scattering theory). A laser diffraction-type particle size distribution measuring apparatus (Microtrack MT-3300EXII) can be used. A sufficient amount of a composite material is weighed as a sample and the particle size distribution thereof is obtained. The particle size measured by the Mie scattering theory is the length from one end to the other of a cross section of a particle which is obtained by cutting at various positions of the particle. The number of particles is added up, starting from the particles with a small particle diameter to the particles with a large particle diameter, and the particle size of particles of which the added-up number accounts for 50% is taken as the average particle diameter.

As shown in FIG. 1A to FIG. 1C, when the first material is coated with the second material, the first material is in the form of a particle and can take various forms. For example, it is a particle in the form of appropriate global, appropriate elliptical, appropriate polyhydral, or the like.

In the case of a composite material in which a plurality of materials is combined, connection between the materials is strong as compared with a mixed material obtained by only mixing a plurality of materials. Therefore, when using a composite material in flash deposition, the composite material hardly undergoes separation until sublimation. Accordingly, a composite material suffers from only a slight degree of variation in composition ratio of the plurality of materials in layers.

(2) Method for Producing a Composite Organic EL Material

The composite material of the invention can be produced by using the above-mentioned organic material and the organic metal complex and by combining them.

Specifically, it can be produced by the following processes (1) to (3):

(1) mixing an organic material and powdery organic metal complex to prepare a mixed material;
(2) heating the above-obtained mixed material (1) at a temperature which is lower by 30° C. or more than the temperature at which the weight of the organic metal complex is decreased by 1% (1% weight decrease temperature) when the organic metal complex is heated from room temperature at a rate of 10° C. per minute; and
(3) Cooling after the Heating.

In the process (1) as mentioned above, the organic material and the organic metal complex as the raw material can be selected such that the melting point of the organic material becomes lower by 30° C. or more than the 1% weight decrease temperature of the organic metal complex.

The raw material powder can be obtained by pulverizing each material, for example. Pulverization may be conducted with a plurality of materials being mixed. It is preferred that pulverization be performed with the materials being separated.

As the pulverization method, a method which has been conventionally known can be used. For example, materials are pulverized by means of a mortar. In order to pulverize more finely, it is preferable to use a pulverizing apparatus. It is possible to obtain materials varying in particle size by setting various pulverizing conditions.

If the raw material is sufficiently fine, the pulverization process may be omitted.

If the host material is coated with a dopant material, it is preferred that the average particle size of the host material be 20 to 80 μm and the average particle size of the dopant material to 3 to 30 µm. In order to obtain a uniformly mixed material, it is preferred that a dopant material have a smaller average size.

According to need, before the above-mentioned heating process (combining process) (2), a classification process in which fine powder is removed from the powder obtained by the pulverization process is added. If fine powder is contained in the complex organic EL material, a screw part of a flash deposition apparatus may be clogged. Therefore, when combining/coating the host material with the dopant material, it is preferred that the host material be classified, after pulverization, to remove fine powder. Specifically, it is preferred that the amount of particles with a particle size of 10 µm or less in the host material be 10 vol % or less.

Conventional classification methods can be used. Form example, a Multiplex (apparatus name) can be used for classification.

In the above-mentioned process (2), the organic material and the organic metal complex are heated to a temperature which is equal to or lower than a specific temperature, and are allowed to be combined. It is not necessary that all of the raw materials be a composite material. Powder of an organic material and an organic metal complex which is not in a composite state may be contained.

There are no particular restrictions on the method for heating and combining an organic material and an organic metal complex. In particular, melt mixing or the mechanofusion method can be used.

When the mechanofusion method is used, generally, an organic material is coated with an organic metal complex, as shown in FIGS. 1A to 1C. In the case of melt mixing, an organic material and an organic metal complex are mixed as shown in FIGS. 1D to 1F.

A method for producing a composite organic EL material by the mechanofusion method will be described below in detail.

When melt mixing is conducted, for example, a mixed material comprising an organic material and an organic metal complex is put in a flask, the air in the flask is replaced by nitrogen, and the host material is heated at a prescribed temperature by means of a mantle heater or the like, and stirred. In order to prevent the decomposition of an organic metal complex, the temperature is set such that it is lower by 30° C. or more than the 1% weight decrease temperature of an organic metal complex.

It is preferable to conduct stirring for 3 to 4 hours with heating.

After the process (2), a composite material can be obtained by cooling in the process (3). For example, by allowing the resulting material in the melted state to stand at room temperature for a prescribed period of time, a composited material can be obtained as a candy-like solid. This candy-like solid is a solid in which an organic material and an organic metal complex are combined and mixed.

By pulverizing this solid, it is possible to obtain powder having a prescribed particle size distribution. Pulverization can be conducted either manually by means of a mortor or mechanically by means of a pulverizing apparatus.

When the melting point of an organic material is lower than the melting point of an organic metal complex, and heating is performed at a temperature between the melting point of an organic material and the melting point of an organic metal complex, a composite material as shown in FIG. 1D can be obtained.

If the melting point of an organic material and the melting point of an organic metal complex are close, for example, a composite material as shown in FIG. 1F can be obtained, in which an organic material is hard to be distinguished from an organic metal complex.

When heating is performed at a temperature at around the melting point of an organic material while partially keeping the crystalline state, a composite material shown in FIG. 1E can be obtained. For suitability to melt mixing, it is preferred that an organic material and an organic metal complex have a melting point of 100 to 500° C. Further preferably, an organic material and an organic metal complex have a melting point of 200 to 300° C.

Generally, the phosphorescent dopant material does not have a melting point, and hence, does not melt. Therefore, a dopant material is dispersed in a melted host material, and the dopant material coagulates in this dispersed state, whereby a state is obtained where the host material and the dopant material are mixed while combining with each other.

Therefore, it is preferred that a dopant material with a small particle size be used, since a uniformed mixed state can be obtained after melting. In addition, it is preferred that the particle size of a dopant material used during the production be smaller than the average particle size of the assembled body of the organic EL materials of the invention.

A composite material can be produced by a method in which either one or both materials are dissolved in a solvent, followed by mixing. For example, a mixed material is put in a flask, and a solvent is added dropwise, and the resultant is stirred. Thereafter, a poor solvent is added dropwise to obtain a composited material. A solvent which solves one of the materials may be used, or a solvent which solves both solvents may be used.

Optionally, after cooling, it is preferred that the thus obtained composite material be classified to make the amount of the particles with a particle size of 10 µm or less in the composited material be 10 vol % or less.

(3) Flash Deposition

The composite material of the invention is suited for used in a flash deposition apparatus since a plurality of materials are uniformly dispersed, and are hardly separated from each other due to the strong connection thereof. The composite material of the invention can be used not only in flash deposition but also in various deposition methods.

The flash deposition method is a method in which materials are supplied to a heated deposition source, followed by quick evaporation, whereby a deposited thin film of an organic compound (organic thin film) is obtained on the substrate surface.

Figure 2A:
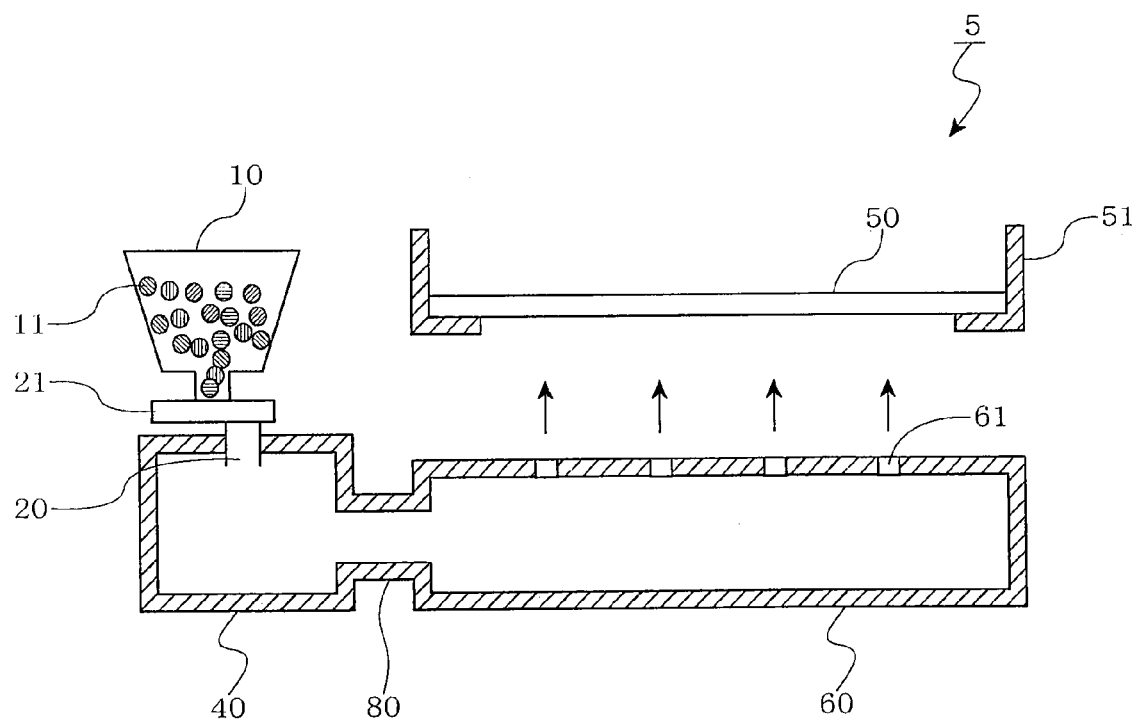
FIG. 2A is a view showing a flash deposition apparatus.

FIG. 2A shows one example of the flash deposition apparatus. In the flash deposition apparatus 5, a small amount of a material 11 kept in a material-accommodating container 10 is dropped to a heat evaporation part 40 from a material supply part 20 through a screw part 21. The heat evaporation part 40 is heated, and allows the material 11 which has been dropped to evaporate all at once. The evaporated material passes through a heating conduit 80 which connects the heat evaporation part 40 and a heated vapor dispensing part 60 and is supplied to the heated vapor dispensing part 60. The material in the form of vapor is emitted from a heated vapor outputting part 61 to a substrate 50 installed on a platform 51. The thus emitted vapor is deposited on the substrate 50 and the material is formed into a film on the substrate 50.

As the heat evaporation part 40 which is used for flash deposition, a conical basket boat made of tungsten wires, molybdenum wires, tantalum wires, rhenium wires and nickel wires, a crucible made of quartzs, alumina and graphite, or a boat made of tungsten, tantalum or molybdenum can be used. Flash deposition is performed by a method in which materials are dropped to a deposition source which normally has been heated to 300 to 600° C., preferably 400 to 600° C., and the composite material is evaporated all at once, whereby a deposited thin film which has almost the same composition of the composite material before being deposited to the surface of the substrate can be prepared. Although the deposition conditions of the flash deposition vary depending on the components of the composite material, they are generally as follows.

Deposition source heating temperature: 300 to 600° C.; vacuum degree: $10^{-5}$ to $10^{-2}$ Pa, deposition speed: 5 to 50 nm/sec, substrate temperature: −200 to +300° C., film thickness: 0.005 to 5 μm.

Figure 2B:
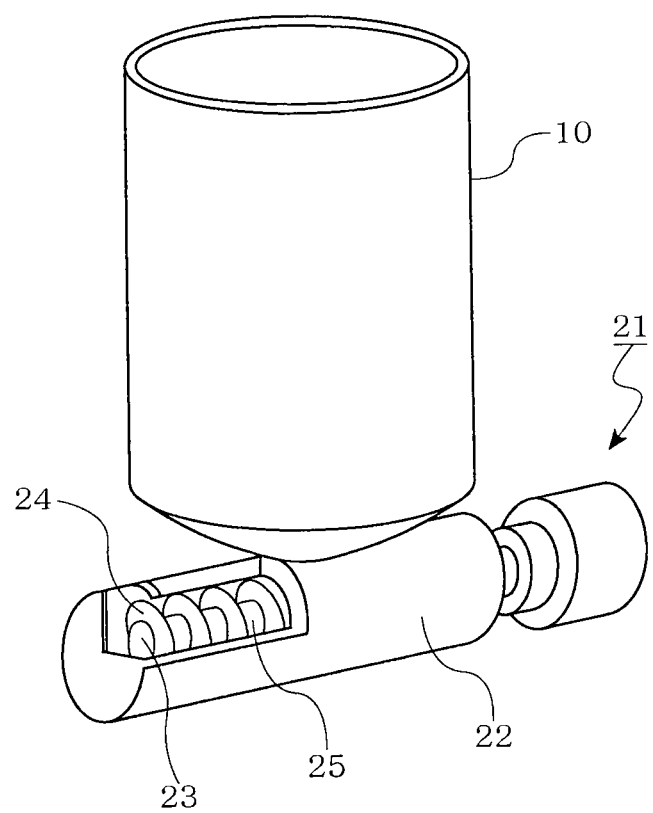
FIG. 2B is a view showing a material-accommodating container and a screw part of the flash deposition apparatus shown in FIG. 2A.

FIG. 2B shows the material-accommodating container 10 and the screw part 21. The screw part 21 consists of a screw-holding part 22 and a screw 23 within the screw-holding part 22. By turning the screw 23, a slight amount of the material 11 in the material-accommodating container 10 is kept in the screw 23. Due to the revolution of the screw, a slight amount of the material kept by the screw is dropped by emission from an output port (not shown). The screw consists of a blade 24 and a groove part 25, and the material passes the groove part 25 and a gap between the blade 24 and the screw-holding part and moves to the output port. When the apparatus is started up, the screw turns, and the material 11 which is held in the material-accommodating container 10 starts dropping with an approximately constant amount per unit time (for example, 4 to 8 mg/min).

The organic material is normally deposited into a film on a glass substrate at a rate of around 1 Å/s to 10 Å/s. When deposition is performed on a 40 cm×40 cm glass substrate at a deposition speed of d=10 ÅA/s, a material with a volume of $V=1.6\times10^{-11}$ m³ per second is supplied from a deposition source, a similar amount of the material is intermittently supplied from the material supply part 20.

In the flash deposition apparatus of the Patent Document 3, an aperture part is formed in the material supply part. Therefore, the relationship between the size of the aperture part and the size of the particles is required to be considered in respect of powder engineering. In addition, not only the aperture part, but also the relationship with the aperture part of the screw part through which the material is allowed to pass is required to be taken into consideration.

In order to supply particles with a constant volume V per second, the particles having a particle size which allows the volume thereof to exceed V cannot be present. If such particles are present, the deposition speed instantaneously exceeds d when a single particle is supplied, which causes the film thickness to vary with time. Therefore, the particle size has a certain upper limit which varies depending on the deposition speed. For example, when d=10 Å/s, the particle size is required to be about $5.4\times10^{-4}$ m (540 μm) or less.

In view of the theory of normal distribution of statistics, if the particle size distribution of an organic EL material has a normal distribution, the amount of particles of which the particle size is a value equal to or larger than a value obtained by adding a value which is between the average particle size and a value three times as large as the standard deviation ($\sigma$) of the particle size distribution accounts for 0.26% of the entire particles. If the maximum possible particle size as mentioned above is taken as L (=540 μm), L is a value obtained by adding a value which is at least three times larger than the standard deviation value ($\sigma$). Therefore, the average particle size of an organic EL material is desirably L-3$\sigma$ or less.

If the composite material is composed of a host material and a dopant material, normally, the content of the dopant in the emitting layer is about 0.1 mol % to 30 mol %. If the molecular weights and the specific gravities of the host material and the dopant material are not so different, it is preferred that the volume ratio of the dopant material to the host material is about 0.001 to 0.3. Therefore, the particle size of the dopant material is required to be as small as about 0.001 to 0.3 of the particle size of the host material. When the host material and the dopant material are supplied from different supplying apparatuses, the amount of the dopant material is required to be controlled to 0.001 to 0.3 of the amount of the host material. For that purpose, in the deposition apparatus, the aperture of the part through which the materials pass or the opening of the material supply part is allowed to be small, and, in addition, the particle size of the dopant material is allowed to be smaller than the particle size of the host material. If the particle size is small, the contact surface area of the particles and the apparatus increases, thus increasing the frictional force. For this reason, the flowability inside the screw decreases, causing clogging in the inside of the screw part and the opening part, whereby the controllability of the amount is deteriorated.

When both materials are supplied by a single material supply apparatus, since a small volume is deposited, the ratio of the host particles and the dopant particles which pass the screw varies. The composition ratio of the host material and the dopant material to be supplied to the deposition source always varies, and as a result, the composition ratio varies widely in such a level that will affect the emission properties of an organic EL device which is formed. In addition, since an external force is exerted on the materials by the screw due to difference in particle size, dopant particles having a small particle size tend to accumulate in the screw part, and host particles having a large particle size tend to be pushed out by the screw. Therefore, if a host material and a dopant material which differ in particle size are put in a container with a desired amount ratio, it is difficult to control so as to keep the composition ratio of the mixed materials to be supplied from a material supply apparatus to a deposition source.

However, in the case of the composite material of the invention, since an organic material and an organic metal complex are strongly combined with each other and move together, it is possible to keep the composition ratio almost constant if the materials are supplied from a single material supply apparatus. In addition, it is not required to reduce the opening part of a material supply apparatus for an organic metal complex.

According to the "Particle Engineering (basic edition)" (Kimio Kawakita et. al. published by Maki Shoten), flowability of particles is affected by the particle size, the particle shape, the particle distribution, the surface condition or the like. In respect of the relationship between the aperture Db and the particle size Dp, the discharge amount is not constant even if Db/Dp>10, and the discharge becomes discontinuous (pages 126 to 128). In order to output a constant amount of materials from the screw part, the particle size is desirably larger than R/10 if the aperture of a tube in an apparatus through which materials can pass is taken as R.

If deposition is performed at a speed of 1000 Å per minute (1.6 nm per second), if one particle is output from the screw part per second, the particle has a diameter of 540 μm. If the particle size is smaller than 540 μm, the aperture (the diameter of a part through which the material of the screw can pass) is required to be about 540 μm since the volume of the outputted material does not change.

The aperture can be reduced if the revolution of the screw is increased to increase the moving speed of the material. If an attempt is made to supply the materials stably, the aperture is required to be 100 to 1000 μm.

Generally, the aperture in the screw part is 100 to 1000 μm, the particle size is desirably 10 μm or more. However, particles with a particle size of 10 μm or less may be present, and the amount thereof is preferably small. Therefore, it is desired that the amount of particles with a particle size of 10 μm or less be 10 vol. % or less.

The discharge amount is not constant even when Db/Dp<5. Therefore, it is preferred that the particle size be 200 μm or less. However, particles with a particle size of 200 μm or more may be present, and the amount thereof is preferably small.

In the screw part 21 shown in FIG. 2B, a space formed by the groove part 25 and the inner wall of the screw-holding part 22 is an aperture R.

If the apparatus has small openings as stated in the Patent Document 3, and the opening is smaller than the space formed by the groove part 25 and the inner wall of the screw-holding part 22, the aperture of the opening is taken as R since the influence exerted by the flowability of the particle depends on the opening.

Flowability can be measured by a dynamic measurement method. For example, by means of Powder Rheometer FT4, which is a powder flowability analysis apparatus manufactured by Sysmex Corporation, specific energy, internal friction angle, adhesive strength or the like can be measured. Higher values mean poor flowability. Here, the specific energy is an energy value which is required to allow powder to flow. The internal friction angle is the shear strength of powder which varies in proportion to load. Adhesive strength is an index showing easiness in hardening when powder is compressed.

Poor flowability means that materials may be clogged or the output amount from the screw part is not constant and tends to vary.

(4) Organic EL Device

Figure 3:
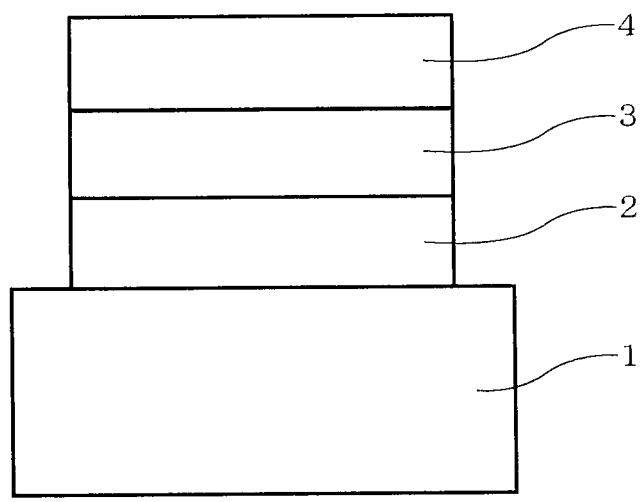
FIG. 3 is a view showing an organic EL device.

FIG. 3 diagrammatically shows an organic EL device. In the figure, 1 denotes a substrate, which is normally made of a sheet or film of glass or plastics. 2 denotes an anode, 3 denotes organic thin film layers including an emitting layer, and 4 denotes a cathode. An organic EL device comprises an anode 2, organic thin film layers 3 and a cathode 4. In the organic thin film layers 3, a hole-injecting layer or a hole-transporting layer may be provided between the anode 2 and the emitting layer. An electron-injecting layer or an electron-transporting layer may be provided between the cathode 4 and the emitting layer. In addition, if need arises, a carrier-blocking layer (hole-blocking layer, electron-blocking layer) or the like may be provided.

First, an explanation is made on a substrate (1 in FIG. 3).

The substrate is a member which serves as a support of an organic EL device. As the material for the substrate, a plate of an insulating material such as quartz or glass, a sheet or film of plastics, metal thin films or the like can be used. There are no specific restrictions on the kind thereof. The substrate may be either transparent or opaque. If light is outcoupled through the substrate, it is preferred that the substrate be transparent. As examples of the transparent substrate, glass, quartz, transparent plastic films or the like can be given.

The surface of glass or quartz is preferably a polished surface of photomask grade. Further, it is preferred that the quartz or glass have a high volume resistance ($10^7$ Ωm or more at 350° C.) with a smaller alkali content.

The thickness of the substrate is about 0.01 to 10 mm, preferably about 0.1 to 5 mm. According to application, a flexible substrate may be used.

Specific examples of the material for a plastic sheet or film include polyolefins such as polyethylene and polypropylene, polyesters such as polyethylene terephthalate and polyethylene naphthalate, cellulose esters such as cellulose diacetate, cellulose triacetate, cellulose acetate butylate, cellulose acetate propionate, cellulose acetate phthalate and cellulose nitrate, and derivatives thereof, polymethyl methacrylate, polyether ketone, polyether sulfone, polyphenylene sulfide, polyether imide, polyether ketone imide, fluorine resins, nyron, polystyrene, polyarylate, polycarbonate, polyurethane, acrylic resins, polyacrylnitrile, polyvinyl acetal, polyamide, polyimide, diacrylphthalate resin, polyvinyl acetate, polyvinyl chloride, polyvinylidene chloride, a copolymer of two or three or more of these, and cycloolefin resins. As the particularly preferable material for a plastic sheet or film, a fluorine-based polymer compound with a small water vapor permeability such as polyvinyl fluoride, polychlorotrifluoroethylene and polytetrafluoroethylene. Plastic films may be either a single layer or a multilayer stack.

When a plastic sheet or film is used, it is necessary to note the gas barrier property thereof. A too small gas barrier property of the substrate is unfavorable since an organic EL device may be degraded by the air which has transmitted the substrate. To ensure gas barrier property, providing a dense silicon oxide film or the like on the substrate formed of a plastic sheet or film is one of preferable methods.

By using a plastic sheet or film as a substrate, an organic EL panel can be flexible, and disadvantages can be eliminated that an organic EL panel is heavy, likely to break and difficult to be larger in area.

Next, an explanation is made on an anode (2 in FIG. 3).

As the anode, a metal with a large work function, an alloy, an electrically conductive compound and a mixture thereof are preferably used as an electrode material. Specific examples of such electrode materials include as metals such as aluminum, gold, silver, nickel, palladium and platinum, metal oxides such as CuI, indium thin oxide (ITO), $SnO_2$ and ZnO, metal halides such as copper iodide, carbon black or conductive transparent materials comprising a conductive polymer such as poly(3-methylthiophene), polypyrrole and polyanilline.

It is preferable to use a material which is capable of forming an amorphous transparent conductive electrode film, such as $In_2O_3$—ZnO. An anode can be formed by a method in which a thin film is formed from these materials by deposition, sputtering or other methods, and a pattern with a desired form is formed by the photolithographic method. If a high degree of pattern accuracy is not needed (about 100 μm or more), a pattern may be formed through a mask with a desired shape when depositing or sputtering the above-mentioned electrode material. When a material which can be coated such as an organic conductive compound is used, a wet film forming method such as printing and coating can be used. The thickness of the anode largely varies depending on materials in order to control properties such as light transmittance and resistance, but is normally 500 nm or less, preferably 10 to 200 nm.

Next, an explanation is made on organic thin film layers (3 in FIG. 3).

The organic thin film layers are held between the anode and the cathode, and are formed of a combination of a hole-injecting layer/a hole-transporting layer/an emitting layer/a hole-blocking layer/an electron-transporting layer, for example.

The emitting layer which constitutes organic thin film layers can be formed by flash deposition using the composite material of the invention which comprises an organic material (host material) and an organic metal complex (dopant material). The organic thin film layers may contain a plurality of emitting layers. In this case, each emitting layer may be formed by flash deposition, or part of the emitting layers may be formed by flash deposition.

The thickness of the emitting layer is normally 0.5 to 500 nm, preferably 0.5 to 200 nm.

As the materials to be used in the hole-injecting layer, the hole-transporting layer and the carrier-blocking layer, materials used in an organic EL device may be normally used. Specific examples thereof include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalkone, an oxazole derivative, a styrylanthracene derivative, a fluorenone derivative, a hydrazone derivative, a stilbene derivative, a silazane derivative, a polysilane-based or aniline-based copolymer, and conductive high-molecular oligomers. As materials to be used in an electron-transporting layer, materials used in an organic EL device can be normally used. For example, a metal complex of 8-hydroxyquinoline or its derivative, an oxadiazole derivative and a nitrogen-containing heterocyclic derivative are preferable. As specific examples of the above-mentioned metal complex of 8-hydroxyquinoline or its derivative, a metal chelate oxinoid compound containing a chelate of oxine (generally, 8-quinolinol or 8-hydroxyquinoline), e.g., tris(8-quinolinol)aluminum, can be given. As for the thickness or the forming method of these layers, thicknesses or methods which are normally used in an organic EL device may be used.

Next, an explanation is made on a cathode (4 in FIG. 3).

As a cathode, a metal, an alloy, an electrically conductive compound and a mixture thereof having a small work function are preferably used as an electrode material. Specific examples of the electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, an aluminum/lithium fluoride mixture and rare earth metals. The cathode can be formed by forming these electrode materials into a thin film on an organic thin film layer by the vacuum vapor deposition method, the sputtering method or the like. The thickness of the cathode varies depending on the material, but is normally 1 µm or less, preferably 1 nm to 500 nm.

An organic EL device is a device in which an emitting layer emits light by passing electricity, and the thickness thereof is normally 1 µm or less. One or a plurality of an organic EL device may be held between an anode and a cathode. Light is outcoupled through the surface near the anode or through the surface near the cathode. The position of the anode 2 and the position of the cathode 4 in FIG. 3 may be replaced.

EXAMPLES

Example 1

The host material H1 as the organic material and the dopant material D1 as the organic metal complex shown below were used. H1 is fused polycyclic aromatic hydrocarbon having a molecular weight of 506. The melting point was 250° C. D1 does not have a melting point and the decomposition temperature (1% weight decrease temperature) was 321° C. The molecular weight is 700. In the combination of the host material and the dopant material in this example, the melting point of the host material is lower by 71° C. than the decomposition temperature of the dopant material.

The decomposition temperature is a value obtained by means of a TG/DTA (thermo-gravimetric/differential thermal analyzer) by measuring a change in weight with time when the temperature was elevating, and by reading a temperature at which the weight of a sample material at room temperature was decreased by 1%.

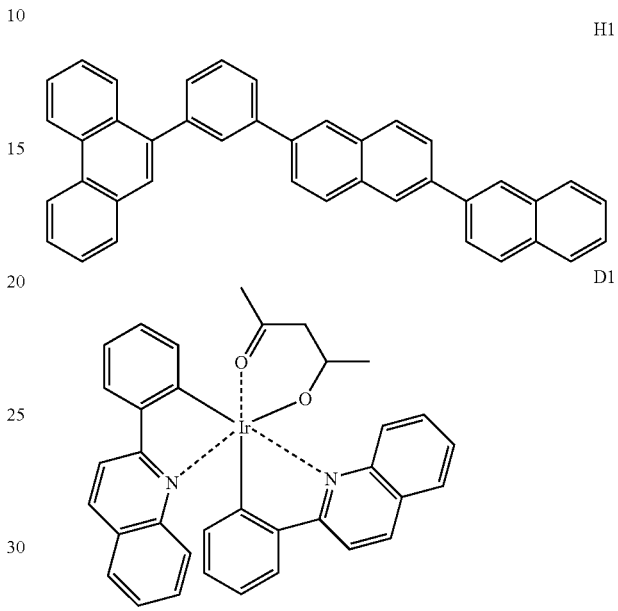

The host material H1 and the dopant material D1 were used at a weight ratio of 10:1. These materials were put in a flask, and the air in the flask was replaced with nitrogen. The temperature of a mantle heater was set to 325° C., and the flask was heated for 30 minutes to allow the materials to be melted and mixed. The temperature of the mixed materials in the flask was 245° C. The temperature of the mixed materials was measured by means of a temperature gauge which had been inserted in the flask. The temperature gauge was set such that it touched the surface at which the materials at the bottom of the flask and the flask were brought into contact with each other. The difference between the decomposition temperature of the dopant material and the temperature of the mixed material was 76° C. Then, the mixed materials were placed at room temperature, and then pulverized in a crucible, whereby a composite organic EL material was prepared. The average particle size thereof was 80 µm.

Figure 4:
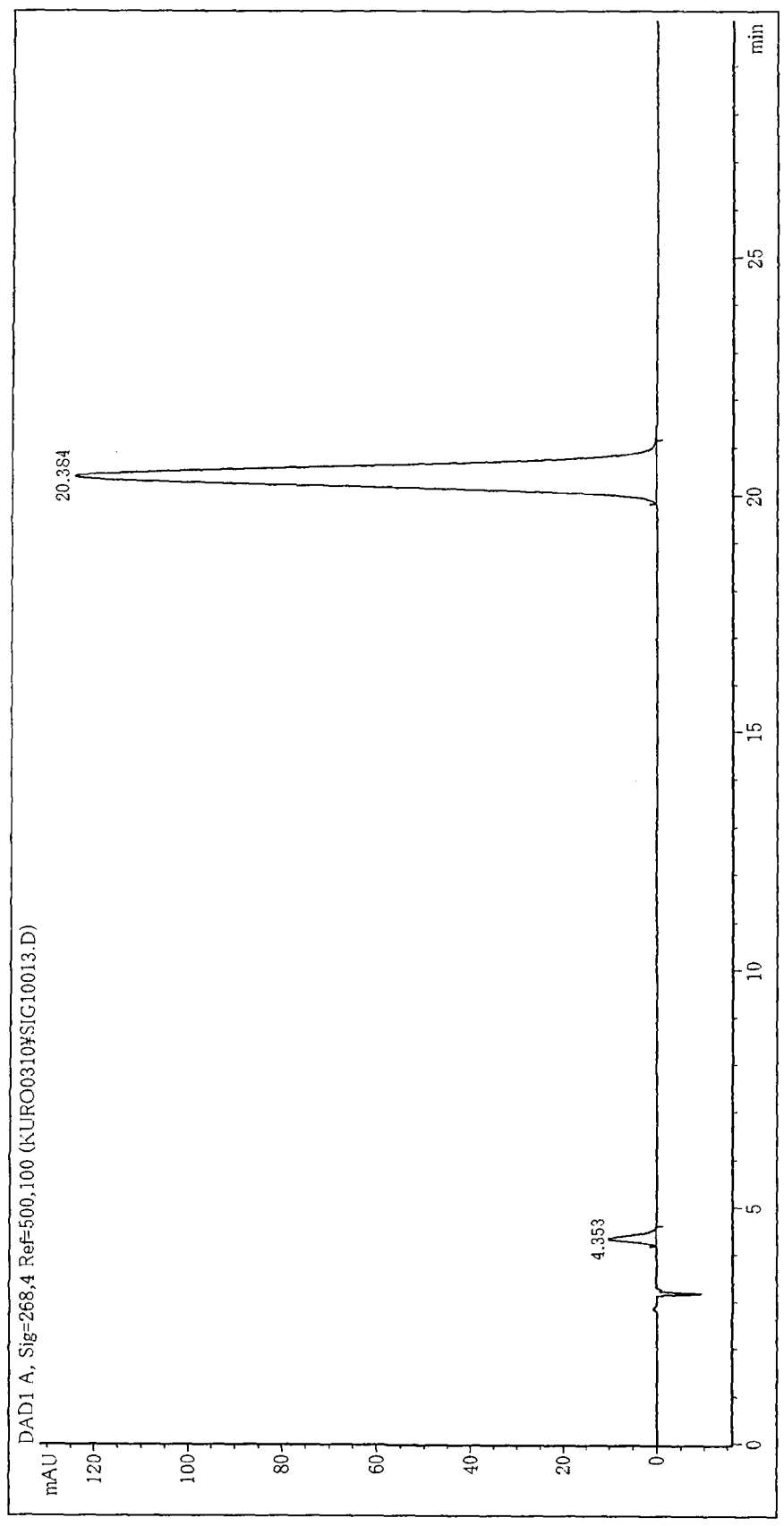
FIG. 4 is a HPLC chart of a composite material prepared in Example 1.

The composite organic EL material was measured by the high-speed liquid chromatography to confirm the presence of decomposed matters. The results are shown in FIG. 4.

The two peaks are at the same positions as in the high-speed liquid chromatography of H1 alone and the high-speed liquid chromatography of D1 alone.

When the peak position of H1 alone and the peak position of D1 alone were compared with the peak position of the composite material, it was confirmed that decomposed matters were not produced since no new peak was observed.

In addition, the composition ratio of H1 and D1 in the composite material was 100:8.4.

Comparative Example 1

The host material H2 as the organic material and the dopant material D2 as the organic metal complex shown below were used. H2 is a nitrogen-containing heterocyclic derivative having a molecular weight of 638. The melting point was 340° C. D2 does not have a melting point and a temperature at which the weight thereof was decreased by 1% when heated from temperature at a rate of 10° C. per minute was 366° C. The molecular weight is 655. In the combination of the host material and the dopant material in this example, the melting point of the host material is lower by 26° C. than the decomposition temperature of the dopant material.

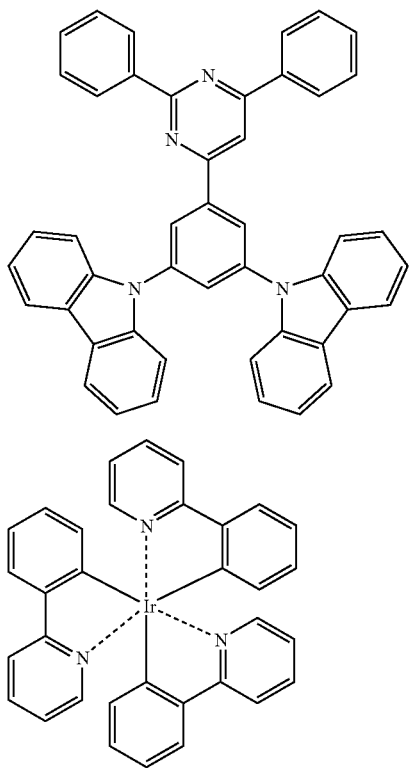

The host material H2 and the dopant material D2 were used at a weight ratio of 10:1. These materials were put in a flask, and the air in the flask was replaced with nitrogen. The temperature of a mantle heater was set to 448° C., and the flask was heated for 30 minutes to allow the materials to be melted and mixed. The temperature of the mixed materials in the flask was 338° C. The temperature of the mixed materials was measured in the same manner as in Example 1. The difference between the decomposition temperature of the dopant material and the temperature of the mixed material was 28° C. After visually confirming that the entire mixed materials in the flask were melted, the mixed materials were cooled to room temperature, and then pulverized in a crucible, whereby a composite organic EL material was prepared. The average particle size thereof was 79 μm.

Figure 5:
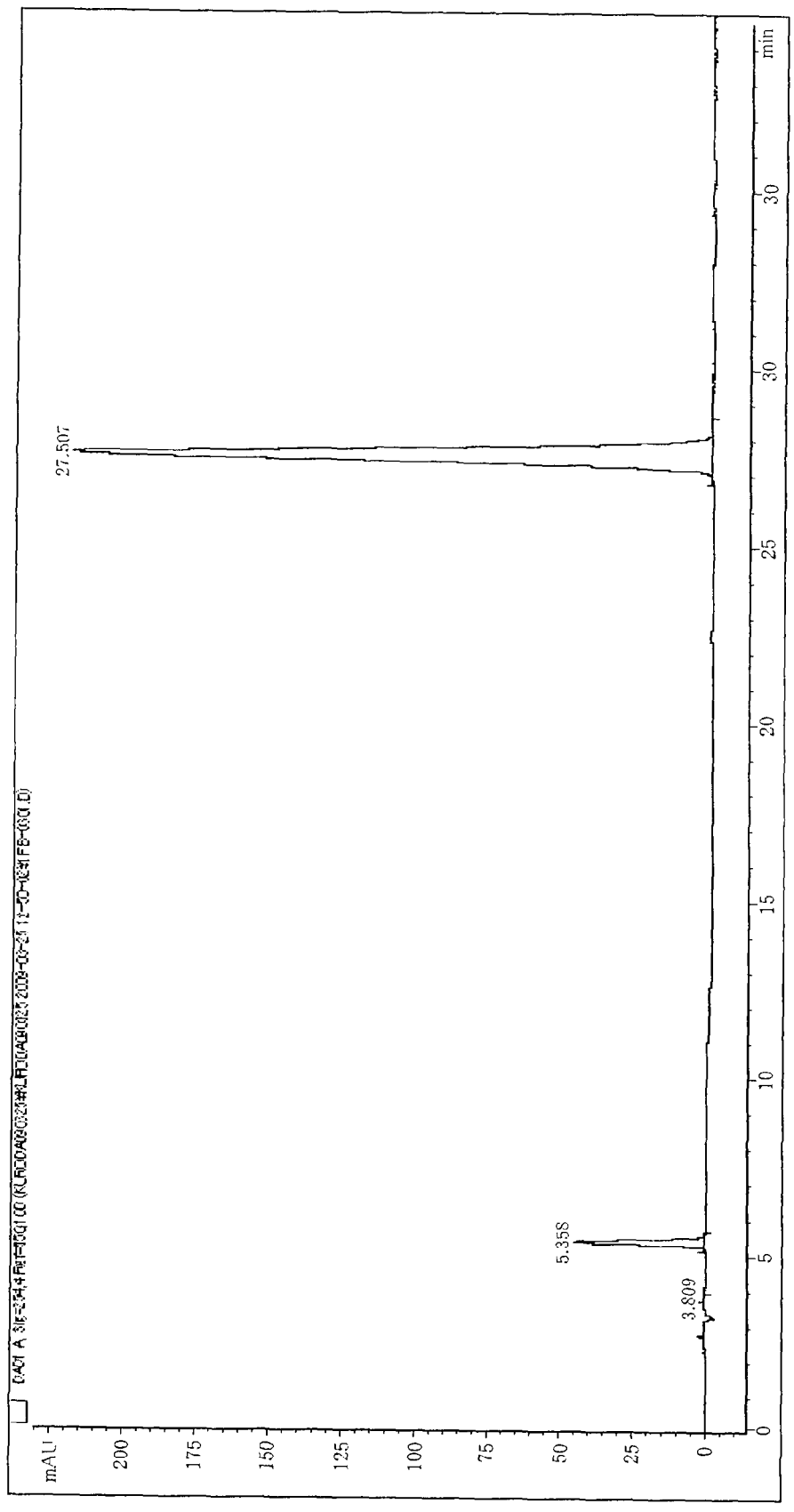
FIG. 5 is a HPLC chart of a composite material prepared in Comparative Example 1.

The composite organic EL material was measured by the high-speed liquid chromatography to confirm the presence of decomposed matters. The results are shown in FIG. 5.

The two peaks are at the same positions as those in the high-speed liquid chromatography of H2 alone and the high-speed liquid chromatography of D2 alone.

When the peak position of H2 alone and the peak position of D2 alone were compared with the peak position of the composite material, a new peak was observed in the measurement results of the composite material. The molecular weight of a substance corresponding to this peak was measured. The molecular weight was 155. This molecular weight corresponded to the following ligand of D2. The substance was identified as a decomposed matter.

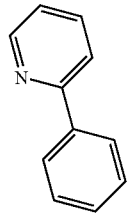

INDUSTRIAL APPLICABILITY

The composite organic EL material of the invention can be used for the production of an organic EL device, in particular, for the production of an emitting layer of an organic EL device.

The documents described in the specification are incorporated herein by reference in its entirety.

EXPLANATION ON NUMERALS

1. Substrate
2. Anode
3. Organic thin film layer
4. Cathode
5. Flash deposition apparatus
10. Material-accommodating container
11. Material (composite organic EL material)
20. Material-supply part
21. Screw part
22. Screw-holding part
23. Screw
24. Blade
25. Groove part
40. Heat evaporation part
50. Substrate
60. Heated vapor dispensing part
100. First material (organic material)
101. Second material (organic metal complex)

The invention claimed is:

1. A composite organic electroluminescence material comprising a particle or an assembly of particles obtained by combining a organic material and an organic metal complex, wherein the melting point of the organic material is lower by 30° C. or more than the decomposition temperature of the organic metal complex.

2. The composite organic electroluminescence material according to claim 1, wherein the decomposition temperature is a temperature at which the weight of the organic metal complex is decreased by 1% when the organic metal complex is heated from room temperature at a heating rate of 10° C. per minute.

3. The composite organic electroluminescence material according to claim 1, wherein the molecular weight of the organic material is 2000 or less.

4. The composite organic electroluminescence material according to claim 1, wherein the organic material is not an organic metal complex.

5. The composite organic electroluminescence material according to claim 1, wherein the organic material is at least one fused polycyclic aromatic compound of which the triplet energy value is in the range of 2.0 eV to 3.3 eV, and the organic metal complex is an organic metal complex having a metal element selected from the group consisting of Ir, Pt, Os, Cu, Ru and Re, as a central metal.

6. The composite organic electroluminescence material according to claim 5, wherein the at least one fused polycyclic aromatic compound is a fused polycyclic aromatic hydrocarbon compound.

7. The composite organic electroluminescence material according to claim 5, wherein the at least one fused polycyclic aromatic compound is a heterocycle-containing compound.

8. The composite organic electroluminescence material according to claim 1, wherein the organic material is a host material which is contained in an emitting layer of an organic electroluminescence device, and the organic metal complex is a phosphorescent dopant material contained in an emitting layer of an organic electroluminescence device.

9. The composite organic electroluminescence material according to claim 1, which has an average particle size of 20 μm to 80 μm.

\* \* \* \* \*